(12) United States Patent
Sheng et al.

(10) Patent No.: US 11,009,411 B2
(45) Date of Patent: May 18, 2021

(54) INCREASING SENSITIVITY OF A SENSOR USING AN ENCODED SIGNAL

(71) Applicant: Sentons Inc., Grand Cayman (KY)

(72) Inventors: Samuel W. Sheng, Saratoga, CA (US); Shih-Ming Shih, San Jose, CA (US); Yenyu Hsieh, San Jose, CA (US); Shirish A. Altekar, Palo Alto, CA (US)

(73) Assignee: Sentons Inc.

( * ) Notice: Subject to any disclaimer, the term of this patent is extended or adjusted under 35 U.S.C. 154(b) by 143 days.

(21) Appl. No.: 16/101,241

(22) Filed: Aug. 10, 2018

(65) Prior Publication Data

US 2019/0074833 A1    Mar. 7, 2019

Related U.S. Application Data

(60) Provisional application No. 62/545,391, filed on Aug. 14, 2017.

(51) Int. Cl.
*G01L 1/18* (2006.01)
*G06F 3/045* (2006.01)
(Continued)

(52) U.S. Cl.
CPC ................ *G01L 1/18* (2013.01); *G06F 3/045* (2013.01); *G06F 3/0436* (2013.01);
(Continued)

(58) Field of Classification Search
CPC ..... G01L 1/18; G01L 9/08; G01L 9/06; G01L 5/0019; G01L 9/065; H01L 41/319;
(Continued)

(56) References Cited

U.S. PATENT DOCUMENTS 3,912,880 A    10/1975  Powter
4,488,000 A    12/1984  Glenn
(Continued)

FOREIGN PATENT DOCUMENTS

CN    1914585    2/2007
CN    101133385    2/2008
(Continued)

OTHER PUBLICATIONS

Liu et al., 'Acoustic Wave Approach for Multi-Touch Tactile Sensing', Micro-NanoMechatronics and Human Science, 2009. MHS 2009. International Symposium, Nov. 9-11, 2009.
(Continued)

*Primary Examiner* — Patrick N Edouard
*Assistant Examiner* — Douglas M Wilson
(74) *Attorney, Agent, or Firm* — Van Pelt, Yi & James LLP

(57) ABSTRACT

A physical disturbance sensor includes a plurality of piezoresistive elements configured in a resistive bridge configuration. A signal transmitter is electrically connected to the physical disturbance sensor and configured to send an encoded signal to the piezoresistive elements of the resistive bridge configuration. A signal receiver is electrically connected to the piezoresistive elements and configured to receive a signal from the physical disturbance sensor. The received signal from the physical disturbance sensor is correlated with the sent encoded signal in determining a measure of physical disturbance.

20 Claims, 38 Drawing Sheets

(51) Int. Cl.
*G06F 3/043* (2006.01)
*G06F 3/041* (2006.01)
*H03K 17/96* (2006.01)
*G01P 15/12* (2006.01)
*G01L 5/00* (2006.01)
*G01L 9/08* (2006.01)
*H01L 41/319* (2013.01)
*G01L 9/06* (2006.01)
*G01L 1/16* (2006.01)
*H01L 27/20* (2006.01)

(52) U.S. Cl.
CPC ...... *G06F 3/04144* (2019.05); *G06F 3/04164* (2019.05); *H01L 41/319* (2013.01); *H03K 17/964* (2013.01); *H03K 17/9643* (2013.01); *H03K 17/9645* (2013.01); *G01L 5/0019* (2013.01); *G01L 9/06* (2013.01); *G01L 9/065* (2013.01); *G01L 9/08* (2013.01); *G01P 15/123* (2013.01); *G06F 3/043* (2013.01); *G06F 2203/04102* (2013.01); *G06F 2203/04103* (2013.01); *G06F 2203/04105* (2013.01)

(58) Field of Classification Search
CPC .. H01L 27/20; H03K 17/9643; H03K 17/964; H03K 17/9645; G01P 15/123; G06F 2203/04103; G06F 2203/04105; G06F 2203/04102; G06F 3/04164; G06F 3/0436; G06F 3/04144; G06F 3/045; G06F 3/043
See application file for complete search history.

(56) References Cited

U.S. PATENT DOCUMENTS

| | | |
|---|---|---|
| 4,529,959 A | 7/1985 | Ito |
| 4,594,695 A | 6/1986 | Garconnat |
| 4,966,150 A | 10/1990 | Etienne |
| 5,008,497 A | 4/1991 | Asher |
| 5,074,152 A | 12/1991 | Ellner |
| 5,233,873 A | 8/1993 | Mozgowiec |
| 5,334,805 A | 8/1994 | Knowles |
| 5,451,723 A | 9/1995 | Huang |
| 5,563,849 A | 10/1996 | Hall |
| 5,573,077 A | 11/1996 | Knowles |
| 5,591,945 A | 1/1997 | Kent |
| 5,635,643 A | 6/1997 | Maji |
| 5,637,839 A | 6/1997 | Yamaguchi |
| 5,638,093 A | 6/1997 | Takahashi |
| 5,708,460 A | 1/1998 | Young |
| 5,739,479 A | 4/1998 | Davis-Cannon |
| 5,784,054 A | 7/1998 | Armstrong |
| 5,854,450 A | 12/1998 | Kent |
| 5,883,457 A | 3/1999 | Rinde |
| 5,912,659 A | 6/1999 | Rutledge |
| 6,091,406 A | 7/2000 | Kambara |
| 6,211,772 B1 | 4/2001 | Murakami |
| 6,232,960 B1 | 5/2001 | Goldman |
| 6,236,391 B1 | 5/2001 | Kent |
| 6,254,105 B1 | 7/2001 | Rinde |
| 6,262,946 B1 | 7/2001 | Khuri-Yakub |
| 6,307,942 B1 | 10/2001 | Azima |
| 6,473,075 B1 | 10/2002 | Gomes |
| 6,492,979 B1 | 12/2002 | Kent |
| 6,498,603 B1 | 12/2002 | Wallace |
| 6,507,772 B1 | 1/2003 | Gomes |
| 6,535,147 B1 | 3/2003 | Masters |
| 6,567,077 B2 | 5/2003 | Inoue |
| 6,630,929 B1 | 10/2003 | Adler |
| 6,633,280 B1 | 10/2003 | Matsumoto |
| 6,636,201 B1 | 10/2003 | Gomes |
| 6,788,296 B2 | 9/2004 | Ikeda |
| 6,798,403 B2 | 9/2004 | Kitada |
| 6,856,259 B1 | 2/2005 | Sharp |
| 6,891,527 B1 | 5/2005 | Chapman |
| 6,922,642 B2 | 7/2005 | Sullivan |
| 6,948,371 B2 | 9/2005 | Tanaka |
| 7,000,474 B2 | 2/2006 | Kent |
| 7,006,081 B2 | 2/2006 | Kent |
| 7,116,315 B2 | 10/2006 | Sharp |
| 7,119,800 B2 | 10/2006 | Kent |
| 7,187,369 B1 | 3/2007 | Kanbara |
| 7,193,617 B1 | 3/2007 | Kanbara |
| 7,204,148 B2 | 4/2007 | Tanaka |
| 7,218,248 B2 | 5/2007 | Kong |
| 7,274,358 B2 | 9/2007 | Kent |
| RE39,881 E | 10/2007 | Flowers |
| 7,315,336 B2 | 1/2008 | North |
| 7,345,677 B2 | 3/2008 | Ing |
| 7,411,581 B2 | 8/2008 | Hardie-Bick |
| 7,456,825 B2 | 11/2008 | Kent |
| 7,511,711 B2 | 3/2009 | Ing |
| 7,545,365 B2 | 6/2009 | Kent |
| 7,554,246 B2 | 6/2009 | Maruyama |
| 7,583,255 B2 | 9/2009 | Ing |
| 7,649,807 B2 | 1/2010 | Ing |
| 7,683,894 B2 | 3/2010 | Kent |
| 7,880,721 B2 | 2/2011 | Suzuki |
| 7,920,133 B2 | 4/2011 | Tsumura |
| 8,059,107 B2 | 11/2011 | Hill |
| 8,085,124 B2 | 12/2011 | Ing |
| 8,194,051 B2 | 6/2012 | Wu |
| 8,228,121 B2 | 7/2012 | Benhamouda |
| 8,237,676 B2 | 8/2012 | Duheille |
| 8,319,752 B2 | 11/2012 | Hardie-Bick |
| 8,325,159 B2 | 12/2012 | Kent |
| 8,358,277 B2 | 1/2013 | Mosby |
| 8,378,974 B2 | 2/2013 | Aroyan |
| 8,392,486 B2 | 3/2013 | Ing |
| 8,418,083 B1 | 4/2013 | Lundy |
| 8,427,423 B2 | 4/2013 | Tsumura |
| 8,436,806 B2 | 5/2013 | Almalki |
| 8,436,808 B2 | 5/2013 | Chapman |
| 8,493,332 B2 | 7/2013 | D'Souza |
| 8,519,982 B2 | 8/2013 | Camp, Jr. |
| 8,576,202 B2 | 11/2013 | Tanaka |
| 8,619,063 B2 | 12/2013 | Chaine |
| 8,638,318 B2 | 1/2014 | Gao |
| 8,648,815 B2 | 2/2014 | Kent |
| 8,659,579 B2 | 2/2014 | Nadjar |
| 8,670,290 B2 | 3/2014 | Aklil |
| 8,681,128 B2 | 3/2014 | Scharff |
| 8,692,809 B2 | 4/2014 | D'Souza |
| 8,692,810 B2 | 4/2014 | Ing |
| 8,692,812 B2 | 4/2014 | Hecht |
| 8,730,213 B2 | 5/2014 | D'Souza |
| 8,749,517 B2 | 6/2014 | Aklil |
| 8,787,599 B2 | 7/2014 | Grattan |
| 8,791,899 B1 | 7/2014 | Usey |
| 8,823,685 B2 | 9/2014 | Scharff |
| 8,854,339 B2 | 10/2014 | Kent |
| 8,890,852 B2 | 11/2014 | Aroyan |
| 8,896,429 B2 | 11/2014 | Chaine |
| 8,896,564 B2 | 11/2014 | Scharff |
| 8,917,249 B1 | 12/2014 | Buuck |
| 8,941,624 B2 | 1/2015 | Kent |
| 8,946,973 B2 | 2/2015 | Pelletier |
| 8,994,696 B2 | 3/2015 | Berget |
| 9,030,436 B2 | 5/2015 | Ikeda |
| 9,041,662 B2 | 5/2015 | Harris |
| 9,046,959 B2 | 6/2015 | Schevin |
| 9,046,966 B2 | 6/2015 | D'Souza |
| 9,058,071 B2 | 6/2015 | Esteve |
| 9,099,971 B2 | 8/2015 | Lynn |
| 9,189,109 B2 | 11/2015 | Sheng |
| 9,250,742 B1 | 2/2016 | Usey |
| 9,348,468 B2 | 5/2016 | Altekar |
| 9,477,350 B2 | 10/2016 | Sheng |
| 9,594,450 B2 | 3/2017 | Lynn |
| 9,851,848 B2 | 12/2017 | Pellikka |
| 9,983,718 B2 | 5/2018 | Sheng |
| 10,209,825 B2 | 2/2019 | Sheng |

(56) References Cited

U.S. PATENT DOCUMENTS

| | | |
|---|---|---|
| 10,466,836 B2 | 11/2019 | Sheng |
| 10,795,417 B2 | 10/2020 | Bok |
| 2001/0050677 A1 | 12/2001 | Tosaya |
| 2002/0036621 A1 | 3/2002 | Liu |
| 2002/0047833 A1 | 4/2002 | Kitada |
| 2002/0185981 A1 | 12/2002 | Dietz |
| 2003/0161484 A1 | 8/2003 | Kanamori |
| 2003/0164820 A1 | 9/2003 | Kent |
| 2003/0189745 A1 | 10/2003 | Kikuchi |
| 2003/0197691 A1 | 10/2003 | Fujiwara |
| 2003/0206162 A1 | 11/2003 | Roberts |
| 2004/0133366 A1 | 7/2004 | Sullivan |
| 2004/0160421 A1 | 8/2004 | Sullivan |
| 2004/0183788 A1 | 9/2004 | Kurashima |
| 2004/0203594 A1 | 10/2004 | Kotzin |
| 2004/0239649 A1 | 12/2004 | Ludtke |
| 2004/0246239 A1 | 12/2004 | Knowles |
| 2005/0063553 A1 | 3/2005 | Ozawa |
| 2005/0146511 A1 | 7/2005 | Hill |
| 2005/0146512 A1 | 7/2005 | Hill |
| 2005/0174338 A1 | 8/2005 | Ing |
| 2005/0226455 A1 | 10/2005 | Aubauer |
| 2005/0229713 A1 | 10/2005 | Niblock |
| 2005/0248540 A1 | 11/2005 | Newton |
| 2005/0248547 A1 | 11/2005 | Kent |
| 2006/0071912 A1 | 4/2006 | Hill |
| 2006/0109261 A1 | 5/2006 | Chou |
| 2006/0114233 A1 | 6/2006 | Radivojevic |
| 2006/0132315 A1 | 6/2006 | Kurtz |
| 2006/0139339 A1 | 6/2006 | Pechman |
| 2006/0139340 A1 | 6/2006 | Geaghan |
| 2006/0152499 A1 | 7/2006 | Roberts |
| 2006/0166681 A1 | 7/2006 | Lohbihler |
| 2006/0197753 A1 | 9/2006 | Hotelling |
| 2006/0262088 A1 | 11/2006 | Baldo |
| 2006/0262104 A1 | 11/2006 | Sullivan |
| 2006/0279548 A1 | 12/2006 | Geaghan |
| 2006/0284841 A1 | 12/2006 | Hong |
| 2007/0019825 A1 | 1/2007 | Marumoto |
| 2007/0109274 A1 | 5/2007 | Reynolds |
| 2007/0165009 A1 | 7/2007 | Sakurai |
| 2007/0171212 A1 | 7/2007 | Sakurai |
| 2007/0183520 A1 | 8/2007 | Kim |
| 2007/0211022 A1 | 9/2007 | Boillot |
| 2007/0214462 A1 | 9/2007 | Boillot |
| 2007/0229479 A1 | 10/2007 | Choo |
| 2007/0236450 A1 | 10/2007 | Colgate |
| 2007/0240913 A1 | 10/2007 | Schermerhorn |
| 2007/0278896 A1 | 12/2007 | Sarkar |
| 2007/0279398 A1 | 12/2007 | Tsumura |
| 2008/0018618 A1 | 1/2008 | Hill |
| 2008/0030479 A1 | 2/2008 | Lowles |
| 2008/0062151 A1 | 3/2008 | Kent |
| 2008/0081671 A1 | 4/2008 | Wang |
| 2008/0105470 A1 | 5/2008 | Van De Ven |
| 2008/0111788 A1 | 5/2008 | Rosenberg |
| 2008/0169132 A1 | 7/2008 | Ding |
| 2008/0174565 A1 | 7/2008 | Chang |
| 2008/0198145 A1 | 8/2008 | Knowles |
| 2008/0231612 A1* | 9/2008 | Hill ............... G06F 3/0436 345/177 |
| 2008/0259030 A1 | 10/2008 | Holtzman |
| 2008/0266266 A1 | 10/2008 | Kent |
| 2008/0284755 A1 | 11/2008 | Hardie-Bick |
| 2009/0009488 A1 | 1/2009 | D'Souza |
| 2009/0103853 A1 | 4/2009 | Daniel |
| 2009/0116661 A1 | 5/2009 | Hetherington |
| 2009/0146533 A1 | 6/2009 | Leskinen |
| 2009/0160728 A1 | 6/2009 | Emrick |
| 2009/0167704 A1 | 7/2009 | Terlizzi |
| 2009/0237372 A1 | 9/2009 | Kim |
| 2009/0271004 A1 | 10/2009 | Zecchin |
| 2009/0273583 A1 | 11/2009 | Norhammar |
| 2009/0309853 A1 | 12/2009 | Hildebrandt |
| 2009/0315848 A1 | 12/2009 | Ku |
| 2010/0026667 A1 | 2/2010 | Bernstein |
| 2010/0027810 A1 | 2/2010 | Marton |
| 2010/0044121 A1 | 2/2010 | Simon |
| 2010/0045635 A1 | 2/2010 | Soo |
| 2010/0079264 A1 | 4/2010 | Hoellwarth |
| 2010/0117933 A1 | 5/2010 | Gothard |
| 2010/0117993 A1 | 5/2010 | Kent |
| 2010/0123686 A1 | 5/2010 | Klinghult |
| 2010/0141408 A1 | 6/2010 | Doy |
| 2010/0156818 A1 | 6/2010 | Burrough |
| 2010/0165215 A1 | 7/2010 | Shim |
| 2010/0185989 A1 | 7/2010 | Shiplacoff |
| 2010/0188356 A1 | 7/2010 | Vu |
| 2010/0245265 A1 | 9/2010 | Sato |
| 2010/0269040 A1 | 10/2010 | Lee |
| 2010/0277431 A1 | 11/2010 | Klinghult |
| 2010/0283759 A1 | 11/2010 | Iso |
| 2010/0309139 A1 | 12/2010 | Ng |
| 2010/0311337 A1 | 12/2010 | Riviere |
| 2010/0315373 A1 | 12/2010 | Steinhauser |
| 2010/0321312 A1 | 12/2010 | Han |
| 2010/0321325 A1 | 12/2010 | Springer |
| 2010/0321337 A1 | 12/2010 | Liao |
| 2011/0001707 A1 | 1/2011 | Faubert |
| 2011/0001708 A1 | 1/2011 | Sleeman |
| 2011/0012717 A1 | 1/2011 | Pance |
| 2011/0013785 A1 | 1/2011 | Kim |
| 2011/0018695 A1 | 1/2011 | Bells |
| 2011/0025649 A1 | 2/2011 | Sheikhzadeh Nadjar |
| 2011/0042152 A1 | 2/2011 | Wu |
| 2011/0057903 A1 | 3/2011 | Yamano |
| 2011/0063228 A1 | 3/2011 | St Pierre |
| 2011/0080350 A1 | 4/2011 | Almalki |
| 2011/0084912 A1 | 4/2011 | Almalki |
| 2011/0084937 A1 | 4/2011 | Chang |
| 2011/0141052 A1* | 6/2011 | Bernstein ............ G06F 3/03547 345/174 |
| 2011/0155479 A1 | 6/2011 | Oda |
| 2011/0156967 A1 | 6/2011 | Oh |
| 2011/0167391 A1 | 7/2011 | Momeyer |
| 2011/0175813 A1 | 7/2011 | Sarwar |
| 2011/0182443 A1 | 7/2011 | Gant |
| 2011/0191680 A1 | 8/2011 | Chae |
| 2011/0199342 A1 | 8/2011 | Vartanian |
| 2011/0213223 A1 | 9/2011 | Kruglick |
| 2011/0222372 A1 | 9/2011 | O'Donovan |
| 2011/0225549 A1 | 9/2011 | Kim |
| 2011/0234545 A1 | 9/2011 | Tanaka |
| 2011/0248978 A1 | 10/2011 | Koyama |
| 2011/0260988 A1 | 10/2011 | Colgate |
| 2011/0260990 A1 | 10/2011 | Ali |
| 2011/0279382 A1 | 11/2011 | Pertuit |
| 2011/0298670 A1 | 12/2011 | Jung |
| 2011/0300845 A1 | 12/2011 | Lee |
| 2011/0304577 A1 | 12/2011 | Brown |
| 2011/0316784 A1 | 12/2011 | Bisutti |
| 2011/0316790 A1 | 12/2011 | Ollila |
| 2012/0001875 A1 | 1/2012 | Li |
| 2012/0002820 A1 | 1/2012 | Leichter |
| 2012/0007837 A1 | 1/2012 | Kent |
| 2012/0026114 A1 | 2/2012 | Lee |
| 2012/0030628 A1 | 2/2012 | Lee |
| 2012/0032928 A1 | 2/2012 | Alberth |
| 2012/0050230 A1 | 3/2012 | Harris |
| 2012/0062564 A1 | 3/2012 | Miyashita |
| 2012/0068939 A1 | 3/2012 | Pemberton-Pigott |
| 2012/0068970 A1 | 3/2012 | Pemberton-Pigott |
| 2012/0081337 A1 | 4/2012 | Camp, Jr. |
| 2012/0088548 A1 | 4/2012 | Yun |
| 2012/0092964 A1 | 4/2012 | Badiey |
| 2012/0104901 A1 | 5/2012 | Jiang |
| 2012/0120031 A1 | 5/2012 | Thuillier |
| 2012/0126962 A1 | 5/2012 | Ujii |
| 2012/0127088 A1 | 5/2012 | Pance |
| 2012/0140954 A1 | 6/2012 | Ranta |
| 2012/0144293 A1 | 6/2012 | Kim |
| 2012/0149437 A1 | 6/2012 | Zurek |
| 2012/0188194 A1 | 7/2012 | Sulem |
| 2012/0188889 A1 | 7/2012 | Sambhwani |

(56) References Cited

U.S. PATENT DOCUMENTS

| | | |
|---|---|---|
| 2012/0194466 A1 | 8/2012 | Posamentier |
| 2012/0200517 A1 | 8/2012 | Nikolovski |
| 2012/0206154 A1 | 8/2012 | Pant |
| 2012/0229407 A1 | 9/2012 | Harris |
| 2012/0232834 A1 | 9/2012 | Roche |
| 2012/0235866 A1 | 9/2012 | Kim |
| 2012/0242603 A1 | 9/2012 | Engelhardt |
| 2012/0270605 A1 | 10/2012 | Garrone |
| 2012/0272089 A1 | 10/2012 | Hatfield |
| 2012/0278490 A1 | 11/2012 | Sennett |
| 2012/0280944 A1 | 11/2012 | St Pierre |
| 2012/0282944 A1 | 11/2012 | Zhao |
| 2012/0300956 A1 | 11/2012 | Horii |
| 2012/0306823 A1 | 12/2012 | Pance |
| 2013/0011144 A1 | 1/2013 | Amiri Farahani |
| 2013/0050133 A1 | 2/2013 | Brakensiek |
| 2013/0050154 A1 | 2/2013 | Guy |
| 2013/0057491 A1 | 3/2013 | Chu |
| 2013/0059532 A1 | 3/2013 | Mahanfar |
| 2013/0082970 A1 | 4/2013 | Frey |
| 2013/0127755 A1 | 5/2013 | Lynn |
| 2013/0141364 A1 | 6/2013 | Lynn |
| 2013/0141365 A1* | 6/2013 | Lynn ............... G06F 3/041 345/173 |
| 2013/0147768 A1 | 6/2013 | Aroyan |
| 2013/0194208 A1 | 8/2013 | Miyanaka |
| 2013/0222274 A1 | 8/2013 | Mori |
| 2013/0234995 A1 | 9/2013 | Son |
| 2013/0249831 A1 | 9/2013 | Harris |
| 2014/0028576 A1 | 1/2014 | Shahparnia |
| 2014/0078070 A1 | 3/2014 | Armstrong-Muntner |
| 2014/0078086 A1 | 3/2014 | Bledsoe |
| 2014/0078109 A1 | 3/2014 | Armstrong-Muntner |
| 2014/0078112 A1* | 3/2014 | Sheng ............... G06F 3/043 345/177 |
| 2014/0185834 A1 | 7/2014 | Frömel |
| 2014/0247230 A1 | 9/2014 | Sheng |
| 2014/0247250 A1 | 9/2014 | Sheng |
| 2014/0317722 A1 | 10/2014 | Tartz |
| 2014/0362055 A1 | 12/2014 | Altekar |
| 2014/0368464 A1 | 12/2014 | Singnurkar |
| 2015/0002415 A1 | 1/2015 | Lee |
| 2015/0002452 A1* | 1/2015 | Klinghult ............... G06F 1/1643 345/174 |
| 2015/0009185 A1 | 1/2015 | Shi |
| 2015/0109239 A1 | 4/2015 | Mao |
| 2015/0199035 A1 | 7/2015 | Chang |
| 2015/0253895 A1 | 9/2015 | Kim |
| 2015/0346850 A1 | 12/2015 | Vandermeijden |
| 2015/0366504 A1 | 12/2015 | Connor |
| 2016/0048266 A1 | 2/2016 | Smith |
| 2016/0062517 A1 | 3/2016 | Meyer |
| 2016/0070404 A1 | 3/2016 | Kerr |
| 2016/0091308 A1 | 3/2016 | Oliaei |
| 2016/0139717 A1* | 5/2016 | Filiz ............... G01L 1/005 345/173 |
| 2016/0162044 A1 | 6/2016 | Ciou |
| 2016/0179249 A1 | 6/2016 | Ballan |
| 2016/0209944 A1 | 7/2016 | Shim |
| 2016/0282312 A1 | 9/2016 | Cable |
| 2016/0282965 A1 | 9/2016 | Jensen |
| 2016/0349913 A1 | 12/2016 | Lynn |
| 2016/0349922 A1 | 12/2016 | Choi |
| 2017/0010697 A1 | 1/2017 | Jiang |
| 2017/0020402 A1 | 1/2017 | Rogers |
| 2017/0024055 A1 | 1/2017 | Schwarz |
| 2017/0083164 A1 | 3/2017 | Sheng |
| 2018/0032211 A1 | 2/2018 | King |
| 2018/0067612 A1 | 3/2018 | Smith |
| 2018/0129333 A1 | 5/2018 | Zheng |
| 2018/0136770 A1 | 5/2018 | Kwong |
| 2018/0143669 A1 | 5/2018 | Bok |
| 2018/0348014 A1 | 12/2018 | Astley |
| 2019/0212846 A1* | 7/2019 | Nathan ............... G06F 3/04144 |
| 2019/0383676 A1* | 12/2019 | Foughi ............... B81C 1/00246 |

FOREIGN PATENT DOCUMENTS

| | | |
|---|---|---|
| CN | 101373415 B | 2/2009 |
| CN | 101568898 | 10/2009 |
| CN | 101669088 B | 3/2010 |
| CN | 101978344 | 2/2011 |
| CN | 103890701 | 6/2014 |
| CN | 104169848 | 11/2014 |
| CN | 103677339 | 7/2017 |
| EP | 2315101 A1 | 4/2011 |
| EP | 2315101 B1 | 1/2014 |
| FR | 2948787 B1 | 2/2011 |
| JP | H07160355 | 6/1995 |
| JP | 2005092527 A | 4/2005 |
| JP | 5723499 | 5/2015 |
| KR | 20040017272 | 2/2004 |
| KR | 20070005580 | 1/2007 |
| KR | 20080005990 | 1/2008 |
| KR | 20110001839 | 1/2011 |
| WO | 03005292 A1 | 1/2003 |
| WO | 2006131022 A1 | 12/2006 |
| WO | 2006115947 | 6/2007 |
| WO | 2006115947 A3 | 6/2007 |
| WO | 2009028680 A1 | 3/2009 |
| WO | 2011010037 | 1/2011 |
| WO | 2011010037 A1 | 1/2011 |
| WO | 2011024434 | 3/2011 |
| WO | 2011048433 A1 | 4/2011 |
| WO | 2011051722 | 5/2011 |
| WO | 2012010912 A2 | 1/2012 |
| WO | 2014066621 | 6/2014 |
| WO | 2014209757 A1 | 12/2014 |
| WO | 2015027017 | 2/2015 |
| WO | 2015127167 | 8/2015 |

OTHER PUBLICATIONS

T Benedict et al. 'The joint estimation of signal and noise from the sum envelope.' IEEE Transactions on Information Theory 13.3, pp. 447-454. Jul. 1, 1967.

* cited by examiner

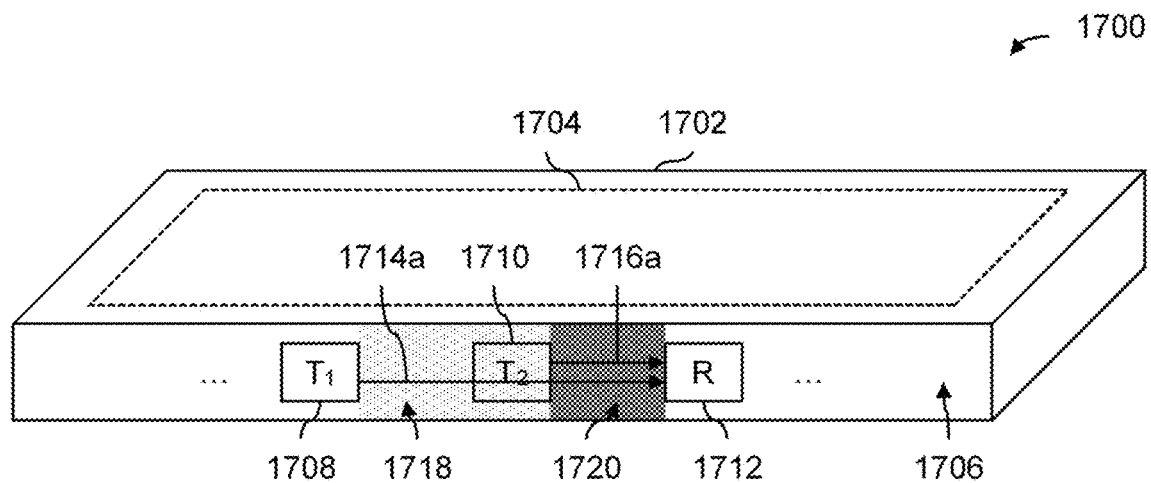
No Touch Applied
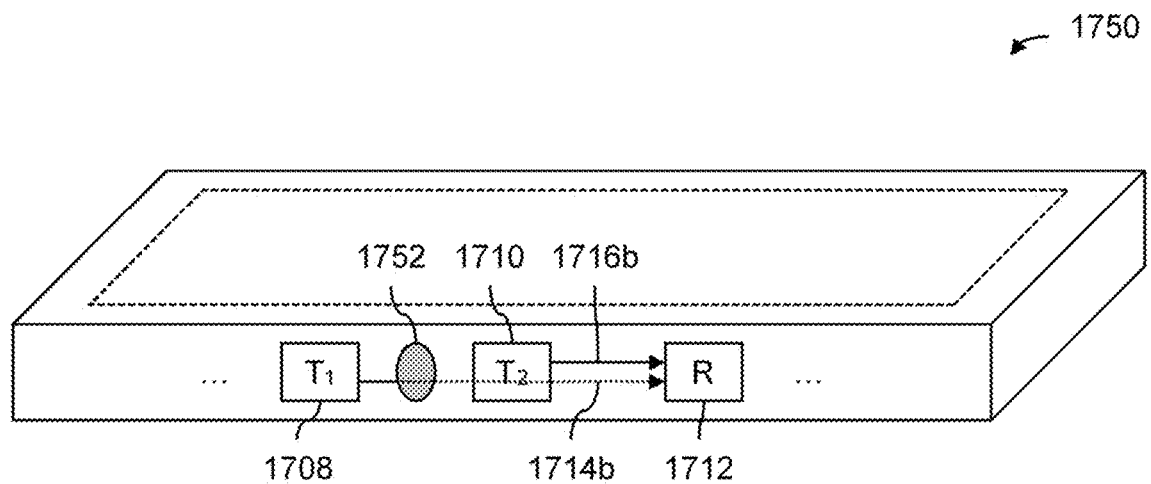
Single Touch on the Side of a Phone
FIG. 17

INCREASING SENSITIVITY OF A SENSOR USING AN ENCODED SIGNAL

CROSS REFERENCE TO OTHER APPLICATIONS

This application claims priority to U.S. Provisional Patent Application No. 62/545,391 entitled PIEZORESISTIVE SENSOR filed Aug. 14, 2017 which is incorporated herein by reference for all purposes.

BACKGROUND OF THE INVENTION

Piezo components can be used to detect and/or apply a physical disturbance (e.g., strain, force, pressure, vibration, etc.). There are two types of piezo components, piezoelectric and piezoresistive. With piezoelectric components, when a physical disturbance is applied on the component, the piezoelectric component produces a voltage/charge in proportion to the magnitude of the applied physical disturbance. This effect is reversible. Applying a voltage/charge on the piezoelectric component produces a mechanical response proportional to the applied voltage/charge. Piezoelectric components are often made of crystal or ceramic materials such as PZT (i.e., lead zirconate titanate). With piezoresistive components, when a physical disturbance is applied on the component, the piezoresistive component produces a change in resistance in proportion to the magnitude of the applied physical disturbance.

BRIEF DESCRIPTION OF THE DRAWINGS

Various embodiments of the invention are disclosed in the following detailed description and the accompanying drawings.

FIG. 17 is a diagram illustrating an embodiment of a receiver and two associated transmitters in the side of a phone.

DETAILED DESCRIPTION

Figure 1:
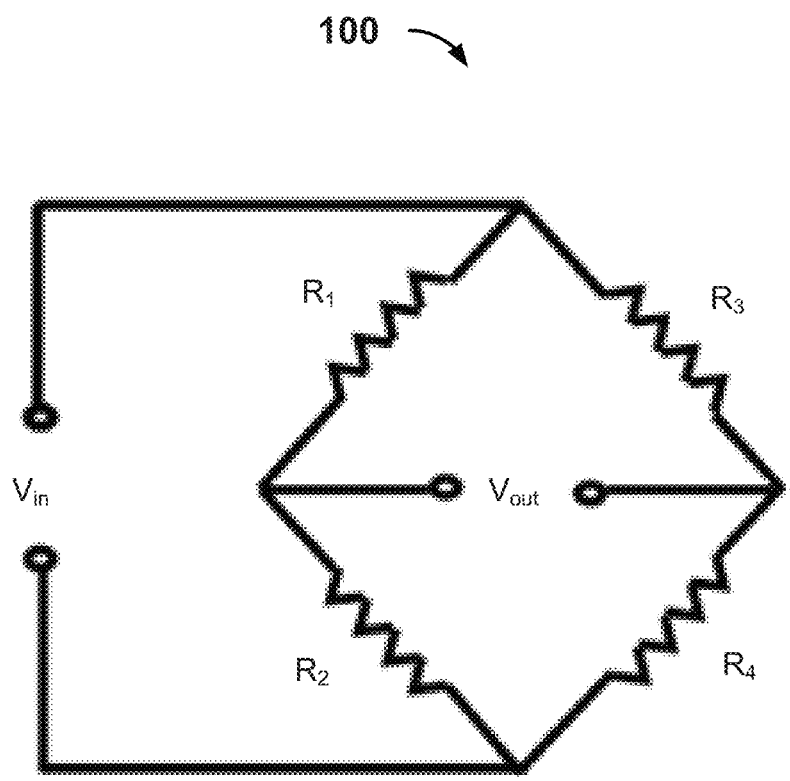
FIG. 1 is a schematic diagram illustrating an embodiment of a piezoresistive bridge structure.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As compared to piezoresistive components, piezoelectric components are often more sensitive and thus can be used to detect smaller perturbations. However, piezoresistive components do have an advantage over piezoelectric components when performing a static measurement. Because a fixed amount of voltage/charge is generated by a piezoelectric component in response to a constant applied force/pressure, when the applied force is maintained, the piezoelectric component outputs a decreasing signal as imperfect insulating materials and reduction in internal sensor resistance cause a constant loss of electrons. Thus it is difficult to accurately detect a static strain/force/pressure that has been applied on a piezoelectric component for the entire time duration of a lengthy application. On the other hand, with piezoresistive components, the change in resistance remains constant in response to an applied static force/pressure and thus static force/pressure can be more reliably detected.

This makes piezoresistive components a better choice for use in building a strain gauge. However, the limited physical disturbance sensitivity of piezoresistive components often hinders its application. Additionally, piezoresistive components are extremely sensitive to temperature and manufacturing variations can significantly affect accuracy and consistency of its output.

In some embodiments, a strain sensor includes a plurality of piezoresistive elements fabricated on a first side of a substrate. A second side of the substrate is configured to be coupled to an object where a strain is to be detected. A plurality of electrical connection terminals are coupled to the first side of the substrate, allowing power and signals to be provided/received from the strain sensor.

FIG. 1 is a schematic diagram illustrating an embodiment of a piezoresistive bridge structure. Piezoresistive bridge structure 100 includes four piezoresistive elements that are connected together as two parallel paths of two piezoresistive elements in series (e.g., Wheatstone Bridge configuration). Each parallel path acts as a separate voltage divider. The same supply voltage (e.g., $V_{in}$ of FIG. 1) is applied at both of the parallel paths and by measuring a difference in voltage (e.g., $V_{out}$ of FIG. 1) between a mid-point (e.g., between the piezoresistive elements $R_1$ and $R_2$ in series as shown in FIG. 1) at one of the parallel paths to a mid-point of the other parallel path (e.g., between the piezoresistive elements $R_3$ and $R_4$ in series as shown in FIG. 1), a magnitude of a physical disturbance (e.g., strain) applied on the piezoresistive structure can be detected. However, the piezoresistive elements are extremely sensitive to temperatures and manufacturing variabilities. Thus precisely matched piezoresistive elements typically must be utilized in the piezoresistive bridge structure. However, when separate piezoresistive elements are mounted on a material to produce the resistive bridge structure, it can be difficult and costly to ensure they are precisely matched and homogenous.

In some embodiments, rather than individually attaching separate already manufactured piezoresistive elements together on to a backing material to produce the piezoresistive bridge structure, the piezoresistive bridge structure is manufactured together as a single integrated circuit component and included in an application-specific integrated circuit (ASIC) chip. For example, the four piezoresistive elements and appropriate connections between are fabricated on the same silicon wafer/substrate using a photolithography microfabrication process. In an alternative embodiment, the piezoresistive bridge structure is built using a microelectromechanical systems (MEMS) process. The piezoresistive elements may be any mobility sensitive/dependent element (e.g., as a resistor, a transistor, etc.).

In some embodiments, the semiconductor substrate of the piezoresistive elements is a monocrystalline substrate (e.g., as opposed to a polycrystalline substrate). Although a polycrystalline substrate is commonly utilized in microfabrication of resistive elements of prior approaches, in the context of one or more of the embodiments described in this specification, the grains of the polycrystalline substrate may lead to inconsistent and undesirable behavior when the piezoresistive elements are subjected to strain. Thus by utilizing a monocrystalline substrate with a more consistent crystal structure, the piezoresistive elements behave in a more consistent and desirable manner when under strain.

In some embodiments, the micro fabricated silicon wafer/substrate has piezoresistive elements built on one side of the wafer/substrate, and external connections (e.g., connections for supply voltage and sensor output) to the structure are made from the side with the fabricated piezoresistive elements. This leaves the backside of the structure/chip for attachment to an object where the physical disturbances are to be detected using the chip. However, the thickness of a silicon wafer used in typical microfabrication is too thick to effectively transmit strain/force/pressure/vibration from the back surface to the components on the other side. In some embodiments, the backside of the silicon wafer/substrate is reduced (e.g., sanded) down to reduce the thickness of the final chip to facilitate the physical disturbance to travel through the thickness of the substrate. For example, starting from an original thickness of 750 microns, the substrate is sanded down to be less than 300 microns (e.g., sanded to a thickness of 100 microns) after fabricating the piezoresistive structures. In some embodiments, in order to facilitate external connections, preformed solder balls are formed/deposited/coupled to the substrate/chip to facilitate the external connections to the chip from its front/device side (i.e., side opposite the backside of the chip where the piezoresistive elements have been fabricated). Using preformed precision solder balls on the chip ensures manufacturing reliability. For example, when the piezoresistive bridge structure chip is attached to an object where the physical disturbance is to be detected, an adhesive (or tape) is applied to the backside of the chip and a force is applied on the opposite side of the chip (e.g., force applied on side with the preformed solder balls) to press and couple the chip on the object. The chip may break or become attached unevenly at an angle if the solder balls are uneven or not consistent.

Figure 2A:
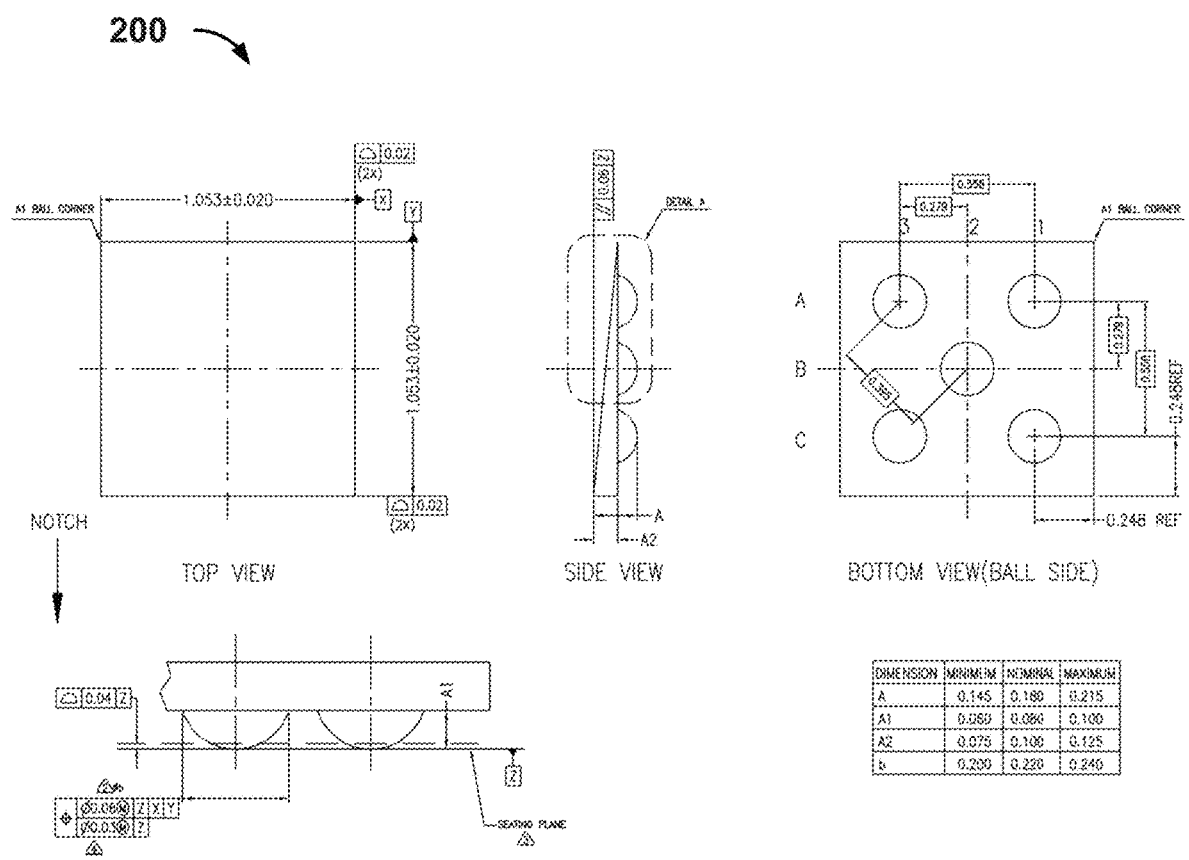
FIG. 2A is a diagram illustrating various views of an embodiment of an ASIC packaging of a piezoresistive sensor chip.

FIG. 2A is a diagram illustrating various views of an embodiment of an ASIC packaging of a piezoresistive sensor chip. Sensor chip 200 includes a fabricated structure of piezoresistive bridge structure 100 of FIG. 1. Chip 200 has five connection points (e.g., where the preformed solder balls have been placed) including two connections for the supply input, one for ground/bias, and two connections for sensor output (e.g., where voltage output indicating magnitude of physical disturbance is detected). An adhesive may be applied to the top side (e.g., faces backside of the semiconductor substrate) of chip 200 for coupling to an object where physical disturbances are to be detected. Bottom of chip 200 (e.g., faces component manufactured side of the semiconductor substrate) includes preformed precision solder balls (e.g., two for plus/minus of input, one for ground/bias, and two for plus/minus of sensor output). Chip 200 has been configured in a manner to be rotation invariant (e.g., for four different orientations) during installation. For example, orientation of the chip with respect to receiving contact pads (e.g., on a flexible printed circuit cable, circuit board, etc.) that attaches to the solder balls of chip 200 does not matter as long as the receiving contact pads line up with the pattern of solder balls due to the symmetrical nature of the pattern of solder balls (e.g., symmetrical along multiple different axes) as well as interchangeability between the input connections and the output connections given the symmetrical nature of the chip schematics.

Figure 2B:
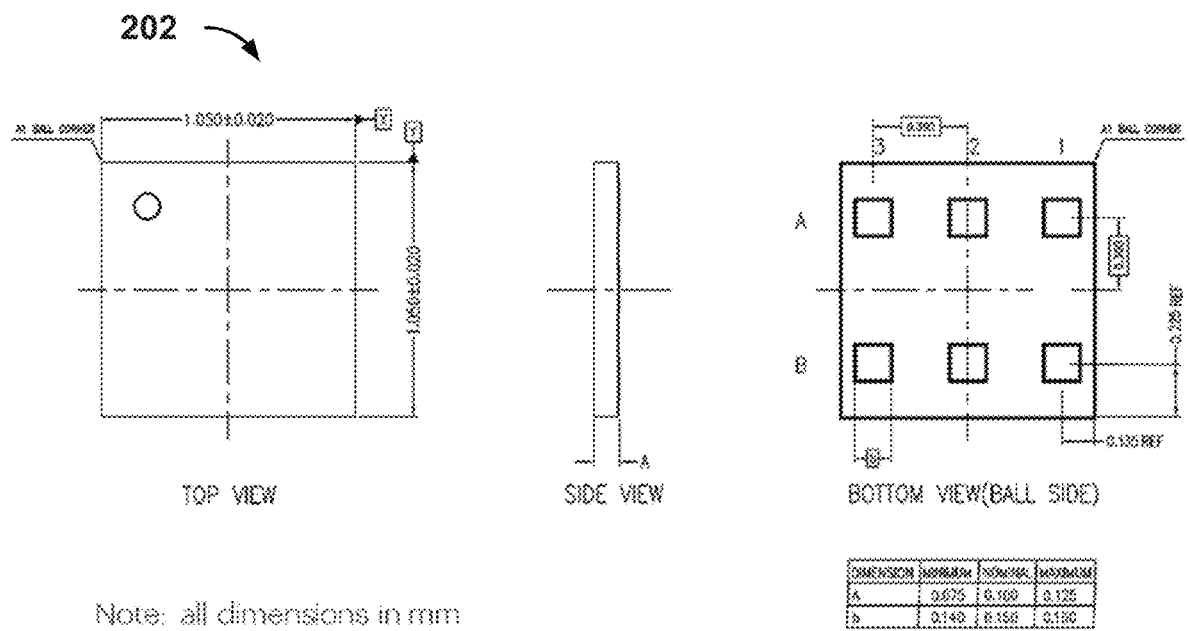
FIG. 2B is a diagram illustrating various views of another embodiment of a packaging of a piezoresistive sensor chip.

FIG. 2B is a diagram illustrating various views of another embodiment of a piezoresistive sensor chip. Sensor chip 202 includes a fabricated structure of piezoresistive bridge structure 100 of FIG. 1. Chip 202 has six connection points including two connections for the supply input, two for ground/bias, and two connections for sensor output (e.g., where voltage output indicating magnitude of physical disturbance is detected). An adhesive may be applied to the top side (e.g., faces backside of the semiconductor substrate) of chip 202 for coupling to an object where physical disturbances are to be detected. Bottom of chip 202 (e.g., faces component manufactured side of the semiconductor substrate) includes exposed conductive surface portions corresponding to the six connection points and can be connected corresponding connection pads (e.g., on a flexible printed circuit, a circuit board, etc.). In effect, chip 202 utilizes land grid array (LGA) structures as connection points for sensor chip 202.

Although an example of chip 200 of FIG. 2A utilized preformed solder balls, chip 202 does not necessarily have to utilize preformed solder balls on its connection points/pads/pins (e.g., to attach chip 202 to a flex circuit cable/board). Rather, a solder paste can be applied to the connection points of chip 202, placed into contact with the corresponding contact pads of the receiving circuit cable/board (e.g., flexible printed circuit cable) and heated to perform reflow soldering. The heat will melt the solder paste and reflow the solder material to join together the connection points of chip 202 with the corresponding contact pads of the circuit cable/board. However, a challenge with using reflow soldering is achieving even heating of the connection points. For example, heat applied on top of chip 202 will flow around the sides of the chip to heat the sides before reaching the center of the chip. As compared to chip 200 of FIG. 2A, chip 202 does not include a connection point in the middle of the chip to allow more even heating of the connection points placed around the perimeter of the chip without a connection in the center of the chip. Although use of reflow soldering to attach a CPU chip to a rigid circuit board has been done in electrical manufacturing, use of reflow soldering to attach a chip to a flexible printed circuit is believed to be novel and is at least partly enabled by the configuration and relative small size of chip 202.

In some embodiments, as compared to chip 200 of FIG. 2A, an additional connection point has been added to make chip 202 symmetrical and rotation invariant (e.g., for two different orientations). For example, orientation of chip 202 with respect to receiving contact pads (e.g., on a flexible printed circuit cable, circuit board, etc.) that attaches to connection points of chip 200 does not matter as long as the receiving contact pads line up with the pattern of the chip connection points due to the symmetrical nature of the pattern of the chip connection points as well as interchangeability between the input connections and the output connections given the symmetrical nature of the chip schematics. In some embodiments, chip 202 is not necessarily rotation invariant and a mark (e.g., circle mark shown on top view of FIG. 2B) on a top side of chip 202 indicates an orientation of the chip (e.g., indicates that connection point/pad/pin number 1 is underneath near the chip corner where the mark is placed).

Figure 3:
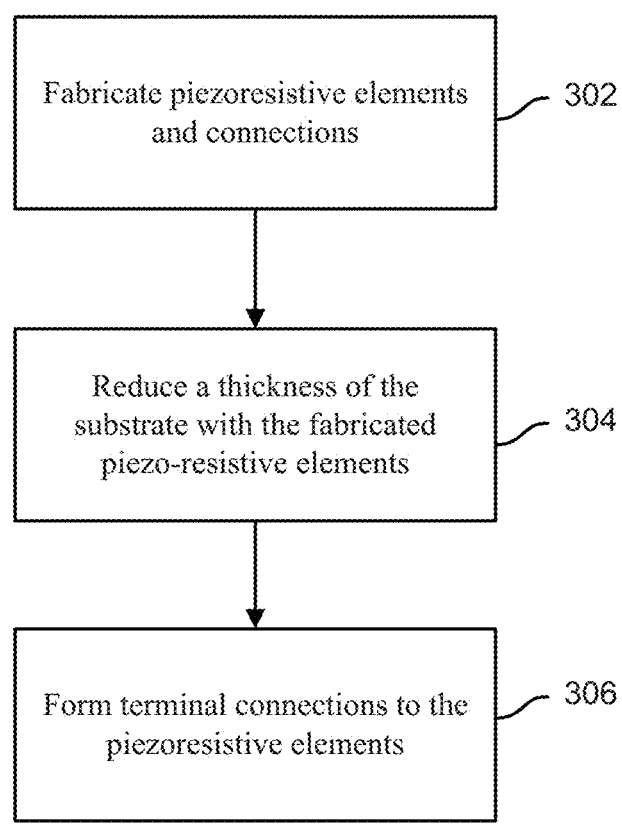
FIG. 3 is a flowchart illustrating an embodiment of a process for producing a piezoresistive sensor.

FIG. 3 is a flowchart illustrating an embodiment of a process for producing a piezoresistive sensor. For example, the process of FIG. 3 is utilized to at least in part manufacture sensor chip 200 of FIG. 2A and/or 202 of FIG. 2B.

At 302, piezoresistive elements and connections between them are fabricated on a substrate. For example, piezoresistive elements and connections between them (e.g., in a bridge structure configuration) are fabricated on the same semiconductor wafer/substrate (e.g., made of silicon, gallium arsenide, or other semiconductor materials) using a photolithography microfabrication process. In alternative embodiment, the piezoresistive bridge structure is built using a microelectromechanical systems (MEMS) process. Examples of the piezoresistive element include a resistor, a transistor, and any mobility sensitive/dependent element.

At 304, a thickness of the substrate with the fabricated piezoresistive elements is reduced. In some embodiments, the micro fabricated silicon wafer/substrate has piezoresistive elements fabricated on one side of the wafer/substrate, and external connections (e.g., connections for supply voltage and sensor output) to the structure are made from the side with the fabricated piezoresistive elements. This leaves the backside of the structure/chip for attachment to an object where the physical disturbances are to be detected using the chip. However, the thickness of a silicon substrate may be too thick to effectively transmit strain/force/pressure/vibration from the back surface to the components on the other side. In some embodiments, the backside of the substrate is reduced (e.g., sanded) down to reduce the thickness of the final chip to facilitate the physical disturbance to travel through the thickness of the substrate. For example, starting from an original thickness of 750 microns, the substrate is sanded down to be less than 300 microns (e.g., sanded to a thickness of 100 microns) after fabricating the piezoresistive structures.

At 306, terminal connections to the piezoresistive elements are formed.

In some embodiments, in order to facilitate external connections, preformed solder balls are formed/deposited/coupled to the substrate/chip to facilitate the external connections to the chip from its front/device side (i.e., side opposite the backside of the chip where the piezoresistive elements have been fabricated). In some embodiments, terminal connections to the piezoresistive elements are formed prior to reducing the thickness of the substrate. Using preformed precision solder balls on the chip ensures manufacturing reliability. For example, when the piezoresistive bridge structure chip is attached to an object where the physical disturbance is to be detected, an adhesive (or tape) is applied to the backside of the chip and a force is applied on the opposite side of the chip with the preformed solder balls to press and couple the chip on the object. The chip may break or become attached unevenly at an angle if the solder balls are uneven or not consistent.

In some embodiments, rather than using preformed solder balls, terminal connections to the piezoresistive elements are at least in part formed using solder paste. For example, the solder paste can be applied to the connection points of chip 202 of FIG. 2B, placed into contact with the corresponding contact pads of a receiving circuit cable/board (e.g., flexible printed circuit cable) and heated. The heat will melt the solder paste and reflow the solder material to join together the connection points of chip 202 with the corresponding contact pads of the circuit cable/board.

Figure 4:
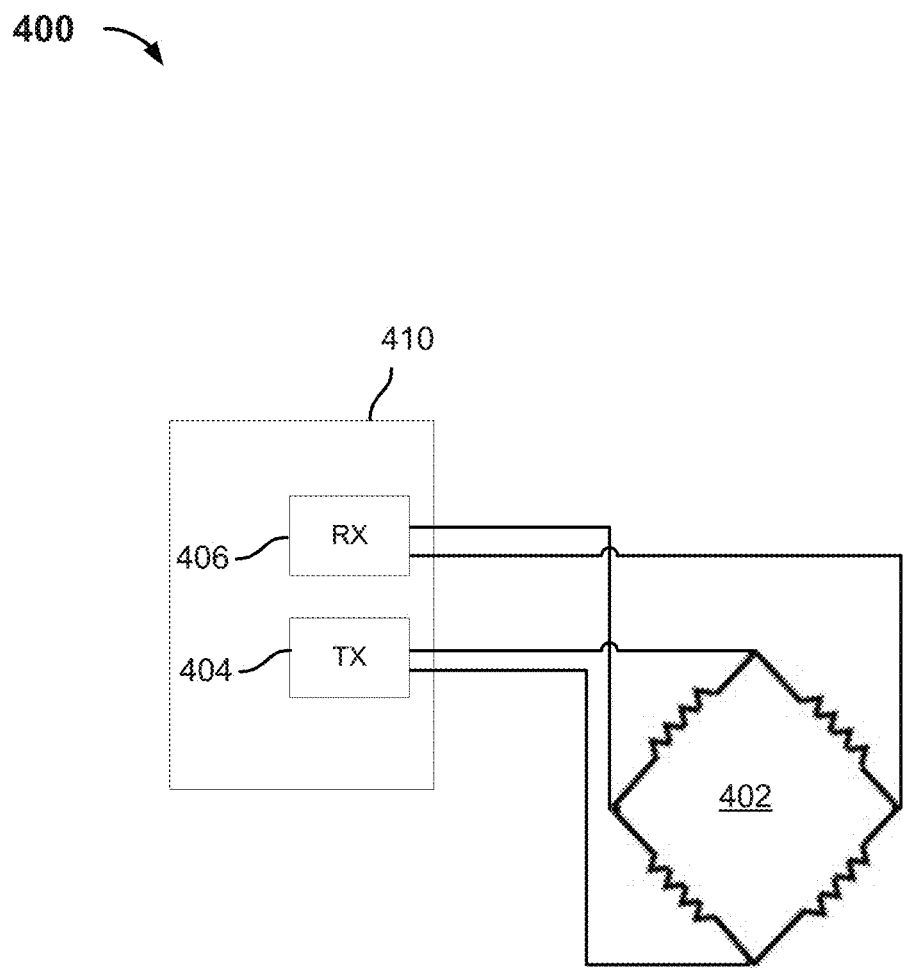
FIG. 4 is a diagram illustrating an embodiment of a system for detecting a physical disturbance (e.g., strain, pressure, etc.).

FIG. 4 is a diagram illustrating an embodiment of a system for detecting a physical disturbance (e.g., strain, pressure, etc.).

In some embodiments, structure 100 of FIG. 1, sensor chip 200 of FIG. 2A, and/or sensor chip 202 of FIG. 2B may be utilized for ultrasonic signal sensing applications. For example, it can be used to replace piezoelectric receivers in sensing propagated vibration signals transmitted by piezoelectric actuators/transmitters. Given the piezoresistive elements of the resistive bridge structure that rely on mobility modulation within the silicon substrate as it encounters ultrasound waves, the resistive bridge structure can function as a receiver. Likewise, since the mobility modulation of substrate stress into electrical signal is a physical function of silicon, it can also be used to sense absolute changes in stress and strain. In some embodiments, chip 200 includes temperature sensing and compensation capabilities, which work with a fixed set of calibration signals being sent from a transmitter.

However, the challenge of using the piezoresistive elements as an ultrasonic signal sensor/receiver is the difficultly of using them to sense minute changes in physical disturbances caused by the ultrasonic signal. For example, a physical disturbance desired to be detected may only cause a 0.001% change in resistance of the piezoresistive elements, leading to microvolt output signals that are difficult to accurately detect digitally given their small magnitude. With a DC voltage biased piezoresistive bridge structure, this level of variation is difficult to detect, especially given noise (e.g., pink noise, noise picked up from external sources, etc.) affecting the sensor/receiver.

In some embodiments, rather than using a DC bias voltage, a higher frequency signal is utilized as the bias/supply voltage of the piezoresistive bridge structure. The output of the piezoresistive bridge structure will output a modulated version of the input supply signal in proportion to a magnitude of physical disturbance sensed to the structure. Signal processing can be performed on the output signal to characterize and quantify this magnitude.

In some embodiments, a system includes a plurality of piezoresistive elements configured in a resistive bridge structure. A signal transmitter is coupled to the resistive bridge structure and configured to send an encoded signal to the resistive bridge structure. A signal receiver is coupled to the resistive bridge structure and configured to receive a signal from the resistive bridge structure. The received signal is correlated with the sent encoded signal in determining a measure of strain.

System 400 includes sensor bridge structure 402, signal transmitter 404, and signal receiver 406. An example of sensor bridge structure 402 is bridge structure 100 of FIG. 1. In some embodiments, sensor bridge structure 402 is packaged as sensor chip 200 of FIG. 2A and/or sensor chip 202 of FIG. 2B that is connected to signal processor component 410 that includes signal transmitter 404 and signal receiver 406. Transmitter 404 provides an input supply signal to sensor bridge structure 402. Rather than being a constant DC voltage, signal transmitter 404 provides the supply signal at a high frequency (e.g., between 50 kHz and 1 MHz). By using a higher frequency signal, pink noise (i.e., 1/f noise) can be reduced and filtered out, resulting in increased signal detection sensitivity. In some embodiments, the provided input supply voltage is an encoded digitally modulated signal. For example, a carrier signal (e.g., between 50 kHz and 1 MHz) is modulated using a digital signal (e.g., a signal encoding a pseudorandom binary sequence (PRBS)).

As physical disturbance is applied to imbalance structure 402 and alters the resistance of its piezoresistive elements, output from sensor bridge structure 402 received by signal receiver 406 is a version of the input supply signal provided by signal transmitter 404 with an amplitude/intensity/gain change that is proportional to the physical disturbance.

Signal processor component 410 includes other components not shown in the diagram of FIG. 4 to illustrate the embodiment more clearly. For example, signal processor component 410 may include a microprocessor, a signal driver, a signal generator, a controller, a DSP engine, an ADC, and/or a signal conditioner.

Figure 5:
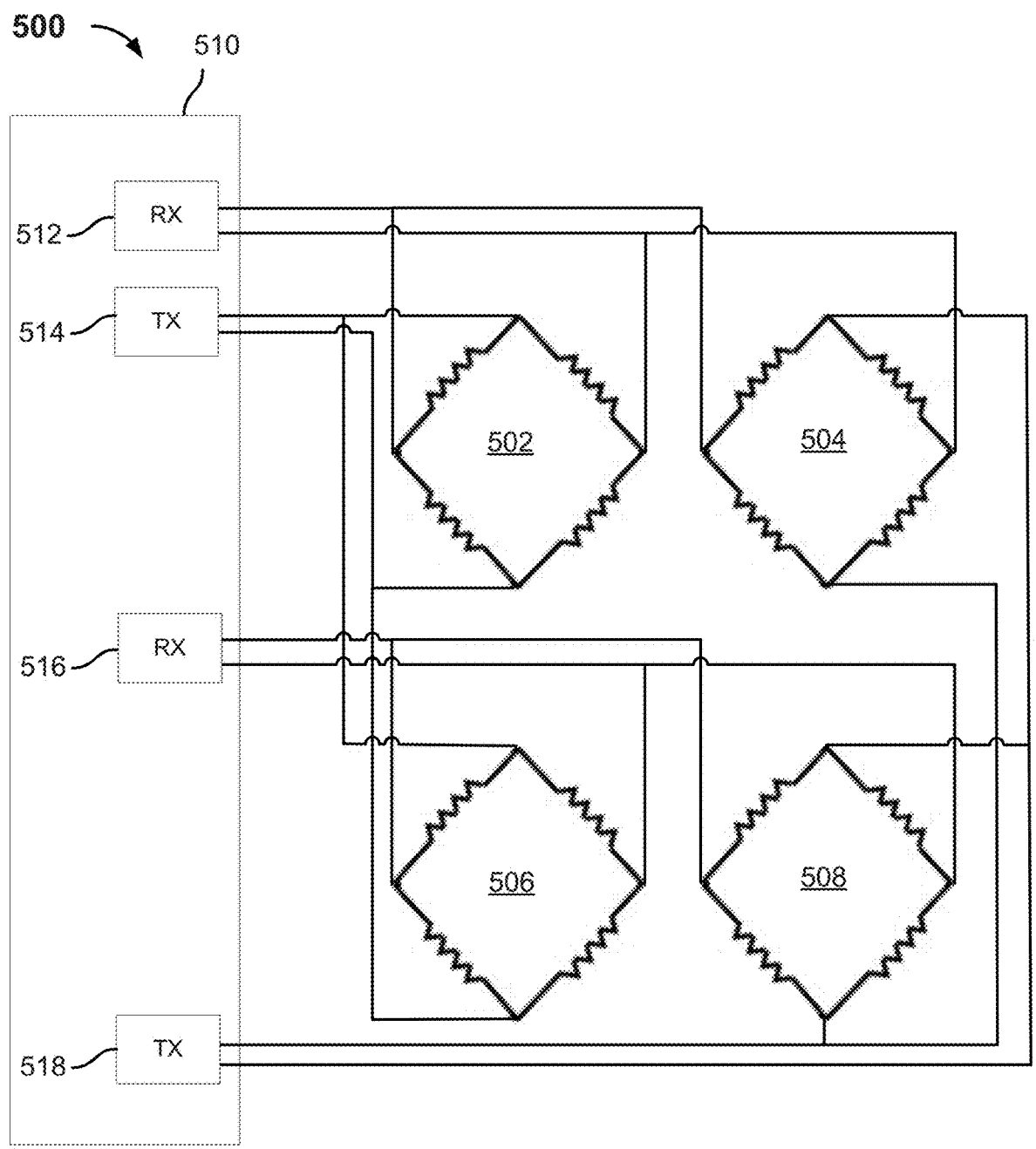
FIG. 5 is a diagram illustrating an embodiment of a system that shares transmitters and receivers among banks of bridge structures for detecting physical disturbances (e.g., strain).

FIG. 5 is a diagram illustrating an embodiment of a system 500 that shares transmitters and receivers among banks of bridge structures for detecting physical disturbances (e.g., strain).

In some embodiments, the output from a sensor bridge structure (e.g., piezoresistive bridge structure) is provided as a physical input to a signal receiver of a processor component that receives and processes the output to determine the sensed mechanical disturbance magnitude. However, as the number of sensor bridge structures that are utilized increases, a signal processing component requires an increasing number of receivers given that a separate receiver component is required for each different signal to be received in parallel. It may be difficult, inefficient, and costly in many cases to accommodate such a large number of receivers.

In some embodiments, outputs from a plurality of sensor bridge structures are electrically connected together such that the plurality of sensor bridge structures share the same receiver (e.g., share the same connection interface/wire of the receiver). This means that the signal outputs from a plurality of sensor bridge structures will become combined together when the same receiver receives it. In order to be able to distinguish between signals from different piezoresistive bridge structures, each structure of the group of structures connected together utilizes a different input supply signal (e.g., by a different transmitter). By correlating the combined output against each of the different supply signals, the output corresponding to each piezoresistive bridge structure is able to be selectively obtained. In some embodiments, different encoded digitally modulated signals (a carrier signal, e.g., between 50 kHz and 1 MHz, is modulated using a digital signal, e.g., PRBS signal) are utilized for different piezoresistive bridge structures. In some embodiments, the different supply signals provided to each of the piezoresistive bridge structures are different phases (e.g., time shifted versions) of the same modulated PRBS signal.

The increase in the number of supply signals means that the number of transmitters has been increased as a tradeoff in reducing the number of receivers. However, the same supply signal is able to be shared (i.e., sharing the same transmitter) with other bridge structures that do not share/combine their outputs (e.g., do not share the same receiver). In some embodiments, there exists a plurality of banks of piezoresistive bridge structures, where each bank of piezoresistive bridge structures shares a common connection/wire to a receiver but each piezoresistive bridge structure of the bank is provided different input supply signals from different transmitters. Additionally, one bridge structure from each bank of the plurality of banks share a common transmitter and are provided the same input voltage source signal. In some embodiments, a single signal processor component includes the different transmitters and receivers. Thus by sharing both transmitters and receivers, the total number of transmitters and receivers that are utilized is able to be reduced. For example, without receiver sharing, a group of 32 piezoresistive bridge structures will require 1 transmitter and 32 receivers for a total of 33 transmitter/receiver components. However with both transmitter and receiver sharing, only 4 transmitters and 8 receivers are required (e.g., 4 banks of 8 bridge structures) for a total of 12 transmitter/receiver components.

Sensor bridge structures 502 and 504 belong to a first bank of sensor bridge structures and share receiver 512 of signal processor component 510. Sensor bridge structures 506 and 508 belong to a second bank of sensor bridge structures and share receiver 516 of signal processor component 510. Sensor bridge structures 502 and 506 share transmitter 514 that provides a first input supply signal, and sensor bridge structures 504 and 508 share transmitter 518 that provides a second input supply signal. An example of each of sensor bridge structure 502, 504, 506, and 508 is bridge structure 100 of FIG. 1. In some embodiments, each of sensor bridge structure 502, 504, 506, and 508 is packaged as sensor chip 200 of FIG. 2A and/or sensor chip 202 of FIG. 2B. Signal processor component 510 includes other components not shown in the diagram of FIG. 5 to illustrate the embodiment more clearly. For example, signal processor component 510 may include a microprocessor, a signal driver, a signal generator, a controller, a DSP engine, an ADC, and/or a signal conditioner.

Figure 6:
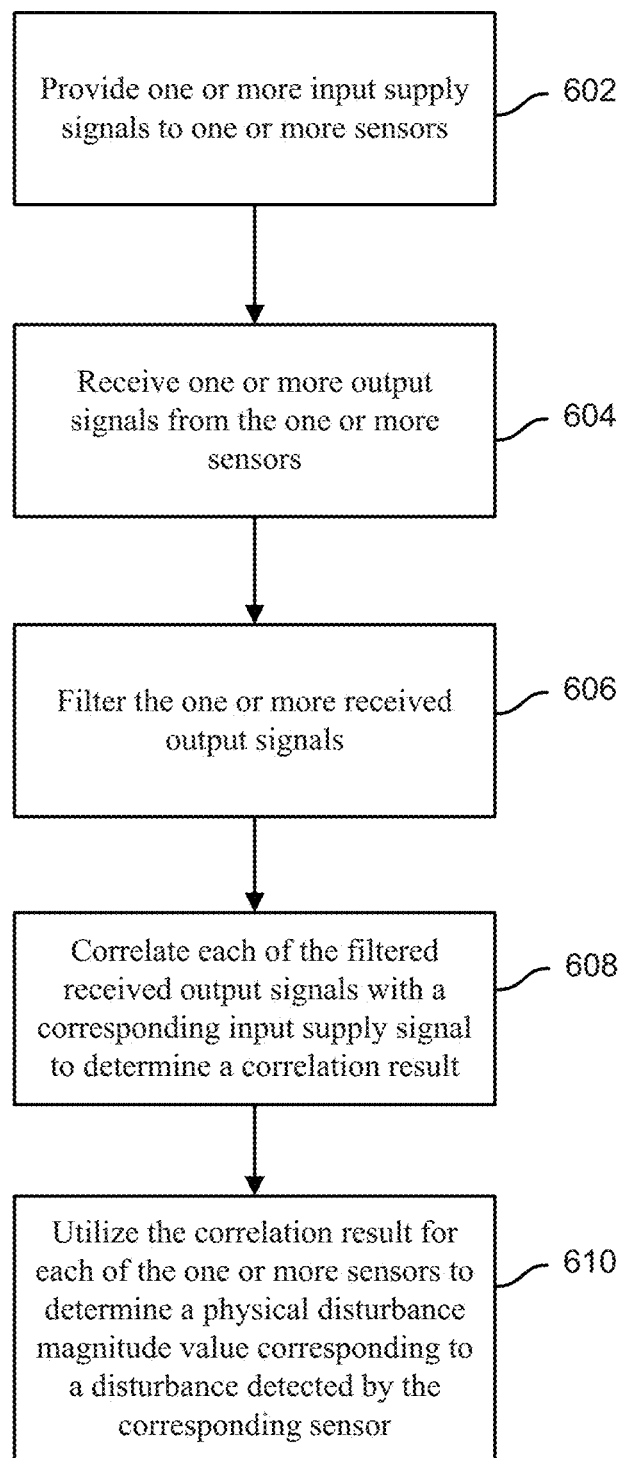
FIG. 6 is a flowchart illustrating an embodiment of a process for detecting a signal disturbance using one or more sensors.

FIG. 6 is a flowchart illustrating an embodiment of a process for detecting a signal disturbance using one or more sensors. The process of FIG. 6 may be performed by signal processor component 410 of FIG. 4, signal processor component 510 of FIG. 5, touch detector 720 of FIGS. 7A-7D, touch detector 802 of FIG. 8, and/or touch detector 1520 of FIG. 15B.

At 602, one or more input supply signals are provided to one or more sensors. For example, voltage supply signal(s) are provided to one or more sensor bridge structures (e.g., bridge structures shown in FIGS. 4 and/or 5). An example of the sensor bridge structure is a piezoresistive bridge structure produced using the process of FIG. 3. In some embodiments, each supply voltage signal is an encoded digitally modulated signal. For example, a carrier signal (e.g., between 50 kHz and 1 MHz) is modulated using a digital signal (e.g., signal encoding a pseudorandom binary sequence (PRBS)).

In some embodiments, a plurality of sensors are provided the same supply voltage signal. In some embodiments, there exists a plurality of sensors and at least a portion of the sensors is provided a different supply voltage signal from another portion of the sensors. The different supply voltage signals may differ by being modulated using a different digital signal (e.g., encoding a different PRBS) and/or by having different phases (e.g., time shifted versions of the same modulated PRBS signal are used as the different signals). In some embodiments, there exists a plurality of banks of bridge structures, where each bank of bridge structures shares a common connection to a receiver but each piezoresistive bridge structure of the bank is provided different input supply signals from different transmitters. Additionally, one bridge structure from each bank of the plurality of banks shares a common transmitter and is provided the same input voltage source signal. In some embodiments, a single signal processor component includes the different transmitters and receivers.

At 604, one or more output signals are received from the one or more sensors. For example, as physical disturbance is applied to imbalance the resistive bridge structure of the sensor to alter the resistance of its resistive elements, an output signal from the sensor is a version of the input supply signal with an amplitude/intensity/gain change that is proportional to the physical disturbance. In some embodiments, a different output signal is received from each of the one or more sensors. In some embodiments, output signals from a plurality of sensors that share a connection to the same receiver have become combined (e.g., super imposed) on a combined output signal received by the receiver and the received combined output signal is to be processed to separate the different output signals from the different sensors.

At 606, the one or more received output signals are filtered. For example, an output signal is high pass filtered, low pass filtered and/or anti-alias filtered to reject/reduce noise (e.g., filter to isolate signal portion within frequency range of the encoded digitally modulated input signal and reject signal frequency components outside the range of the input signal).

At 608, each of the filtered received output signals is correlated with a corresponding input supply signal to determine a correlation result. For example, a cross-correlation is performed between a filtered received output signal and the corresponding input signal that was provided to the sensor that provided the corresponding received output signal. Because the input signal travels through the elements (e.g., piezoresistive elements) of the sensor almost instantaneously, the output signal and the input signal are correlated from each other without any delay or lag and the correlation result may indicate a correlation value between the signals without any delay or lag from each other. In some embodiments, a filtered combined output signal includes component output signals from a plurality of different sensors and the same filtered combined output signal is correlated with each of the different input supply signals of the different sensors to determine a separate corresponding correlation result for each of the different sensors. In some embodiments, the correlation result is a correlation result signal. In some embodiments, the correlation result is a value.

At 610, the correlation result for each of the one or more sensors is utilized to determine a physical disturbance magnitude value corresponding to a disturbance detected by the corresponding sensor. For example, a magnitude value indicating an amount of force, pressure, or strain detected by the sensor is determined and provided for use as the force, pressure, or strain magnitude of a touch input. In some embodiments, the disturbance magnitude value is proportional to an amplitude value of the corresponding correlation result. For example, the amplitude value of the corresponding correlation result or a scaled version of the amplitude value of the corresponding correlation result is provided as the disturbance magnitude value. In some embodiments, a maximum amplitude value of the corresponding correlation result is identified and utilized in determining the disturbance magnitude value.

In some embodiments, the determined physical disturbance magnitude value is a calibrated value. Due to minor residual manufacturing variations, temperature variations, and other sources of errors, a sensor may detect a minor false mechanical disturbance even though no mechanical/physical disturbance is being applied. In some embodiments, a calibration is performed (e.g., periodically performed) to detect and correct it. For example, output signal from the piezoresistive bridge structure is detected at steady-state when no physical disturbance is being applied and any detected physical disturbance magnitude (e.g., correlation result amplitude value) at steady-state is determined as the calibration offset value/factor. This calibration offset value is subtracted from a detected physical disturbance magnitude (e.g., subtract calibration offset value from an amplitude value of a correlation result) to determine a calibrated physical disturbance magnitude result that is provided as an output force, pressure or strain magnitude value.

Figure 7A:
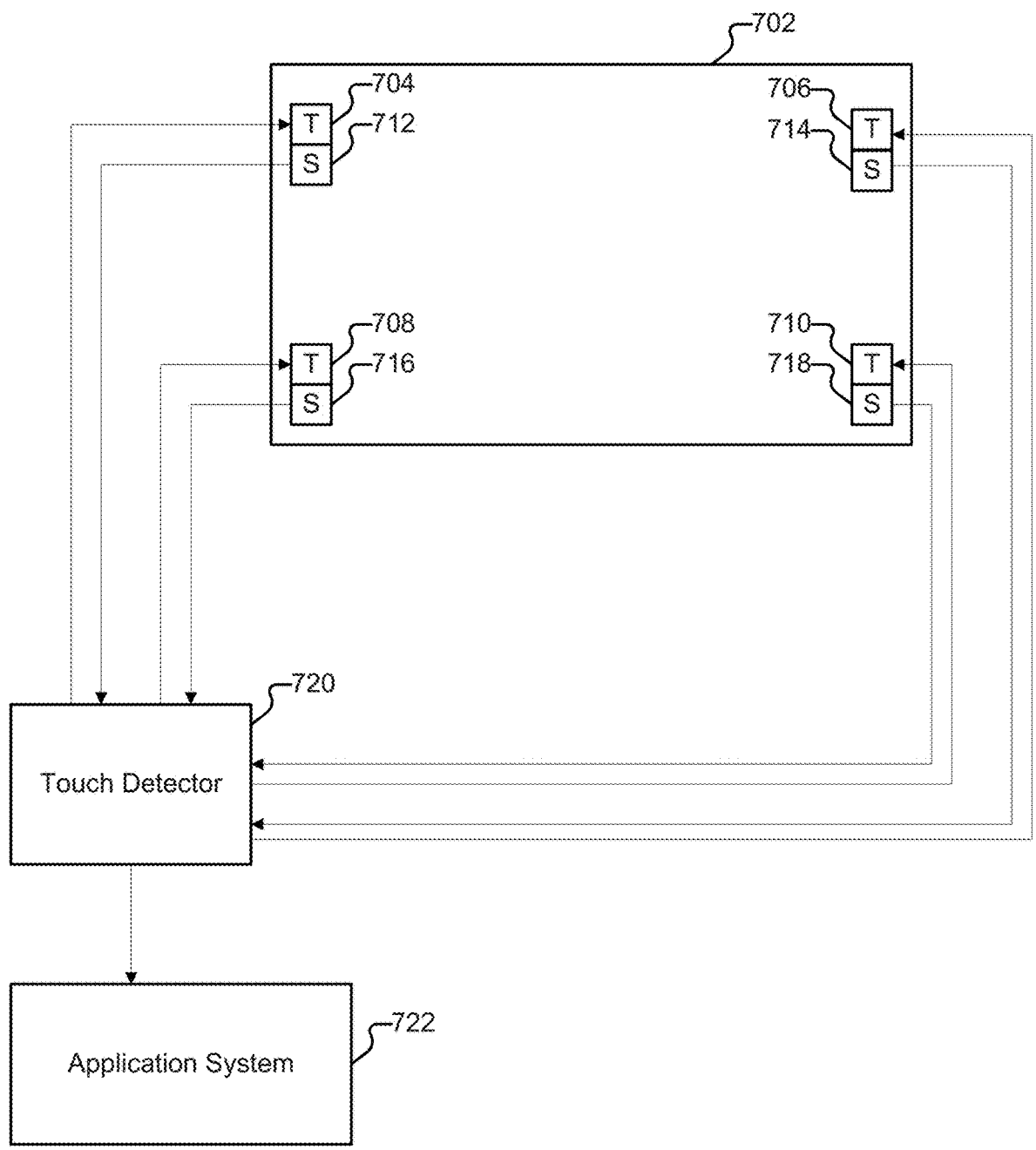
FIG. 7A is a block diagram illustrating an embodiment of a system for detecting a touch input surface disturbance.

FIG. 7A is a block diagram illustrating an embodiment of a system for detecting a touch input surface disturbance.

A piezo receiver device can be utilized to detect a location of a touch input on a surface. For example, a user touch input on the glass surface of a display screen is determined by detecting at the piezo receiver device coupled to the glass, a disturbance to an ultrasonic signal that has been transmitted and propagated through the glass. In some embodiments, a signal such as an acoustic or ultrasonic signal is propagated freely through a propagating medium with a surface using a piezo transmitter coupled to the propagating medium. When the surface is touched, the propagated signal is disturbed (e.g., the touch causes an interference with the propagated signal). In some embodiments, the disturbed signal is received at a piezo sensor coupled to the propagating medium. By processing the received signal and comparing it against an expected signal without the disturbance (e.g., transmitted signal), a location on the surface associated with the touch input is at least in part determined. For example, the disturbed signal is to received at a plurality of sensors and a relative time difference between when the disturbed signal was received at different sensors is used to determine and triangulate the location on the surface. In some embodiments, time differences associated with the plurality of results are used to determine a location associated with the disturbance. In some embodiments, each of the time differences is associated with a time when signals used in the correlation are most correlated. In some embodiments, the time differences are associated with a determined time delay/offset or phase difference caused on the received signal due to the disturbance. This time delay may be calculated by comparing a time value determined using a correlation with a reference time value that is associated with a scenario where a touch input has not been specified. The result of the comparison may be used to calculate a location of the disturbance relative to the locations of sensors that received the plurality of signals. By using the location of the sensors relative to a surface of a medium that has propagated the received signal, a location on the surface where the disturbance to the propagated signal originated may be determined.

In some embodiments, the piezo transmitter is a piezoelectric transmitter. In various embodiments, the piezo sensor/receiver includes a piezoelectric sensor and/or a piezoresistive sensor (e.g., piezoresistive bridge structure). Because piezoelectric sensors are typically more sensitive than piezoresistive sensors as previously described, piezoelectric sensors are better suited for use in detecting propagated ultrasonic signals in many applications. However, because piezoresistive sensors are also able to more reliably detect constant strain/force/pressure, use of piezoresistive sensors allows more reliable detection of input strain/force/pressure.

In some embodiments, an example system for detecting a location of a touch input on a surface of a propagating medium includes a transmitter coupled to a propagating medium and configured to emit a signal. The signal has been allowed to propagate through a propagating medium and a location of a touch input on a surface of the propagating medium is detected at least in part by detecting an effect of the touch input on the signal that has been allowed to propagate through the propagating medium. The example system also includes a piezoresistive sensor coupled to the propagating medium, wherein the piezoresistive sensor is configured to at least detect a force of the touch input on the propagating medium.

In some embodiments, the system shown in FIG. 7A is included in a kiosk, an ATM, a computing device, an entertainment device, a digital signage apparatus, a cell phone, a tablet computer, a point of sale terminal, a food and restaurant apparatus, a gaming device, a casino game and application, a piece of furniture, a vehicle, an industrial application, a financial application, a medical device, an appliance, and any other objects or devices having surfaces. Propagating signal medium 702 is coupled to transmitters 704, 706, 708, and 710 and receivers/sensors 712, 714, 716, and 718. The locations where transmitters 704, 706, 708, and 710 and sensors 712, 714, 716, and 718 have been coupled to propagating signal medium 702, as shown in FIG. 7, are merely an example. Other configurations of transmitter and sensor locations may exist in various embodiments. Although FIG. 7A shows sensors located adjacent to transmitters, sensors may be located apart from transmitters in other embodiments. In some embodiments, a single transducer is used as both a transmitter and a sensor. In various embodiments, the propagating medium includes one or more of the following: panel, table, glass, screen, door, floor, whiteboard, plastic, wood, steel, metal, semiconductor, insulator, conductor, and any medium that is able to propagate an acoustic or ultrasonic signal. For example, medium 702 is glass of a display screen. A first surface of medium 702 includes a surface area where a user may touch to provide a selection input and a substantially opposite surface of medium 702 is coupled to the transmitters and sensors shown in FIG. 7A. In various embodiments, a surface of medium 702 is substantially flat, curved, or combinations thereof and may be configured in a variety of shapes such as rectangular, square, oval, circular, trapezoidal, annular, or any combination of these, and the like.

Examples of transmitters 704, 706, 708, and 710 include piezoelectric transducers, piezoresistive elements/transmitters, electromagnetic transducers, transmitters, sensors, and/or any other transmitters and transducers capable of propagating a signal through medium 702.

Examples of sensors 712, 714, 716, and 718 include piezoelectric transducers, electromagnetic transducers, piezoresistive sensors/receivers (e.g., including bridge structure 100 of FIG. 1, sensor chip 200, etc.), laser vibrometer transmitters, and/or any other sensors and transducers capable of detecting a signal on medium 702. In some embodiments, the transmitters and sensors shown in FIG. 7A are coupled to medium 702 in a manner that allows a user's input to be detected in a predetermined region of medium 702. Although four transmitters and four sensors are shown, any number of transmitters and any number of sensors may be used in other embodiments. For example, two transmitters and three sensors may be used. In some embodiments, a single transducer acts as both a transmitter and a sensor. For example, transmitter 704 and sensor 712 represent a single piezoelectric transducer. In the example shown, transmitters 704, 706, 708, and 710 each may propagate a signal through medium 702. A signal emitted by a transmitter is distinguishable from another signal emitted by another transmitter. In order to distinguish the signals, a phase of the signals (e.g., code division multiplexing), a frequency range of the signals (e.g., frequency division multiplexing), or a timing of the signals (e.g., time division multiplexing) may be varied. One or more of sensors 712, 714, 716, and 718 receive the propagated signals. In another embodiment, the transmitters/sensors in FIG. 7A are attached to a flexible cable coupled to medium 102 via an encapsulant and/or glue material and/or fasteners.

Touch detector 720 is connected to the transmitters and sensors shown in FIG. 7. In some embodiments, detector 720 includes one or more of the following: an integrated circuit chip, a printed circuit board, a processor, and other electrical components and connectors. Detector 720 determines and sends signals to be propagated by transmitters 704, 706, 708, and 710. Detector 720 also receives the signals detected by sensors 712, 714, 716, and 718. The received signals are processed by detector 720 to determine whether a disturbance associated with a user input has been detected at a location on a surface of medium 702 associated with the disturbance. Detector 720 is in communication with application system 722. Application system 722 uses information provided by detector 720. For example, application system 722 receives from detector 720 a coordinate associated with a user touch input that is used by application system 722 to control a software application of application system 722. In some embodiments, application system 722 includes a processor and/or memory/storage. In other embodiments, detector 720 and application system 722 are at least in part included/processed in a single processor. An example of data provided by detector 720 to application system 722 includes one or more of the following associated with a user indication: a location coordinate of a surface of medium 702, a gesture, simultaneous user indications (e.g., multi-touch input), a time, a status, a direction, a velocity, a force magnitude, a proximity magnitude, a pressure, a size, and other measurable or derived information.

Figure 7B:
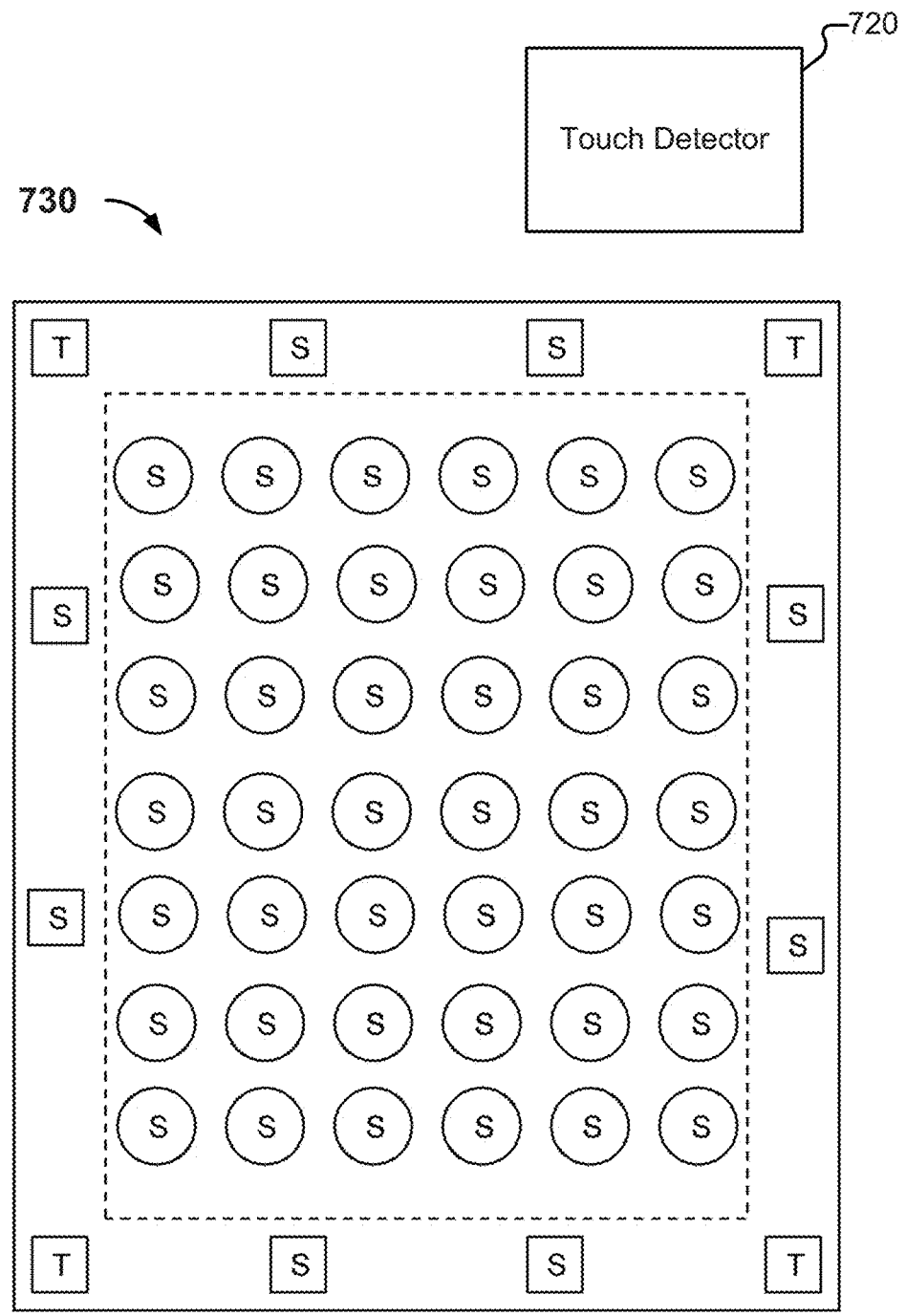
FIGS. 7B-7D show different embodiments of transmitter and sensor component arrangements utilized to detect a touch input along a surface area (e.g., to detect touch input on a touchscreen display).
Figure 7C:
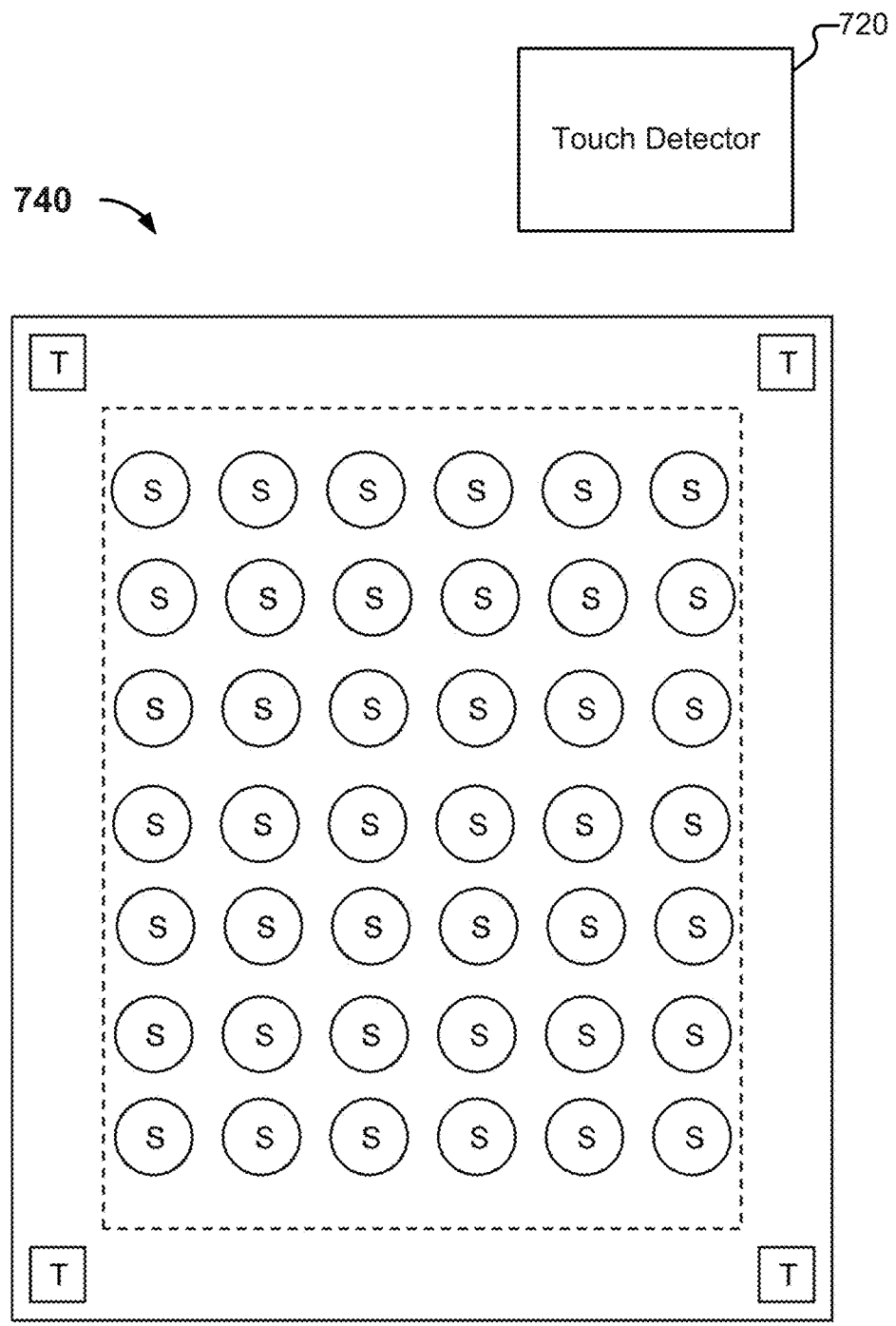
Figure 7D:
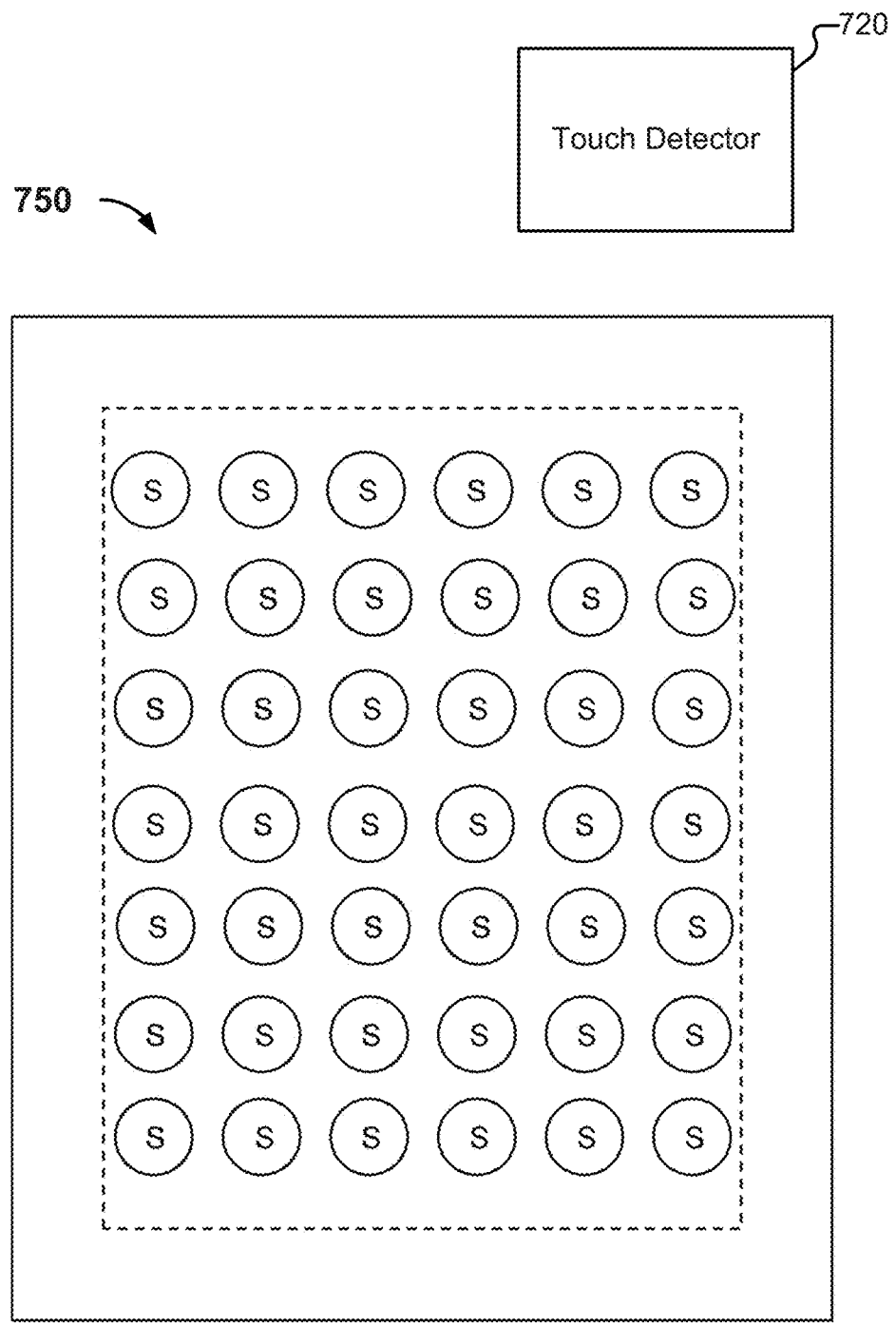

FIGS. 7B-7D show different embodiments of transmitter and sensor component arrangements utilized to detect a touch input along a surface area (e.g., to detect touch input on a touchscreen display). For example FIGS. 7B-7D show different arrangements of the transmitters and sensors shown in FIG. 7A. In various embodiments, at least a portion of the transmitter and sensor components shown in FIGS. 7B-7D are connected to touch detector 720. Connections between transmitter and sensor components in FIGS. 7B-7D and touch detector 720 have not been shown in FIGS. 7B-7D. Other components (e.g., application system 722) connected to touch detector 720 also have not been shown in FIGS. 7B-7D. Components are not drawn to scale. A piezoelectric transmitter is shown as a box labeled with a "T." A piezoelectric sensor is shown as a box labeled with an "S." A piezoresistive sensor is shown as a circle labeled with an "S." In some embodiments, the shown piezoelectric transmitters and sensors are coupled to an inside surface border of a glass cover of a touchscreen display. In some embodiments, the shown piezoresistive sensors are coupled behind a display panel (e.g., behind LED/OLED panel). The number of transmitters and sensors shown in FIGS. 7B-7D are merely an example and any number of any type of transmitters and sensors may exist in various embodiments.

In some embodiments, a device includes one or more piezoelectric transmitters and one or more piezoelectric receivers/sensors to detect touch input location (e.g., coupled to the glass of the touch screen, coupled to side of metal housing of a device to detect touch input location on device side, etc.) as well as an array of piezoresistive sensors to detect touch input force/pressure (e.g., array of piezoresistive sensors coupled behind LED/OLED display panel to detect magnitude of deformation of the panel due to touch input, or one or more piezoresistive sensors coupled to the inside of a device housing to detect grip force, etc.). Transmitter and sensor arrangement 730 shown in FIG. 7B includes piezoelectric transmitters/sensors around a border area of a propagating/touch input medium and an array of piezoresistive sensors.

In some embodiments, given the increased piezoresistive sensor sensitivity using the improvements described herein, one or more piezoresistive sensors are utilized to receive/detect propagated ultrasonic touch input medium signals for touch input location detection. The same piezoresistive sensors may also be used to detect physical disturbance magnitude as well. For example, an output signal from the piezoresistive sensor is first analyzed and correlated with its input supply voltage signal to detect the physical disturbance magnitude (e.g., using the process of FIG. 6), then when the propagated ultrasonic signal is detected after propagation through the touch input medium, the output signal (e.g., delayed signal) from the piezoresistive sensor is analyzed and correlated with an expected baseline propagated signal to detect a propagation delay caused by the touch input in determining the associated touch input location (e.g., using the process of FIG. 10 and/or FIG. 16). Thus the same output signal from a piezoresistive sensor can be used to both detect touch force and touch location (e.g., by the same signal processing component: touch detector 720). Example sensor configurations for devices including piezoelectric transmitters and piezoresistive sensors without piezoelectric sensors are shown in arrangement 740 of FIG. 7C.

In some embodiments, piezoresistive sensors are utilized to detect a touch input location without a use of piezoelectric transmitters. For example, given an array of piezoresistive sensors, a location of a touch input is triangulated based on the detected physical disturbance magnitudes and the relative locations of the sensors that detected the various magnitudes (e.g., using a matched filter). Example sensor configurations for devices including piezoresistive sensors without piezoelectric transmitters are shown in arrangement 750 of FIG. 7D.

In some embodiments, data from piezoelectric transmitters/sensors and data from piezoresistive sensors are used to complement and augment each other. A touch input location information detected using piezoelectric transmitters/sensors may be used to cross qualify physical disturbance magnitude information from piezoresistive sensors. For example, when it is detected (using piezoresistive sensor data) that a touch input is being provided with low force, pressure, strain, etc. (e.g., user is wearing a glove that absorbs force), a piezoelectric transmitter gain and/or sensor sensitivity is increased to enable better touch input location detection. In another example, if a sufficient physical disturbance magnitude is detected but a touch input location is not detected (or touch input location is detected in a specific signature pattern), then it may be concluded that the detected input is a result of device bending (e.g., in a pocket) rather than as a result of an intended user interaction.

Figure 8:
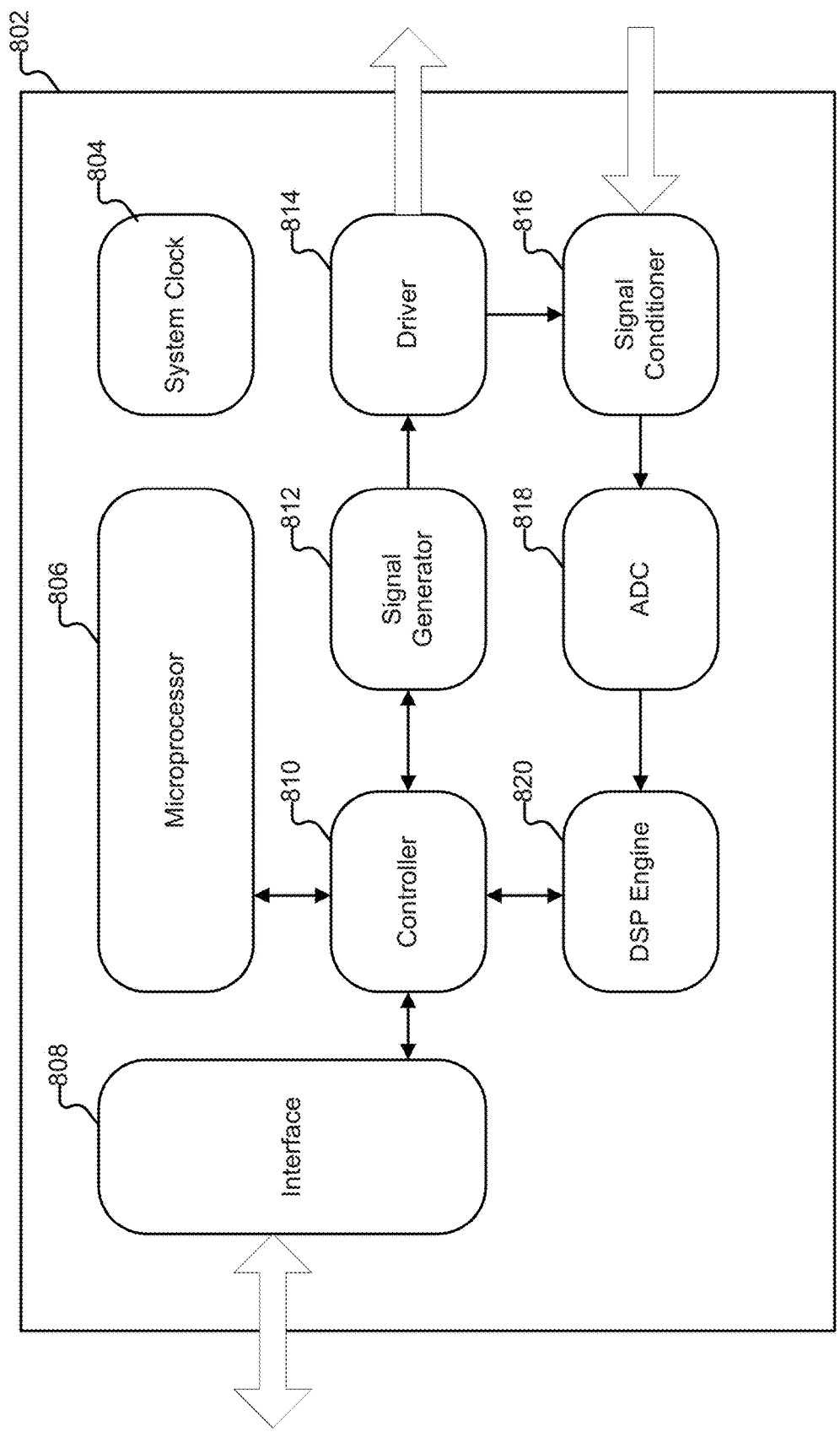
FIG. 8 is a block diagram illustrating an embodiment of a system for detecting a touch input.

FIG. 8 is a block diagram illustrating an embodiment of a system for detecting a touch input. In some embodiments, touch detector 802 is included in touch detector 720 of FIGS. 7A-7D. In some embodiments, the system of FIG. 8 is integrated in an integrated circuit chip. In some embodiments, signal processor component 410 of FIG. 4 and/or signal processor component 510 of FIG. 5 includes touch detector 802. For example, touch detector 802 shows the components of the transmitter/receiver included in signal processor component 410 and/or 510. In some embodiments, touch detector 802 is utilized as signal processor component 410 and/or 510.

Touch detector 802 includes system clock 804 that provides a synchronous system time source to one or more other components of detector 802. Controller 810 controls data flow and/or commands between microprocessor 806, interface 808, DSP engine 820, and signal generator 812. In some embodiments, microprocessor 806 processes instructions and/or calculations that can be used to program software/firmware and/or process data of detector 802. In some embodiments, a memory is coupled to microprocessor 806 and is configured to provide microprocessor 806 with instructions.

Signal generator 812 generates signals to be used to propagate signals such as signals propagated by transmitters 704, 706, 708, and 710 of FIG. 7A. For example, signal generator 812 generates pseudorandom binary sequence signals that are converted from digital to analog signals. Different signals (e.g., a different signal for each transmitter) may be generated by signal generator 812 by varying a phase of the signals (e.g., code division multiplexing), a frequency range of the signals (e.g., frequency division multiplexing), or a timing of the signals (e.g., time division multiplexing). In some embodiments, spectral control (e.g., signal frequency range control) of the signal generated by signal generator 812 is performed. For example, microprocessor 806, DSP engine 820, and/or signal generator 812 determines a windowing function and/or amplitude modulation to be utilized to control the frequencies of the signal generated by signal generator 812. Examples of the windowing function include a Hanning window and raised cosine window. Examples of the amplitude modulation include signal sideband modulation and vestigial sideband modulation. In some embodiments, the determined windowing function may be utilized by signal generator 812 to generate a signal to be modulated to a carrier frequency. The carrier frequency may be selected such that the transmitted signal is an ultrasonic signal. For example, the transmitted signal to be propagated through a propagating medium is desired to be an ultrasonic signal to minimize undesired interference with sonic noise and minimize excitation of undesired propagation modes of the propagating medium. The modulation of the signal may be performed using a type of amplitude modulation such as signal sideband modulation and vestigial sideband modulation to perform spectral of the signal. The modulation may be performed by signal generator 812 and/or driver 814. Driver 814 receives the signal from generator 812 and drives one or more transmitters, such as transmitters shown in FIGS. 7A-7C, to propagate signals through a medium.

A signal detected from a sensor such as a sensor shown in FIGS. 7A-7D is received by detector 802 and signal conditioner 816 conditions (e.g., filters) the received analog signal for further processing. For example, signal conditioner 816 receives the signal outputted by driver 814 and performs echo cancellation of the signal received by signal conditioner 816. The conditioned signal is converted to a digital signal by analog-to-digital converter 818. The converted signal is processed by digital signal processor engine 820. For example, DSP engine 820 separates components corresponding to different signals propagated by different transmitters from the received signal and each component is correlated against a reference signal. The result of the correlation may be used by microprocessor 806 to determine a location associated with a user touch input. For example, microprocessor 806 compares relative differences of disturbances detected in signals originating from different transmitters and/or received at different receivers/sensors to determine the location.

In some embodiments, DSP engine 820 correlates the converted signal against a reference signal to determine a time domain signal that represents a time delay caused by a touch input on a propagated signal. In some embodiments, DSP engine 820 performs dispersion compensation. For example, the time delay signal that results from correlation is compensated for dispersion in the touch input surface medium and translated to a spatial domain signal that represents a physical distance traveled by the propagated signal disturbed by the touch input. In some embodiments, DSP engine 820 performs base pulse correlation. For example, the spatial domain signal is filtered using a match filter to reduce noise in the signal. A result of DSP engine 820 may be used by microprocessor 806 to determine a location associated with a user touch input. For example, microprocessor 806 determines a hypothesis location where a touch input may have been received and calculates an expected signal that is expected to be generated if a touch input was received at the hypothesis location and the expected signal is compared with a result of DSP engine 820 to determine whether a touch input was provided at the hypothesis location.

Interface 808 provides an interface for microprocessor 806 and controller 810 that allows an external component to access and/or control detector 802. For example, interface 808 allows detector 802 to communicate with application system 722 of FIG. 7A and provides the application system with location information associated with a user touch input (e.g., location, force, etc.).

Figure 9:
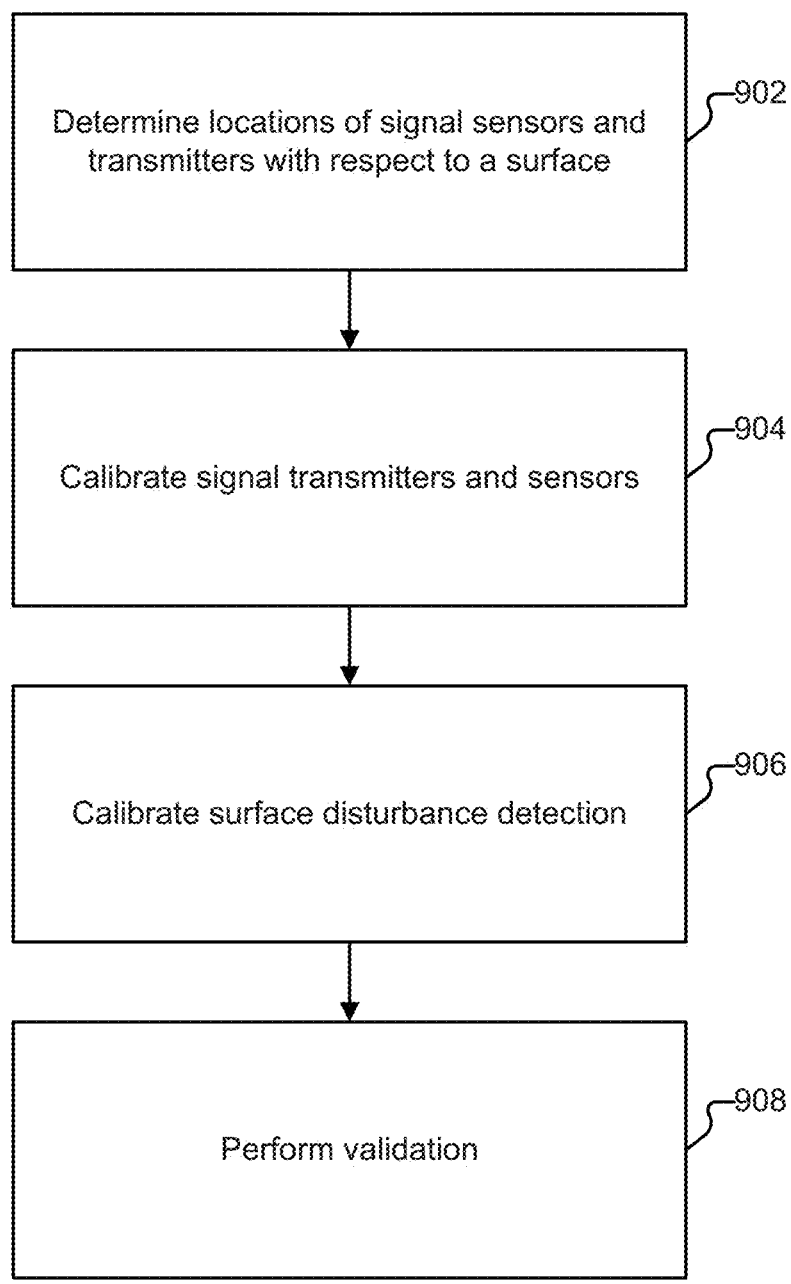
FIG. 9 is a flow chart illustrating an embodiment of a process for calibrating and validating touch detection.

FIG. 9 is a flow chart illustrating an embodiment of a process for calibrating and validating touch detection. In some embodiments, the process of FIG. 9 is used at least in part to calibrate and validate the system of FIGS. 7A-7D and/or the system of FIG. 8. At 902, locations of signal transmitters and sensors with respect to a surface are determined. For example, locations of transmitters and sensors shown in FIGS. 7A-7D are determined with respect to their location on a surface of medium 702. In some embodiments, determining the locations includes receiving location information. In various embodiments, one or more of the locations may be fixed and/or variable.

At 904, signal transmitters and sensors are calibrated. In some embodiments, calibrating the transmitter includes calibrating a characteristic of a signal driver and/or transmitter (e.g., strength). In some embodiments, calibrating the sensor includes calibrating a characteristic of a sensor (e.g., sensitivity). In some embodiments, the calibration of 904 is performed to optimize the coverage and improve signal-to-noise transmission/detection of a signal (e.g., acoustic or ultrasonic) to be propagated through a medium and/or a disturbance to be detected. For example, one or more components of the system of FIGS. 7A-7D and/or the system of FIG. 8 are tuned to meet a signal-to-noise requirement. In some embodiments, the calibration of 904 depends on the size and type of a transmission/propagation medium and geometric configuration of the transmitters/sensors. In some embodiments, the calibration of step 904 includes detecting a failure or aging of a transmitter or sensor. In some embodiments, the calibration of step 904 includes cycling the transmitter and/or receiver. For example, to increase the stability and reliability of a piezoelectric transmitter and/or receiver, a burn-in cycle is performed using a burn-in signal. In some embodiments, the step of 904 includes configuring at least one sensing device within a vicinity of a predetermined spatial region to capture an indication associated with a disturbance using the sensing device. The disturbance is caused in a selected portion of the input signal corresponding to a selection portion of the predetermined spatial region.

At 906, surface disturbance detection is calibrated. In some embodiments, a test signal is propagated through a medium such as medium 702 of FIG. 7A to determine an expected sensed signal when no disturbance has been applied. In some embodiments, a test signal is propagated through a medium to determine a sensed signal when one or more predetermined disturbances (e.g., predetermined touch) are applied at a predetermined location. Using the sensed signal, one or more components may be adjusted to calibrate the disturbance detection. In some embodiments, the test signal is used to determine a signal that can be later used to process/filter a detected signal disturbed by a touch input.

In some embodiments, data determined using one or more steps of FIG. 9 is used to determine data (e.g., formula, variable, coefficients, etc.) that can be used to calculate an expected signal that would result when a touch input is provided at a specific location on a touch input surface. For example, one or more predetermined test touch disturbances are applied at one or more specific locations on the touch input surface and a test propagating signal that has been disturbed by the test touch disturbance is used to determine the data (e.g., transmitter/sensor parameters) that is to be used to calculate an expected signal that would result when a touch input is provided at the one or more specific locations.

At 908, a validation of a touch detection system is performed. For example, the systems of FIGS. 7A-7D and/or FIG. 8 are tested using predetermined disturbance patterns to determine detection accuracy, detection resolution, multi-touch detection, and/or response time. If the validation fails, the process of FIG. 9 may be at least in part repeated and/or one or more components may be adjusted before performing another validation.

Figure 10:
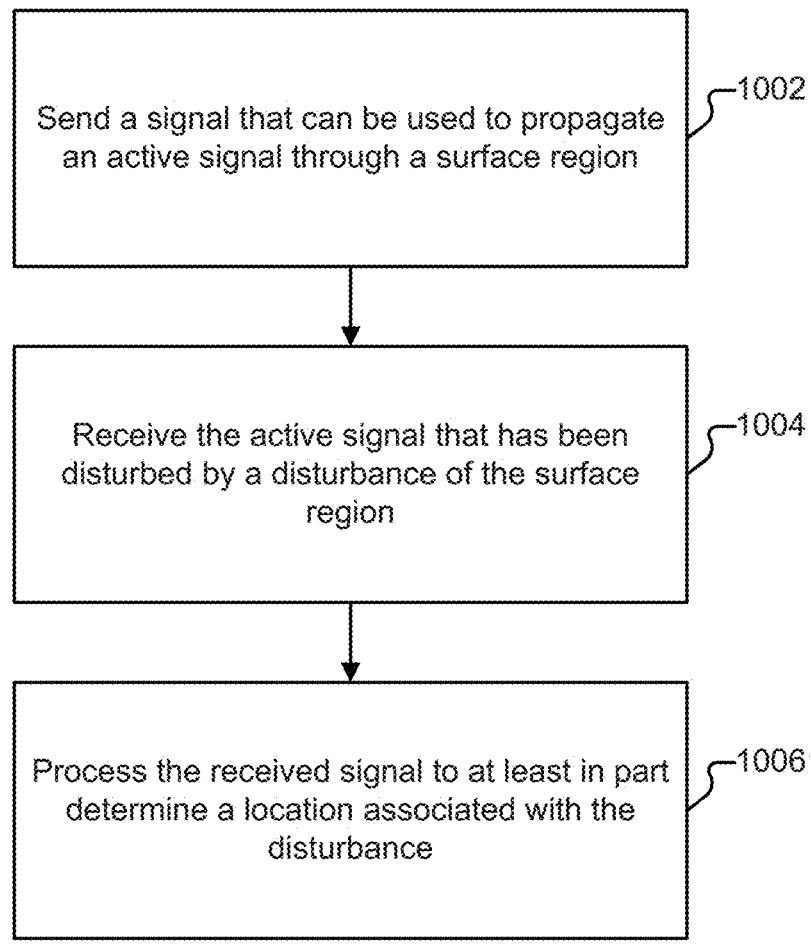
FIG. 10 is a flow chart illustrating an embodiment of a process for detecting a user touch input.

FIG. 10 is a flow chart illustrating an embodiment of a process for detecting a user touch input. In some embodiments, the process of FIG. 10 is at least in part implemented on touch detector 720 of FIGS. 7A-7D and/or touch detector 802 of FIG. 8.

At 1002, a signal that can be used to propagate an active signal through a surface region is sent. In some embodiments, sending the signal includes driving (e.g., using driver 814 of FIG. 8) a transmitter such as a transducer (e.g., transmitter 704 of FIG. 7A) to propagate an active signal (e.g., acoustic or ultrasonic) through a propagating medium with the surface region. In some embodiments, the signal includes a sequence selected to optimize autocorrelation (e.g., resulting in narrow/short peaks) of the signal. For example, the signal includes a Zadoff-Chu sequence. In some embodiments, the signal includes a pseudorandom binary sequence with or without modulation. In some embodiments, the propagated signal is an acoustic signal. In some embodiments, the propagated signal is an ultrasonic signal (e.g., outside the range of human hearing). For example, the propagated signal is a signal above 20 kHz (e.g., within the range between 80 kHz to 100 kHz). In other embodiments, the propagated signal may be within the range of human hearing. In some embodiments, by using the active signal, a user input on or near the surface region can be detected by detecting disturbances in the active signal when it is received by a sensor on the propagating medium. By using an active signal rather than merely listening passively for a user touch indication on the surface, other vibrations and disturbances that are not likely associated with a user touch indication can be more easily discerned/filtered out. In some embodiments, the active signal is used in addition to receiving a passive signal from a user input to determine the user input.

When attempting to propagate signal through a medium such as glass in order to detect touch inputs on the medium, the range of frequencies that may be utilized in the transmitted signal determines the bandwidth required for the signal as well as the propagation mode of the medium excited by the signal and noise of the signal.

With respect to bandwidth, if the signal includes more frequency components than necessary to achieve a desired function, then the signal is consuming more bandwidth than necessary, leading to wasted resource consumption and slower processing times.

With respect to the propagation modes of the medium, a propagation medium such as a glass likes to propagate a signal (e.g., an ultrasonic/sonic signal) in certain propagation modes. For example, in the A0 propagation mode of glass the propagated signal travels in waves up and down perpendicular to a surface of the glass (e.g., by bending the glass) whereas in the S0 propagation mode of glass the propagated signal travels in waves up and down parallel to the glass (e.g., by compressing and expanding the glass). A0 mode is desired over S0 mode in touch detection because a touch input contact on a glass surface disturbs the perpendicular bending wave of the A0 mode and the touch input does not significantly disturb the parallel compression waves of the S0 mode. The example glass medium has higher order propagation modes such as A1 mode and S1 mode that become excited with different frequencies of the propagated signals.

With respect to the noise of the signal, if the propagated signal is in the audio frequency range of humans, a human user would be able to hear the propagated signal and may detract from the user's user experience. If the propagated signal included frequency components that excited higher order propagation modes of the propagating medium, the signal may create undesirable noise within the propagating medium that makes detection of touch input disturbances of the propagated signal difficult to achieve.

In some embodiments, the sending the signal includes performing spectral control of the signal. In some embodiments, performing spectral control on the signal includes controlling the frequencies included in the signal. In order to perform spectral control, a windowing function (e.g., Hanning window, raised cosine window, etc.) and/or amplitude modulation (e.g., signal sideband modulation, vestigial sideband modulation, etc.) may be utilized. In some embodiments, spectral control is performed to attempt to only excite A0 propagation mode of the propagation medium. In some embodiments, spectral control is performed to limit the frequency range of the propagated signal to be within 50 kHz to 250 kHz.

In some embodiments, the sent signal includes a pseudorandom binary sequence. The binary sequence may be represented using a square pulse. However, modulated signal of the square pulse includes a wide range of frequency components due to the sharp square edges of the square pulse. In order to efficiently transmit the pseudorandom binary sequence, it is desirable to "smooth out" sharp edges of the binary sequence signal by utilizing a shaped pulse. A windowing function may be utilized to "smooth out" the sharp edges and reduce the frequency range of the signal. A windowing function such as Hanning window and/or raised cosine window may be utilized. In some embodiments, the type and/or one or more parameters of the windowing function is determined based at least in part on a property of a propagation medium such as medium 702 of FIG. 7A. For example, information about propagation modes and associated frequencies of the propagation medium is utilized to select the type and/or parameter(s) of the windowing function (e.g., to excite desired propagation mode and not excite undesired propagation mode). In some embodiments, a type of propagation medium is utilized to select the type and/or parameter(s) of the windowing function. In some embodiments, a dispersion coefficient, a size, a dimension, and/or a thickness of the propagation medium is utilized to select the type and/or parameter(s) of the windowing function. In some embodiments, a property of a transmitter is utilized to select the type and/or parameter(s) of the windowing function.

In some embodiments, sending the signal includes modulating (e.g., utilize amplitude modulation) the signal. For example, the desired baseband signal (e.g., a pseudorandom binary sequence signal) is desired to be transmitted at a carrier frequency (e.g., ultrasonic frequency). In this example, the amplitude of the signal at the carrier frequency may be varied to send the desired baseband signal (e.g., utilizing amplitude modulation). However, traditional amplitude modulation (e.g., utilizing double-sideband modulation) produces an output signal that has twice the frequency bandwidth of the original baseband signal. Transmitting this output signal consumes resources that otherwise do not have to be utilized. In some embodiments, single-sideband modulation is utilized. In some embodiments, in single-sideband modulation, the output signal utilizes half of the frequency bandwidth of double-sideband modulation by not utilizing a redundant second sideband included in the double-sideband modulated signal. In some embodiments, vestigial sideband modulation is utilized. For example, a portion of one of the redundant sidebands is effectively removed from a corresponding double-sideband modulated signal to form a vestigial sideband signal. In some embodiments, double-sideband modulation is utilized.

In some embodiments, sending the signal includes determining the signal to be transmitted by a transmitter such that the signal is distinguishable from other signal(s) transmitted by other transmitters. In some embodiments, sending the signal includes determining a phase of the signal to be transmitted (e.g., utilize code division multiplexing/CDMA). For example, an offset within a pseudorandom binary sequence to be transmitted is determined. In this example, each transmitter (e.g., transmitters 704, 706, 708, and 710 of FIG. 7A) transmits a signal with the same pseudorandom binary sequence but with a different phase/offset. The signal offset/phase difference between the signals transmitted by the transmitters may be equally spaced (e.g., 64-bit offset for each successive signal) or not equally spaced (e.g., different offset signals). The phase/offset between the signals may be selected such that it is long enough to reliably distinguish between different signals transmitted by different transmitters. In some embodiments, the signal is selected such that the signal is distinguishable from other signals transmitted and propagated through the medium. In some embodiments, the signal is selected such that the signal is orthogonal to other signals (e.g., each signal orthogonal to each other) transmitted and propagated through the medium.

In some embodiments, sending the signal includes determining a frequency of the signal to be transmitted (e.g., utilize frequency division multiplexing/FDMA). For example, a frequency range to be utilized for the signal is determined. In this example, each transmitter (e.g., transmitters of FIGS. 7A-7C) transmits a signal in a different frequency range as compared to signals transmitted by other transmitters. The range of frequencies that can be utilized by the signals transmitted by the transmitters is divided among the transmitters. In some cases if the range of frequencies that can be utilized by the signals is small, it may be difficult to transmit all of the desired different signals of all the transmitters. Thus the number of transmitters that can be utilized with frequency division multiplexing/FDMA may be smaller than can be utilized with code division multiplexing/CDMA.

In some embodiments, sending the signal includes determining a timing of the signal to be transmitted (e.g., utilize time division multiplexing/TDMA). For example, a time when the signal should be transmitted is determined. In this example, each transmitter (e.g., transmitters of FIGS. 7A-7C) transmits a signal in different time slots as compared to signals transmitted by other transmitters. This may allow the transmitters to transmit signals in a round-robin fashion such that only one transmitter is emitting/transmitting at one time. A delay period may be inserted between periods of transmission of different transmitters to allow the signal of the previous transmitter to sufficiently dissipate before transmitting a new signal of the next transmitter. In some cases, time division multiplexing/TDMA may be difficult to utilize in cases where fast detection of touch input is desired because time division multiplexing/TDMA slows down the speed of transmission/detection as compared to code division multiplexing/CDMA.

At 1004, the active signal that has been disturbed by a disturbance of the surface region is received. The disturbance may be associated with a user touch indication. In some embodiments, the disturbance causes the active signal that is propagating through a medium to be attenuated and/or delayed. In some embodiments, the disturbance in a selected portion of the active signal corresponds to a location on the surface that has been indicated (e.g., touched) by a user.

At 1006, the received signal is processed to at least in part determine a location associated with the disturbance. In some embodiments, determining the location includes extracting a desired signal from the received signal at least in part by removing or reducing undesired components of the received signal such as disturbances caused by extraneous noise and vibrations not useful in detecting a touch input. In some embodiments, components of the received signal associated with different signals of different transmitters are separated. For example, different signals originating from different transmitters are isolated from other signals of other transmitters for individual processing. In some embodiments, determining the location includes comparing at least a portion of the received signal (e.g., signal component from a single transmitter) to a reference signal (e.g., reference signal corresponding to the transmitter signal) that has not been affected by the disturbance. The result of the comparison may be used with a result of other comparisons performed using the reference signal and other signal(s) received at a plurality of sensors.

In some embodiments, receiving the received signal and processing the received signal are performed on a periodic interval. For example, the received signal is captured in 5 ms intervals and processed. In some embodiments, determining the location includes extracting a desired signal from the received signal at least in part by removing or reducing undesired components of the received signal such as disturbances caused by extraneous noise and vibrations not useful in detecting a touch input. In some embodiments, determining the location includes processing the received signal and comparing the processed received signal with a calculated expected signal associated with a hypothesis touch contact location to determine whether a touch contact was received at the hypothesis location of the calculated expected signal. Multiple comparisons may be performed with various expected signals associated with different hypothesis locations until the expected signal that best matches the processed received signal is found and the hypothesis location of the matched expected signal is identified as the touch contact location(s) of a touch input. For example, signals received by sensors (e.g., sensors of FIGS. 7A-7D) from various transmitters (e.g., transmitters of FIGS. 7A-7C) are compared with corresponding expected signals to determine a touch input location (e.g., single or multi-touch locations) that minimizes the overall difference between all respective received and expected signals.

The location, in some embodiments, is a location (e.g., a location coordinate) on the surface region where a user has provided a touch input. In addition to determining the location, one or more of the following information associated with the disturbance may be determined at 1006: a gesture, simultaneous user indications (e.g., multi-touch input), a time, a status, a direction, a velocity, a force magnitude, a proximity magnitude, a pressure, a size, and other measurable or derived information. In some embodiments, the location is not determined at 1006 if a location cannot be determined using the received signal and/or the disturbance is determined to be not associated with a user input. Information determined at 1006 may be provided and/or outputted.

Although FIG. 10 shows receiving and processing an active signal that has been disturbed, in some embodiments, a received signal has not been disturbed by a touch input and the received signal is processed to determine that a touch input has not been detected. An indication that a touch input has not been detected may be provided/outputted.

Figure 11:
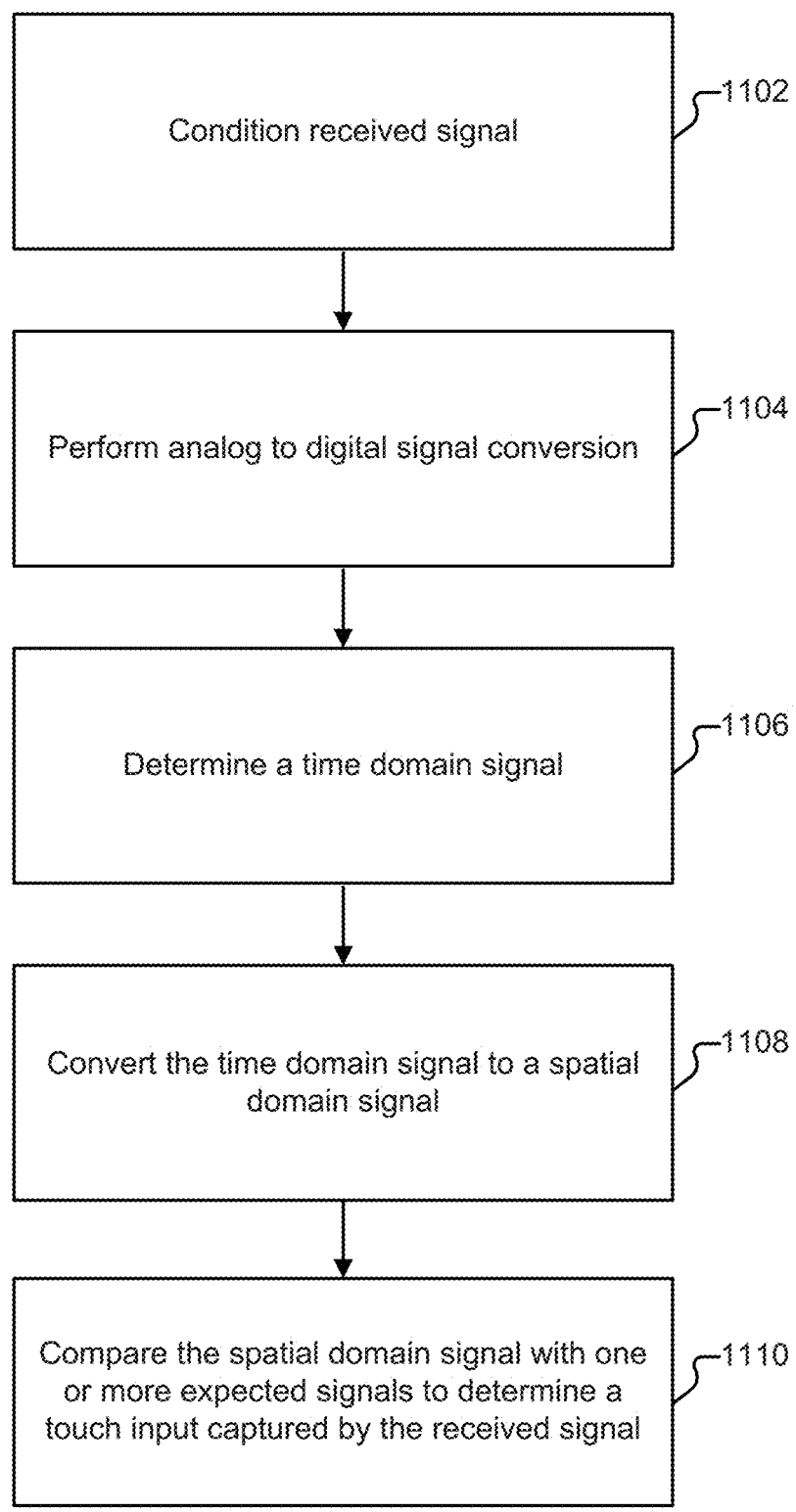
FIG. 11 is a flow chart illustrating an embodiment of a process for determining a location associated with a disturbance on a surface.

FIG. 11 is a flow chart illustrating an embodiment of a process for determining a location associated with a disturbance on a surface. In some embodiments, the process of FIG. 11 is included in 1006 of FIG. 10. The process of FIG. 11 may be implemented in touch detector 720 of FIGS. 7A-7D and/or touch detector 802 of FIG. 8. In some embodiments, at least a portion of the process of FIG. 11 is repeated for each combination of transmitter and sensor pair. For example, for each active signal transmitted by a transmitter (e.g., transmitted by transmitter of FIGS. 7A-7C), at least a portion of the process of FIG. 11 is repeated for each sensor (e.g., sensors of FIGS. 7A-7D) receiving the active signal. In some embodiments, the process of FIG. 11 is performed periodically (e.g., 5 ms periodic interval).

At 1102, a received signal is conditioned. In some embodiments, the received signal is a signal including a pseudorandom binary sequence that has been freely propagated through a medium with a surface that can be used to receive a user input. For example, the received signal is the signal that has been received at 1004 of FIG. 10. In some embodiments, conditioning the signal includes filtering or otherwise modifying the received signal to improve signal quality (e.g., signal-to-noise ratio) for detection of a pseudorandom binary sequence included in the received signal and/or user touch input. In some embodiments, conditioning the received signal includes filtering out from the signal extraneous noise and/or vibrations not likely associated with a user touch indication.

At 1104, an analog to digital signal conversion is performed on the signal that has been conditioned at 1102. In various embodiments, any number of standard analog to digital signal converters may be used.

At 1106, a time domain signal capturing a received signal time delay caused by a touch input disturbance is determined. In some embodiments, determining the time domain signal includes correlating the received signal (e.g., signal resulting from 1104) to locate a time offset in the converted signal (e.g., perform pseudorandom binary sequence deconvolution) where a signal portion that likely corresponds to a reference signal (e.g., reference pseudorandom binary sequence that has been transmitted through the medium) is located. For example, a result of the correlation can be plotted as a graph of time within the received and converted signal (e.g., time-lag between the signals) vs. a measure of similarity. In some embodiments, performing the correlation includes performing a plurality of correlations. For example, a coarse correlation is first performed then a second level of fine correlation is performed. In some embodiments, a baseline signal that has not been disturbed by a touch input disturbance is removed in the resulting time domain signal. For example, a baseline signal representing a measured signal (e.g., a baseline time domain signal) associated with a received active signal that has not been disturbed by a touch input disturbance is subtracted from a result of the correlation to further isolate effects of the touch input disturbance by removing components of the steady state baseline signal not affected by the touch input disturbance.

At 1108, the time domain signal is converted to a spatial domain signal. In some embodiments, converting the time domain signal includes converting the time domain signal determined at 1106 into a spatial domain signal that translates the time delay represented in the time domain signal to a distance traveled by the received signal in the propagating medium due to the touch input disturbance. For example, a time domain signal that can be graphed as time within the received and converted signal vs. a measure of similarity is converted to a spatial domain signal that can be graphed as distance traveled in the medium vs. the measure of similarity.

In some embodiments, performing the conversion includes performing dispersion compensation. For example, using a dispersion curve characterizing the propagating medium, time values of the time domain signal are translated to distance values in the spatial domain signal. In some embodiments, a resulting curve of the time domain signal representing a distance likely traveled by the received signal due to a touch input disturbance is narrower than the curve contained in the time domain signal representing the time delay likely caused by the touch input disturbance. In some embodiments, the time domain signal is filtered using a match filter to reduce undesired noise in the signal. For example, using a template signal that represents an ideal shape of a spatial domain signal, the converted spatial domain signal is match filtered (e.g., spatial domain signal correlated with the template signal) to reduce noise not contained in the bandwidth of the template signal. The template signal may be predetermined (e.g., determined at 906 of FIG. 9) by applying a sample touch input to a touch input surface and measuring a received signal.

At 1110, the spatial domain signal is compared with one or more expected signals to determine a touch input captured by the received signal. In some embodiments, comparing the spatial domain signal with the expected signal includes generating expected signals that would result if a touch contact was received at hypothesis locations. For example, a hypothesis set of one or more locations (e.g., single touch or multi-touch locations) where a touch input might have been received on a touch input surface is determined, and an expected spatial domain signal that would result at 1108 if touch contacts were received at the hypothesis set of location(s) is determined (e.g., determined for a specific transmitter and sensor pair using data measured at 906 of FIG. 9). The expected spatial domain signal may be compared with the actual spatial signal determined at 1108. The hypothesis set of one or more locations may be one of a plurality of hypothesis sets of locations (e.g., exhaustive set of possible touch contact locations on a coordinate grid dividing a touch input surface).

The proximity of location(s) of a hypothesis set to the actual touch contact location(s) captured by the received signal may be proportional to the degree of similarity between the expected signal of the hypothesis set and the spatial signal determined at 1108. In some embodiments, signals received by sensors (e.g., sensors of FIGS. 7A-7D) from transmitters (e.g., transmitters of FIGS. 7A-7C) are compared with corresponding expected signals for each sensor/transmitter pair to select a hypothesis set that minimizes the overall difference between all respective detected and expected signals. In some embodiments, once a hypothesis set is selected, another comparison between the determined spatial domain signals and one or more new expected signals associated with finer resolution hypothesis touch location(s) (e.g., locations on a new coordinate grid with more resolution than the coordinate grid used by the selected hypothesis set) near the location(s) of the selected hypothesis set is determined.

Figure 12:
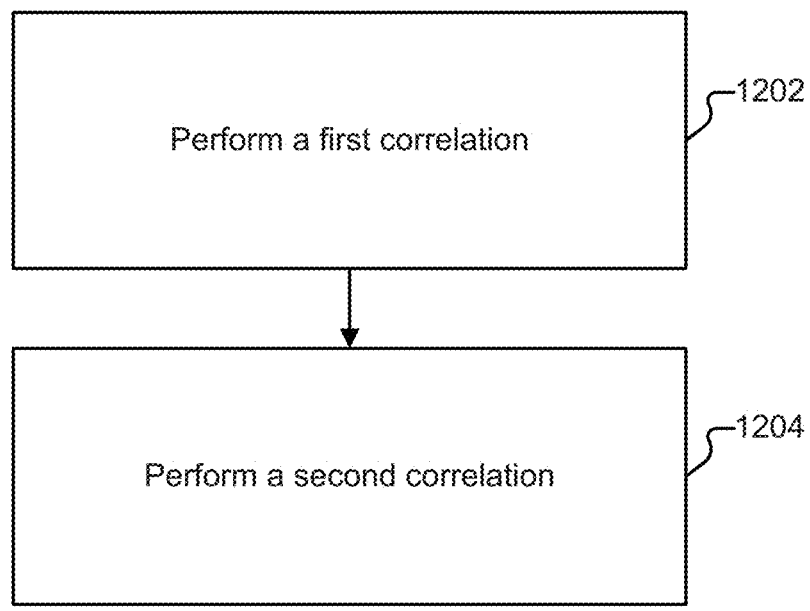
FIG. 12 is a flow chart illustrating an embodiment of a process for determining time domain signal capturing of a disturbance caused by a touch input.

FIG. 12 is a flow chart illustrating an embodiment of a process for determining time domain signal capturing of a disturbance caused by a touch input. In some embodiments, the process of FIG. 12 is included in 1106 of FIG. 11. The process of FIG. 12 may be implemented in touch detector 720 of FIGS. 7A-7D and/or touch detector 802 of FIG. 8.

At 1202, a first correlation is performed. In some embodiments, performing the first correlation includes correlating a received signal (e.g., resulting converted signal determined at 1104 of FIG. 11) with a reference signal. Performing the correlation includes cross-correlating or determining a convolution (e.g., interferometry) of the converted signal with a reference signal to measure the similarity of the two signals as a time-lag is applied to one of the signals. By performing the correlation, the location of a portion of the converted signal that most corresponds to the reference signal can be located. For example, a result of the correlation can be plotted as a graph of time within the received and converted signal (e.g., time-lag between the signals) vs. a measure of similarity. The associated time value of the largest value of the measure of similarity corresponds to the location where the two signals most correspond. By comparing this measured time value against a reference time value (e.g., at 906 of FIG. 9) not associated with a touch indication disturbance, a time delay/offset or phase difference caused on the received signal due to a disturbance caused by a touch input can be determined. In some embodiments, by measuring the amplitude/intensity difference of the received signal at the determined time vs. a reference signal, a force associated with a touch indication may be determined. In some embodiments, the reference signal is determined based at least in part on the signal that was propagated through a medium (e.g., based on a source pseudorandom binary sequence signal that was propagated). In some embodiments, the reference signal is at least in part determined using information determined during calibration at 906 of FIG. 9. The reference signal may be chosen so that calculations required to be performed during the correlation may be simplified. For example, the reference signal is a simplified reference signal that can be used to efficiently correlate the reference signal over a relatively large time difference (e.g., lag-time) between the received and converted signal and the reference signal.

At 1204, a second correlation is performed based on a result of the first correlation. Performing the second correlation includes correlating (e.g., cross-correlation or convolution similar to step 1202) a received signal (e.g., resulting converted signal determined at 1104 of FIG. 11) with a second reference signal. The second reference signal is a more complex/detailed (e.g., more computationally intensive) reference signal as compared to the first reference signal used in 1202. In some embodiments, the second correlation is performed because using the second reference signal in 1202 may be too computationally intensive for the time interval required to be correlated in 1202. Performing the second correlation based on the result of the first correlation includes using one or more time values determined as a result of the first correlation. For example, using a result of the first correlation, a range of likely time values (e.g., time-lag) that most correlate between the received signal and the first reference signal is determined and the second correlation is performed using the second reference signal only across the determined range of time values to fine tune and determine the time value that most corresponds to where the second reference signal (and, by association, also the first reference signal) matched the received signal. In various embodiments, the first and second correlations have been used to determine a portion within the received signal that corresponds to a disturbance caused by a touch input at a location on a surface of a propagating medium. In other embodiments, the second correlation is optional. For example, only a single correlation step is performed. Any number of levels of correlations may be performed in other embodiments.

Figure 13:
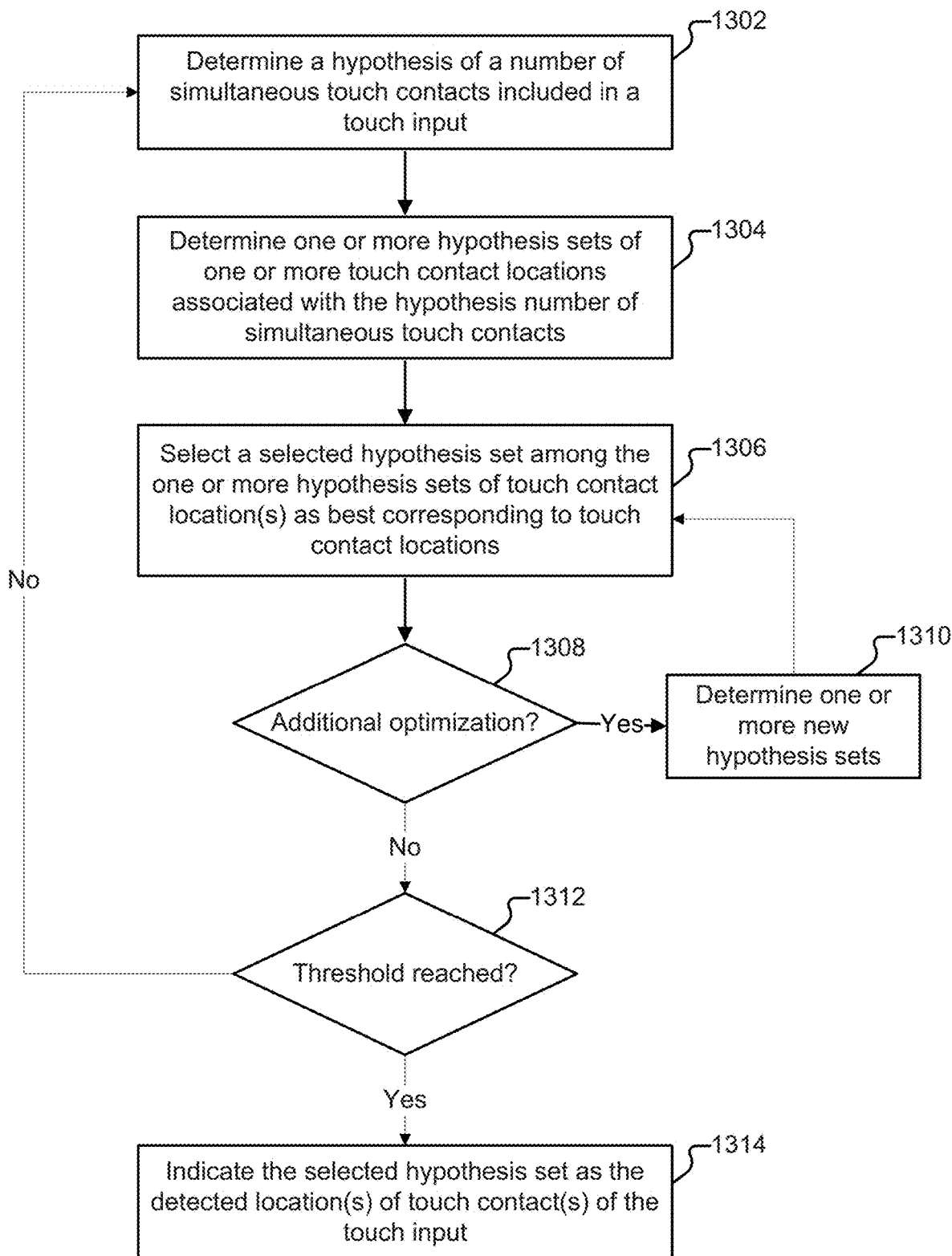
FIG. 13 is a flow chart illustrating an embodiment of a process comparing spatial domain signals with one or more expected signals to determine touch contact location(s) of a touch input.

FIG. 13 is a flow chart illustrating an embodiment of a process comparing spatial domain signals with one or more expected signals to determine touch contact location(s) of a touch input. In some embodiments, the process of FIG. 13 is included in 1110 of FIG. 11. The process of FIG. 13 may be implemented in touch detector 720 of FIGS. 7A-7D and/or touch detector 802 of FIG. 8.

At 1302, a hypothesis of a number of simultaneous touch contacts included in a touch input is determined. In some embodiments, when detecting a location of a touch contact, the number of simultaneous contacts being made to a touch input surface (e.g., surface of medium 702 of FIG. 7A) is desired to be determined. For example, it is desired to determine the number of fingers touching a touch input surface (e.g., single touch or multi-touch). In some embodiments, in order to determine the number of simultaneous touch contacts, the hypothesis number is determined and the hypothesis number is tested to determine whether the hypothesis number is correct. In some embodiments, the hypothesis number is initially determined as zero (e.g., associated with no touch input being provided). In some embodiments, determining the hypothesis number of simultaneous touch contacts includes initializing the hypothesis number to be a previously determined number of touch contacts. For example, a previous execution of the process of FIG. 13 determined that two touch contacts are being provided simultaneously and the hypothesis number is set as two. In some embodiments, determining the hypothesis number includes incrementing or decrementing a previously determined hypothesis number of touch contacts. For example, a previously determined hypothesis number is 2 and determining the hypothesis number includes incrementing the previously determined number and determining the hypothesis number as the incremented number (i.e., 3). In some embodiments, each time a new hypothesis number is determined, a previously determined hypothesis number is iteratively incremented and/or decremented unless a threshold maximum (e.g., 10) and/or threshold minimum (e.g., 0) value has been reached.

At 1304, one or more hypothesis sets of one or more touch contact locations associated with the hypothesis number of simultaneous touch contacts are determined. In some embodiments, it is desired to determine the coordinate locations of fingers touching a touch input surface. In some embodiments, in order to determine the touch contact locations, one or more hypothesis sets are determined on potential location(s) of touch contact(s) and each hypothesis set is tested to determine which hypothesis set is most consistent with a detected data.

In some embodiments, determining the hypothesis set of potential touch contact locations includes dividing a touch input surface into a constrained number of points (e.g., divide into a coordinate grid) where a touch contact may be detected. For example, in order to initially constrain the number of hypothesis sets to be tested, the touch input surface is divided into a coordinate grid with relatively large spacing between the possible coordinates. Each hypothesis set includes a number of location identifiers (e.g., location coordinates) that match the hypothesis number determined in 1302. For example, if two was determined to be the hypothesis number in 1302, each hypothesis set includes two location coordinates on the determined coordinate grid that correspond to potential locations of touch contacts of a received touch input. In some embodiments, determining the one or more hypothesis sets includes determining exhaustive hypothesis sets that exhaustively cover all possible touch contact location combinations on the determined coordinate grid for the determined hypothesis number of simultaneous touch contacts. In some embodiments, a previously determined touch contact location(s) of a previous determined touch input is initialized as the touch contact location(s) of a hypothesis set.

At 1306, a selected hypothesis set is selected among the one or more hypothesis sets of touch contact location(s) as best corresponding to touch contact locations captured by detected signal(s). In some embodiments, one or more propagated active signals (e.g., signal transmitted at 1002 of FIG. 10) that have been disturbed by a touch input on a touch input surface are received (e.g., received at 1004 of FIG. 10) by one or more sensors such as sensors of FIGS. 7A-7D. Each active signal transmitted from each transmitter (e.g., different active signals each transmitted by transmitters of FIGS. 7A-7C) is received by each sensor (e.g., sensors of FIGS. 7A-7D) and may be processed to determine a detected signal (e.g., spatial domain signal determined at 1108 of FIG. 11) that characterizes a signal disturbance caused by the touch input. In some embodiments, for each hypothesis set of touch contact location(s), an expected signal is determined for each signal expected to be received at one or more sensors. The expected signal may be determined using a predetermined function that utilizes one or more predetermined coefficients (e.g., coefficient determined for a specific sensor and/or transmitter transmitting a signal to be received at the sensor) and the corresponding hypothesis set of touch contact location(s). The expected signal(s) may be compared with corresponding detected signal(s) to determine an indicator of a difference between all the expected signal(s) for a specific hypothesis set and the corresponding detected signals. By comparing the indicators for each of the one or more hypothesis sets, the selected hypothesis set may be selected (e.g., hypothesis set with the smallest indicated difference is selected).

At 1308, it is determined whether additional optimization is to be performed. In some embodiments, determining whether additional optimization is to be performed includes determining whether any new hypothesis set(s) of touch contact location(s) should be analyzed in order to attempt to determine a better selected hypothesis set. For example, a first execution of step 1306 utilizes hypothesis sets determined using locations on a larger distance increment coordinate grid overlaid on a touch input surface and additional optimization is to be performed using new hypothesis sets that include locations from a coordinate grid with smaller distance increments. Additional optimizations may be performed any number of times. In some embodiments, the number of times additional optimizations are performed is predetermined. In some embodiments, the number of times additional optimizations are performed is dynamically determined. For example, additional optimizations are performed until a comparison threshold indicator value for the selected hypothesis set is reached and/or a comparison indicator for the selected hypothesis does not improve by a threshold amount. In some embodiments, for each optimization iteration, optimization may be performed for only a single touch contact location of the selected hypothesis set and other touch contact locations of the selected hypothesis may be optimized in a subsequent iteration of optimization.

If at 1308 it is determined that additional optimization should be performed, at 1310, one or more new hypothesis sets of one or more touch contact locations associated with the hypothesis number of the touch contacts are determined based on the selected hypothesis set. In some embodiments, determining the new hypothesis sets includes determining location points (e.g., more detailed resolution locations on a coordinate grid with smaller distance increments) near one of the touch contact locations of the selected hypothesis set in an attempt to refine the one of the touch contact locations of the selected hypothesis set. The new hypothesis sets may each include one of the newly determined location points, and the other touch contact location(s), if any, of a new hypothesis set may be the same locations as the previously selected hypothesis set. In some embodiments, the new hypothesis sets may attempt to refine all touch contact locations of the selected hypothesis set. The process proceeds back to 1306, whether or not a newly selected hypothesis set (e.g., if previously selected hypothesis set still best corresponds to detected signal(s), the previously selected hypothesis set is retained as the new selected hypothesis set) is selected among the newly determined hypothesis sets of touch contact location(s).

If at 1308 it is determined that additional optimization should not be performed, at 1312, it is determined whether a threshold has been reached. In some embodiments, determining whether a threshold has been reached includes determining whether the determined hypothesis number of contact points should be modified to test whether a different number of contact points has been received for the touch input. In some embodiments, determining whether the threshold has been reached includes determining whether a comparison threshold indicator value for the selected hypothesis set has been reached and/or a comparison indicator for the selected hypothesis did not improve by a threshold amount since a previous determination of a comparison indicator for a previously selected hypothesis set. In some embodiments, determining whether the threshold has been reached includes determining whether a threshold amount of energy still remains in a detected signal after accounting for the expected signal of the selected hypothesis set. For example, a threshold amount of energy still remains if an additional touch contact needs be included in the selected hypothesis set.

If at 1312, it is determined that the threshold has not been reached, the process continues to 1302 where a new hypothesis number of touch inputs is determined. The new hypothesis number may be based on the previous hypothesis number. For example, the previous hypothesis number is incremented by one as the new hypothesis number.

If at 1312, it is determined that the threshold has been reached, at 1314, the selected hypothesis set is indicated as the detected location(s) of touch contact(s) of the touch input. For example, a location coordinate(s) of a touch contact(s) is provided.

Figure 14:
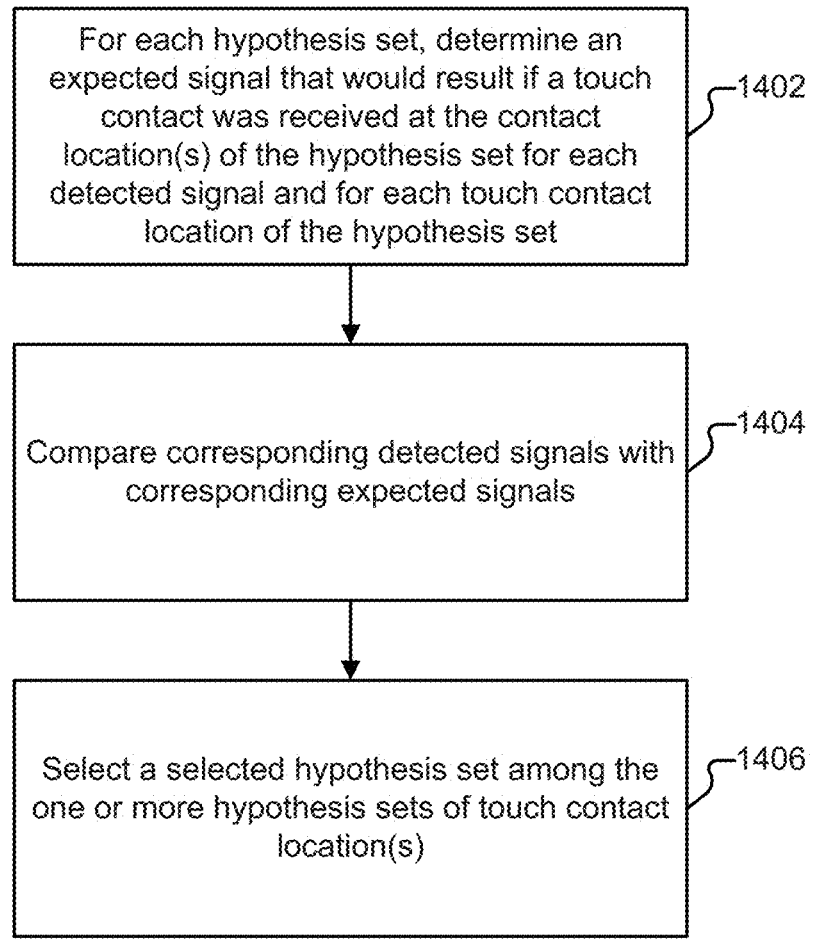
FIG. 14 is a flowchart illustrating an embodiment of a process for selecting a selected hypothesis set of touch contact location(s).

FIG. 14 is a flowchart illustrating an embodiment of a process for selecting a selected hypothesis set of touch contact location(s). In some embodiments, the process of FIG. 14 is included in 1306 of FIG. 13. The process of FIG. 14 may be implemented in touch detector 720 of FIGS. 7A-7D and/or touch detector 802 of FIG. 8.

At 1402, for each hypothesis set (e.g., determined at 1304 of FIG. 13), an expected signal that would result if a touch contact was received at the contact location(s) of the hypothesis set is determined for each detected signal and for each touch contact location of the hypothesis set. In some embodiments, determining the expected signal includes using a function and one or more function coefficients to generate/simulate the expected signal. The function and/or one or more function coefficients may be predetermined (e.g., determined at 906 of FIG. 9) and/or dynamically determined (e.g., determined based on one or more provided touch contact locations). In some embodiments, the function and/or one or more function coefficients may be determined/selected specifically for a particular transmitter and/or sensor of a detected signal. For example, the expected signal is to be compared to a detected signal and the expected signal is generated using a function coefficient determined specifically for the pair of transmitter and sensor of the detected signal. In some embodiments, the function and/or one or more function coefficients may be dynamically determined.

In some embodiments, in the event the hypothesis set includes more than one touch contact location (e.g., multi-touch input), expected signal for each individual touch contact location is determined separately and combined together. For example, an expected signal that would result if a touch contact was provided at a single touch contact location is added with other single touch contact expected signals (e.g., effects from multiple simultaneous touch contacts add linearly) to generate a single expected signal that would result if the touch contacts of the added signals were provided simultaneously.

In some embodiments, the expected signal for a single touch contact is modeled as the function:

$$C^*P(x-d)$$

where C is a function coefficient (e.g., complex coefficient) and P(x) is a function and d is the total path distance between a transmitter (e.g., transmitter of a signal desired to be simulated) to a touch input location and between the touch input location and a sensor (e.g., receiver of the signal desired to be simulated).

In some embodiments, the expected signal for one or more touch contacts is modeled as the function:

$$\Sigma_{j=1}^{N} C_j P(x-d_j)$$

where j indicates which touch contact and N is the number of total simultaneous touch contacts being modeled (e.g., hypothesis number determined at 1302 of FIG. 13).

At 1404, corresponding detected signals are compared with corresponding expected signals. In some embodiments, the detected signals include spatial domain signals determined at 1108 of FIG. 11. In some embodiments, comparing the signals includes determining a mean square error between the signals. In some embodiments, comparing the signals includes determining a cost function that indicates the similarity/difference between the signals. In some embodiments, the cost function for a hypothesis set (e.g., hypothesis set determined at 1304 of FIG. 13) analyzed for a single transmitter/sensor pair is modeled as:

$$\varepsilon(r_x, t_x) = |q(x) - \Sigma_{j=1}^{N} C_j P(x-d_j)|^2$$

where $\varepsilon(r_x, t_x)$ is the cost function, $q(x)$ is the detected signal, and $\Sigma_{j=1}^{N} C_j P(x-d_j)$ is the expected signal. In some embodiments, the global cost function for a hypothesis set analyzed for more than one (e.g., all) transmitter/sensor pairs is modeled as:

$$\varepsilon = \Sigma_{i=1}^{Z} \varepsilon(r_x, t_x)_i$$

where $\varepsilon$ is the global cost function, Z is the number of total transmitter/sensor pairs, i indicates the particular transmitter/sensor pair, and $\varepsilon(r_x, t_x)_i$ is the cost function of the particular transmitter/sensor pair.

At 1406, a selected hypothesis set of touch contact location(s) is selected among the one or more hypothesis sets of touch contact location(s) as best corresponding to detected signal(s). In some embodiments, the selected hypothesis set is selected among hypothesis sets determined at 1304 or 1310 of FIG. 13. In some embodiments, selecting the selected hypothesis set includes determining the global cost function (e.g., function ε described above) for each hypothesis set in the group of hypothesis sets and selecting the hypothesis set that results in the smallest global cost function value.

Figure 15A:
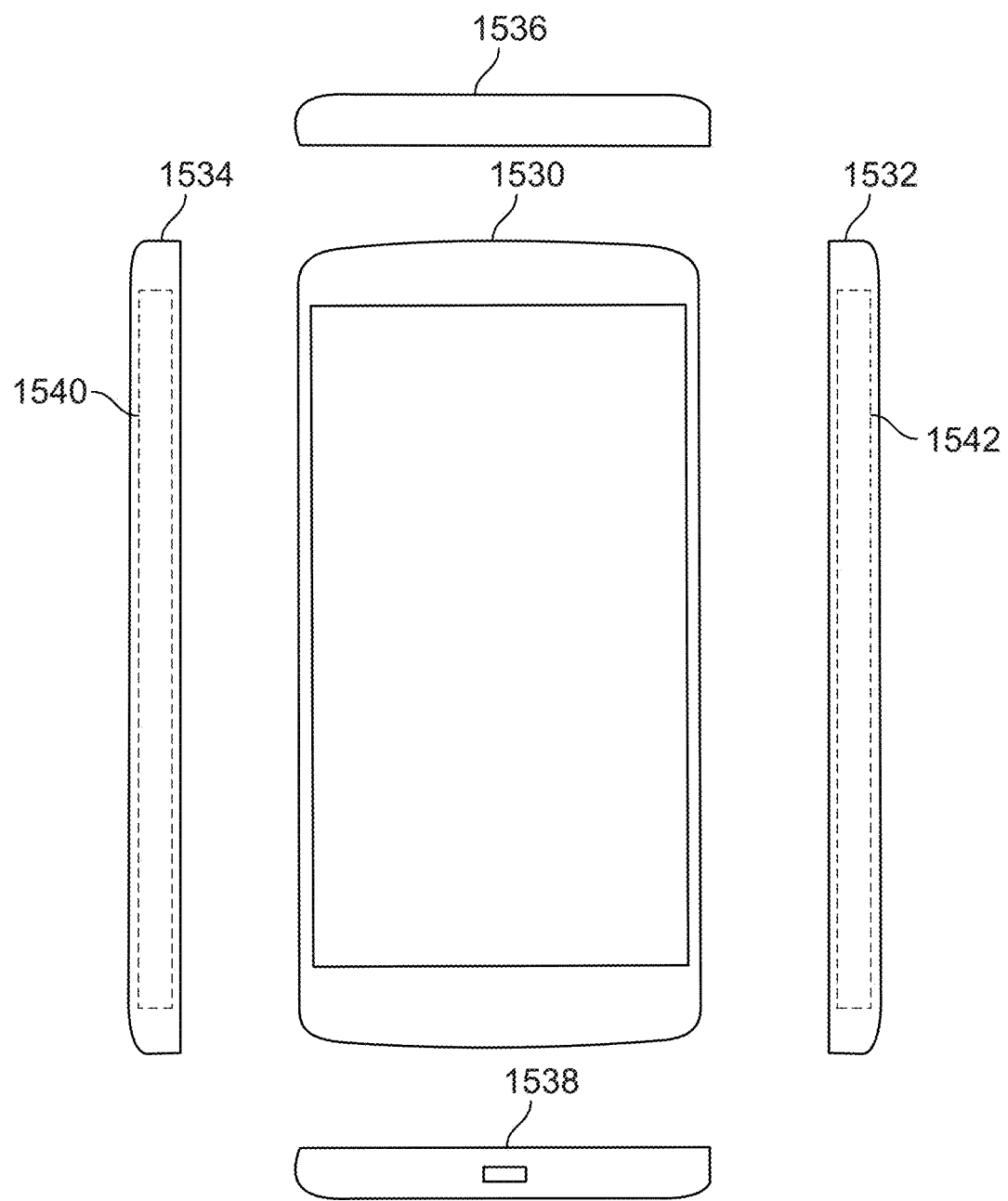
FIG. 15A is a diagram illustrating different views of a device with touch input enabled housing.

FIG. 15A is a diagram illustrating different views of a device with touch input enabled housing. Front view 1530 of the device shows a front display surface of the device. Left side view 1534 of the device shows an example touch input external surface region 1540 on a sidewall of the device where a touch input is able to be detected. For example, a location and a force of a user touch input are able to be detected in region 1540 by detecting disturbances to transmitted signals in region 1540. By touch enabling the side of the device, one or more functions traditionally served by physical buttons are able to be provided without the use of physical buttons. For example, volume control inputs are able to be detected on the side without the use of physical volume control buttons. Right side view 1532 of the device shows touch input external surface region 1542 on another sidewall of the device where a user touch input can be detected. Although regions 1540 and 1542 have been shown as smooth regions, in various other embodiments one or more physical buttons, ports, and/or openings (e.g., SIM/memory card tray) may exist, or the region can be textured to provide an indication of the sensing region. Touch input detection may be provided over surfaces of physical buttons, trays, flaps, switches, etc. by detecting transmitted signal disturbances to allow touch input detection without requiring detection of physical movement/deflection of a component of the device (e.g., detect finger swiping over a surface of a physical button). In some embodiments, the touch input regions on the sides may be divided into different regions that correspond to different functions. The touch input provided in region 1540 (and likewise in region 1542) is detected along a one-dimensional axis. For example, a touch location is detected as a position on its lengthwise axis without differentiating the width of the object touching the sensing region. In an alternative embodiment, the width of the object touching the sensing region is also detected. Regions 1540 and 1542 correspond to regions beneath which touch input transmitters and sensors are located. Although two touch input regions on the housing of the device have been shown in FIG. 15A, other touch input regions on the housing may exist in various other embodiments. For example, surfaces on top (e.g., surface on top view 1536) and/or bottom (e.g., surface on bottom view 1538) of the device are touch input enabled. The shapes of touch input surfaces/regions on device sidewalls (e.g., regions 1540 and 1542) may be at least in part flat, at least in part curved, at least in part angular, at least in part textured, and/or any combination thereof.

Figure 15B:
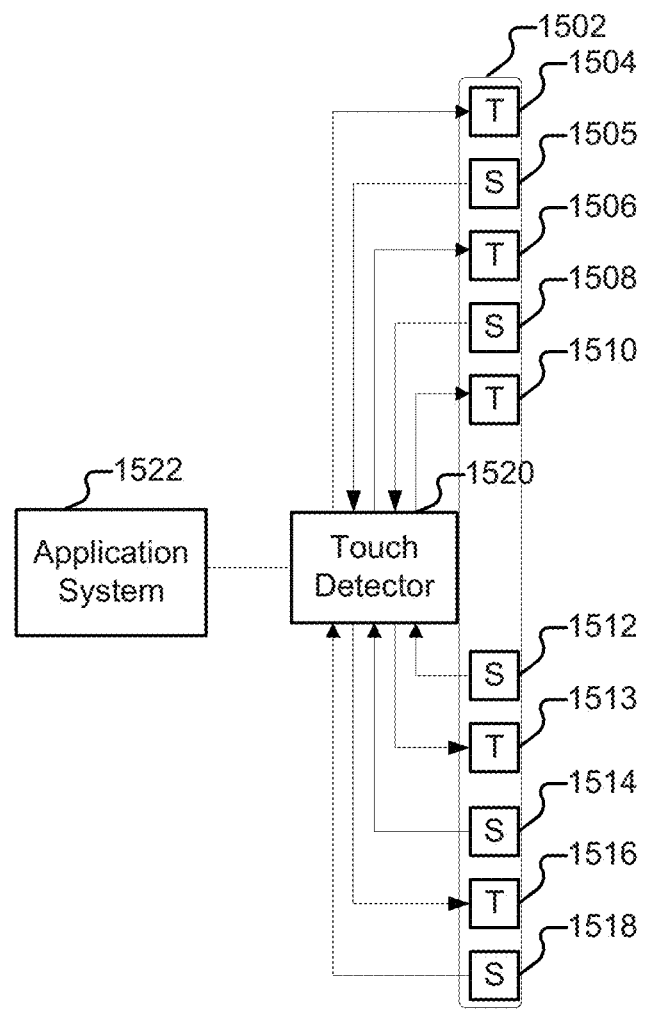
FIG. 15B is a block diagram illustrating an embodiment of a system for detecting a touch input surface disturbance.

FIG. 15B is a block diagram illustrating an embodiment of a system for detecting a touch input surface disturbance. In some embodiments, the system shown in FIG. 15B is included in the device shown in FIG. 15A. For example, FIG. 15B shows components utilized to detect a touch input on a sidewall external surface 1540 of FIG. 15A. In some embodiments, the system shown in FIG. 15B is included in a computing device, an entertainment device, a smartphone, a tablet computer, a point of sale terminal, a food and restaurant apparatus, a gaming device, a casino game application, a piece of furniture, a vehicle, an industrial application, a financial application, a medical device, an appliance, and any other objects or devices having a touch input surface. Propagating signal medium 1502 is coupled to transmitters 1504, 1513, 1506, 1516, and 1510 and receivers/sensors 1505, 1508, 1512, 1514, and 1518. The locations where transmitters 1504, 1513, 1506, 1516, and 1510 and sensors 1505, 1508, 1512, 1514, and 1518 are located with respect to propagating signal medium 1502 and with respect to each other, as shown in FIG. 15B, are merely an example. Likewise, the number of transmitters and receivers need not be equal. In some embodiments, propagating signal medium 1502 is a part of a housing of a device. For example, the transmitter and receivers are coupled to a sidewall of a housing of a smartphone device to detect touch inputs on the side of the device. In some embodiments, the shown portion of propagating signal medium 1502 corresponds to touch input region 1540 of FIG. 15A. For example, the shown elongated region of medium 1502 corresponds to a region of a side of a smartphone device where touch input is able to be provided.

Other configurations of transmitter and sensor locations may exist in various embodiments. Although FIG. 15B shows alternating transmitters and receivers arranged inline, locations of transmitters and sensors may be intertwined and spaced and arranged in any configuration in various other embodiments. The gap between transmitter 1510 and sensor 1512 may correspond to a location where a SIM/memory card opening is to be located. Any number of transmitters and/or sensors may be utilized in various embodiments. In some embodiments, rather than using a dedicated transmitter and a dedicated sensor, a transducer that acts as both a transmitter and a sensor is utilized. In various embodiments, the propagating medium includes one or more of the following materials: polymer, plastic, wood, steel, metal and any medium that is able to propagate an acoustic or ultrasonic signal. For example, medium 1502 is a portion of a metal sidewall/side-edge of a smartphone or a tablet computer device where a user is to hold the device. FIG. 15B only shows transmitters and sensors for one side of a device as an example and another set of transmitters and sensors may be placed on another side of the device to detect inputs on this other side of the device (e.g., also connected to touch detector 1520). Objects of FIG. 15B are not drawn to scale.

Medium 1502 includes a surface area where a user may touch to provide a command input. In various embodiments, the touch input surface of medium 1502 is flat, curved, or combinations thereof. The touch input is to be detected along a lengthwise region (e.g., locations in the region to be only identified along a one-dimensional axis). A one-dimensional location and a force of a touch input along an external sidewall surface of the device may be detected without actuation of a physical button or use of any other sensor that requires a physical deflection/movement of a component of the device. For example, a user provides an input on the external surface of medium 1502 that covers the shown transmitters and receivers that are mounted on an opposite internal surface/side of medium 1502 (e.g., mounted on an internal side of device sidewall inside a device and the touch input is provided on the other side of the device sidewall that is the external surface of the device sidewall) and the input disturbs a transmitted signal traveling within medium 1502 (e.g., by at least one of the shown transmitters) that is detected (e.g., by at least one of the shown sensors) and analyzed to identify a location on the external surface of medium 1502 where the input was provided. This allows virtual buttons to be provided on a smooth side surface and an indication of a virtual button press is detected when a user applies pressure of sufficient force at a specific location of a virtual button on the side surface region. In some embodiments, a length of the axis where a touch input is able to be detected starts from an external surface over a mounting location of transmitter 1504 to an external surface over a mounting location of sensor 1518.

Examples of transmitters 1504, 1506, 1510, 1513, and 1516 include piezoelectric transducers, piezoresistive elements/transmitters, electromagnetic transducers, transmitters, sensors, and/or any other transmitters and transducers capable of propagating a signal through medium 1502. Examples of sensors 1505, 1508, 1512, 1514, and 1518 include piezoelectric transducers, piezoresistive sensors/receivers, electromagnetic transducers, laser vibrometer transmitters, and/or any other sensors and transducers capable of detecting a signal on medium 1502. Although five transmitters and five sensors are shown, any number of transmitters and any number of sensors may be used in other embodiments. In the example shown, transmitters 1504, 1506, 1510, 1513, and 1516 each may propagate a signal through medium 1502. A signal emitted by a transmitter is distinguishable from another signal emitted by another transmitter. In order to distinguish the signals, a phase of the signals (e.g., code division multiplexing), a frequency range of the signals (e.g., frequency division multiplexing), or a timing of the signals (e.g., time division multiplexing) may be varied. One or more of sensors 1505, 1508, 1512, 1514, and 1518 receive the propagated signals.

Touch detector 1520 (e.g., included and mounted on an internal circuit board) is connected to at least the transmitters and sensors shown in FIG. 15B. In some embodiments, detector 1520 includes one or more of the following: an integrated circuit chip, a printed circuit board, a processor, and other electrical components and connectors. Detector 1520 determines and sends signals to be propagated by transmitters 1504, 1506, 1510, 1513, and 1516. Detector 1520 also receives the signals detected by sensors 1505, 1508, 1512, 1514, and 1518. The received signals are processed by detector 1520 to determine whether a disturbance associated with a user input has been detected at a location on a surface of medium 1502 associated with the disturbance. Detector 1520 is in communication with application system 1522. Application system 1522 uses information provided by detector 1520. For example, application system 1522 receives from detector 1520 a location identifier and a force identifier associated with a user touch input that is used by application system 1522 to control configuration, setting or function of a device, operating system and/or application of application system 1522. For example, a user indication to increase volume is detected when a touch input of sufficient pressure is detected within one range of locations along a one-dimensional axis, while a user indication to decrease volume is detected when an input of sufficient pressure is detected within another range of locations. Such regions can be fixed, or can be defined in software. For example, a right-handed user could have a region to change volume assigned to the detection region on the left side of the case, whereas a left-handed user could reverse this assignment.

In some embodiments, application system 1522 includes a processor and/or memory/storage. In other embodiments, detector 1520 and application system 1522 are at least in part included/processed in a single processor. An example of data provided by detector 1520 to application system 1522 includes one or more of the following associated with a user indication: a location coordinate along a one-dimensional axis, a gesture, simultaneous user indications (e.g., multi-touch input), a time, a status, a direction, a velocity, a force magnitude, a proximity magnitude, a pressure, a size, and other measurable or derived information.

Figure 15C:
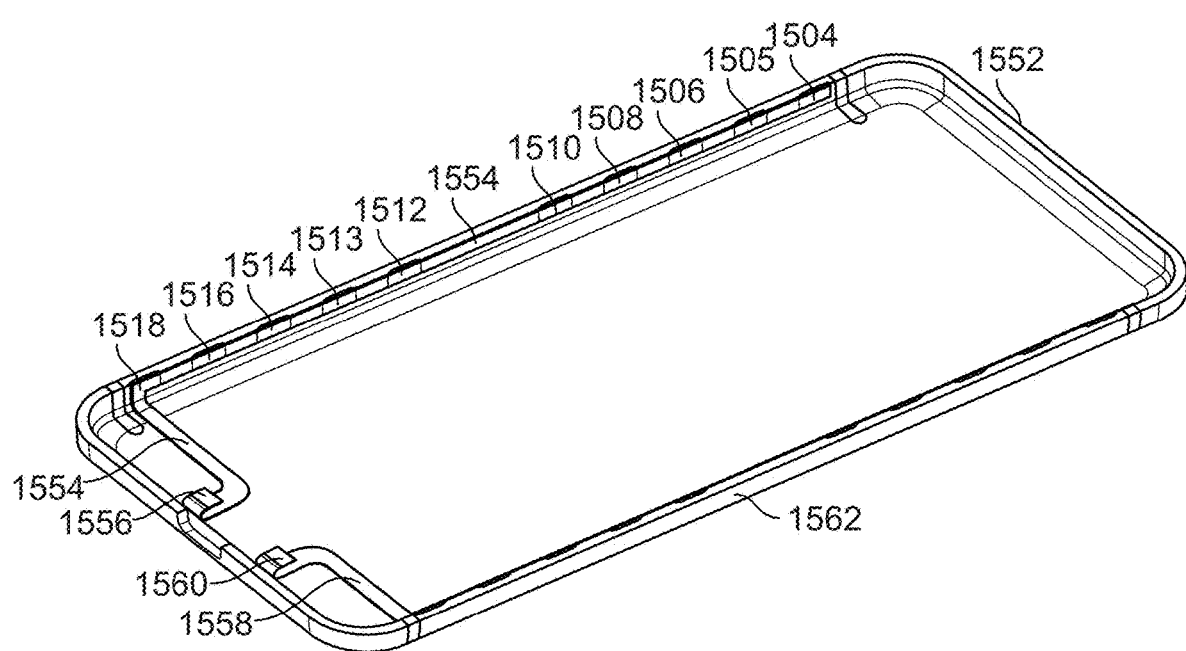
FIG. 15C is a diagram illustrating an embodiment of a device housing with touch input enabled sides.

FIG. 15C is a diagram illustrating an embodiment of a device housing with touch input enabled sides. Housing 1552 shows a unibody back and side housing of an electronic device. For example, housing 1552 may be utilized as a part of a housing for a smartphone device that houses electrical components and is covered with a display glass surface. Transmitters 1504, 1506, 1510, 1513, and 1516 and sensors 1505, 1508, 1512, 1514, and 1518 (also shown in FIG. 15B) have been mounted on an internal side/surface of a sidewall (e.g., sidewall internal surface/side facing inside the electronic device) of housing 1552. Housing 1552 may be made of metal (e.g., aluminum), plastics, ceramics, carbon fiber, or any other material of propagating medium 1502 of FIG. 15B. The transmitters and sensors are mounted on flex cable 1554. Flex cable 1554 includes patterned conductors that connect the transmitters and sensors/receivers to pins on connector 1556. In some embodiments, connector 1556 connects to a circuit board (not shown) that includes a touch detector (e.g., touch detector 1520) that provides/receives signals to/from the transmitters/receivers. The transmitters and sensors/receivers of flex cable 1554 are utilized to detect touch input on an external side surface of housing 1552 over the region directly above and between the transmitters and sensors/receivers of flex cable 1554 (e.g., to detect location and force along a one-dimensional axis identifying lengthwise locations on the external side surface). This allows the side surface of housing 1552 to be touch sensitive to user inputs. Although housing 1552 does not show any physical buttons in the touch input surface, in various other embodiments, one or more physical buttons may exist. For example, touch input detection may be provided on a surface of a physical button (e.g., transmitter/sensor mounted behind/around a physical button) to allow a user to provide a touch indication over a surface of a physical button without physically actuating the physical button (e.g., detect swipe gesture over physical button).

Much like flex cable 1554, flex cable 1558 connects transmitters and sensors mounted on a second internal surface/side of a second sidewall (e.g., sidewall internal surface/side facing inside cavity of the electronic device) to connector 1560 (e.g., connects to the circuit board that includes touch detector 1520 of FIG. 15B). The transmitters and sensors/receivers of flex cable 1558 are utilized to detect touch input on external side surface 1562 of housing 1552 over the region directly above and between the transmitters and sensors/receivers of flex cable 1558. This allows sidewall surface 1562 to be touch sensitive to user inputs. In various embodiments, other transmitters and sensors/receivers may be mounted on other internal walls and surfaces of housing 1552 to allow touch inputs on other external surfaces of housing 1552.

Figure 15D:
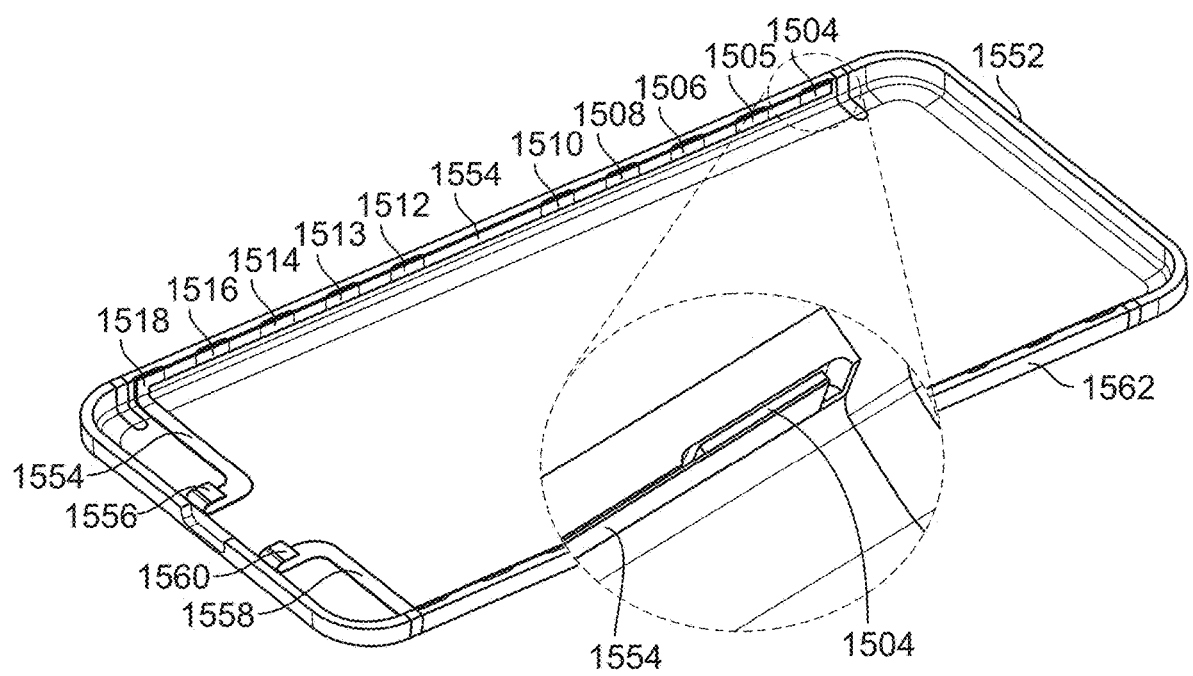
FIG. 15D shows a magnified view of the cavity/pocket.
Figure 15E:
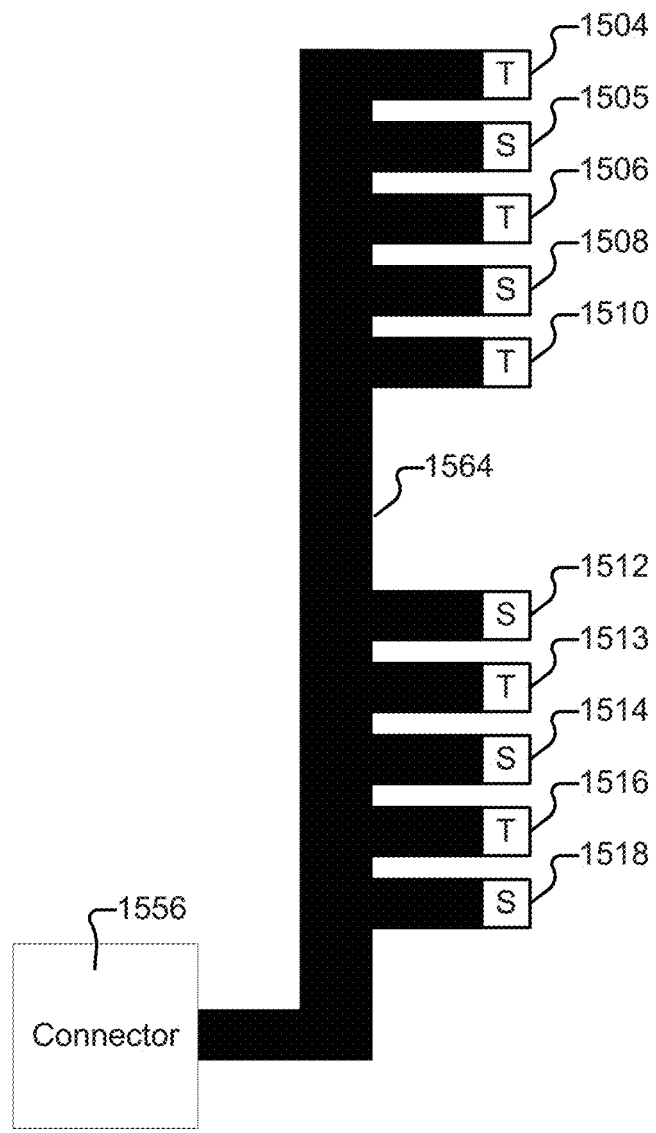
FIG. 15E shows transmitters and receivers mounted on fingers of a flex cable.

Although the shown transmitters and sensors/receivers have been directly mounted on flex cable 1554 in a straight line along a strip/bar of flex cable 1554, the sensors/receivers and transmitters may be mounted on a flex cable in various other embodiments. For example, FIG. 15E shows transmitters and receivers mounted on fingers of flex cable 1564. This may allow flexibility in routing the flex cable around other internal components of a device. For example, the fingers allow the flex cable to be routed around openings and components to accommodate a switch, button, SIM/memory card tray, etc.

When manufacturing the configuration shown in FIG. 15C, it may be inefficient to individually attach each individual transmitter/sensor onto a flex cable. In some embodiments, transmitters and sensors are positioned/placed on a stiffener bar (e.g., mounting template bar) that assists in the positioning and alignment of the transmitters and sensors and all of the transmitters and sensors on the stiffener bar are attached to a flex cable together at the same time using the stiffener bar. Once transmitters/sensors are attached to the flex cable, each of the transmitters/sensors on the flex cable are attached to the propagating medium/housing via an adhesive (e.g., epoxy). The transmitters and sensors shown in the example of FIG. 15C have been placed inside cavities/pockets etched on the internal side/surface of sidewall of housing 1552. FIG. 15D shows a magnified view of the cavity/pocket (e.g., 0.3 millimeter in depth). By placing each transmitter/sensor in the cavity, valuable internal space inside the housing is maintained and the flex cable assembly with the transmitters and receivers is able to be mounted flush to the sidewall.

Figure 15F:
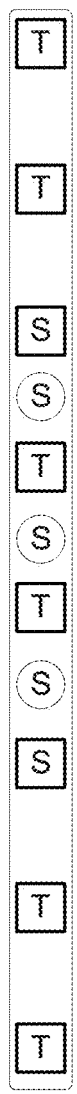
FIGS. 15F-15H show different embodiments of transmitter and sensor component arrangements utilized to detect a touch input along a linear area.
Figure 15G:
Figure 15H:

FIGS. 15F-15H show different embodiments of transmitter and sensor component arrangements utilized to detect a touch input along a linear area (e.g., transmitters and sensors mounted inside of a device on an internal surface of sidewall to detect touch input on an external surface of the sidewall). For example, FIGS. 15F-15H show alternative arrangements of at least a portion of the transmitters and sensors shown in FIGS. 15B and 15E. In various embodiments, at least a portion of the transmitter and sensor components shown in FIGS. 15F-15H are connected to touch detector 1520 shown in FIG. 15B. For example, rather than using the arrangement of transmitters and sensors shown in FIG. 15B, the arrangement shown in FIG. 15F, 15G, or 15H is utilized. Example components of touch detector 1520 are components included in touch detector 802 of FIG. 8. Connections between transmitter and sensor components in FIGS. 15F-15H and touch detector 1520 have not been shown in FIGS. 15F-15H. Other components (e.g., application system 1522) connected to touch detector 1520 also have not been shown in FIGS. 15F-15H. Components are not drawn to scale. A piezoelectric transmitter is shown as a box labeled with a "T." A piezoelectric sensor is shown as a box labeled with an "S." A piezoresistive sensor is shown as a circle labeled with an "S." In some embodiments, the shown piezoelectric transmitters and sensors are coupled to an inside surface border of a glass cover of a touchscreen display. In some embodiments, the shown piezoresistive sensors are coupled behind a display panel (e.g., behind LED/OLED panel). The number of transmitters and sensors shown in FIGS. 15F-15H are merely an example and any number of any type of transmitters and sensors may exist in various embodiments.

In some embodiments, a device includes one or more piezoelectric transmitters and one or more piezoelectric receivers/sensors to detect a touch input location (e.g., coupled to glass of touch screen, coupled to side of metal housing of a device to detect touch input location on device side, etc.) as well as an array of piezoresistive sensors to detect touch input force/pressure (e.g., array of piezoresistive sensors coupled behind LED/OLED display panel to detect magnitude of deformation of the panel due to touch input, or one or more piezoresistive sensors coupled to inside of a device housing to detect grip force, etc.). Transmitter and sensor arrangement 1582 shown in FIG. 15F includes piezoelectric transmitters/sensors around a border area of a propagating/touch input medium and an array of piezoresistive sensors.

In some embodiments, given the increased piezoresistive sensor sensitivity using the improvements described herein, one or more piezoresistive sensors are utilized to receive/detect propagated ultrasonic touch input medium signals for touch input location detection. The same piezoresistive sensors may also be used to detect physical disturbance magnitude as well. For example, an output signal from the piezoresistive sensor is first analyzed and correlated with its input supply voltage signal to detect the physical disturbance magnitude (e.g., using the process of FIG. 6) and then when the propagated ultrasonic signal is detected after propagation through the touch input medium, the output signal (e.g., delayed signal) from the piezoresistive sensor is analyzed and correlated with an expected baseline propagated signal to detect a propagation delay caused by the touch input in determining the associated touch input location (e.g., using the process of FIG. 10 and/or FIG. 16). Thus the same output signal from a piezoresistive sensor can be used to both detect touch force and touch location (e.g., by the same signal processing component: touch detector 1520). Example sensor configurations for devices including piezoelectric transmitters and piezoresistive sensors without piezoelectric sensors are shown in arrangement 1584 of FIG. 15G.

In some embodiments, piezoresistive sensors are utilized to detect a touch input location without a use of piezoelectric transmitters. For example, given an array of piezoresistive sensors, a location of a touch input is triangulated based on the detected physical disturbance magnitudes and the relative locations of the sensors that detected the various magnitudes (e.g., using a matched filter). Example sensor configurations for devices including piezoresistive sensors without piezoelectric transmitters are shown in arrangement 1586 of FIG. 15H.

In some embodiments, data from piezoelectric transmitters/sensors and data from piezoresistive sensors are used to complement and augment each other. A touch input location information detected using piezoelectric transmitters/sensors may be used to cross qualify physical disturbance magnitude information from piezoresistive sensors. For example, when it is detected (using piezoresistive sensor data) that touch input is being provided with low force, pressure, strain, etc. (e.g., user is wearing a glove that absorbs force), a piezoelectric transmitter gain and/or sensor sensitivity is increased to enable better touch input location detection. In another example, if a sufficient physical disturbance magnitude is detected but a touch input location is not detected (or touch input location is detected in a specific signature pattern), then it may be concluded that the detected input is a result of device bending (e.g., in a pocket) rather than as a result of an intended user interaction.

Figure 16:
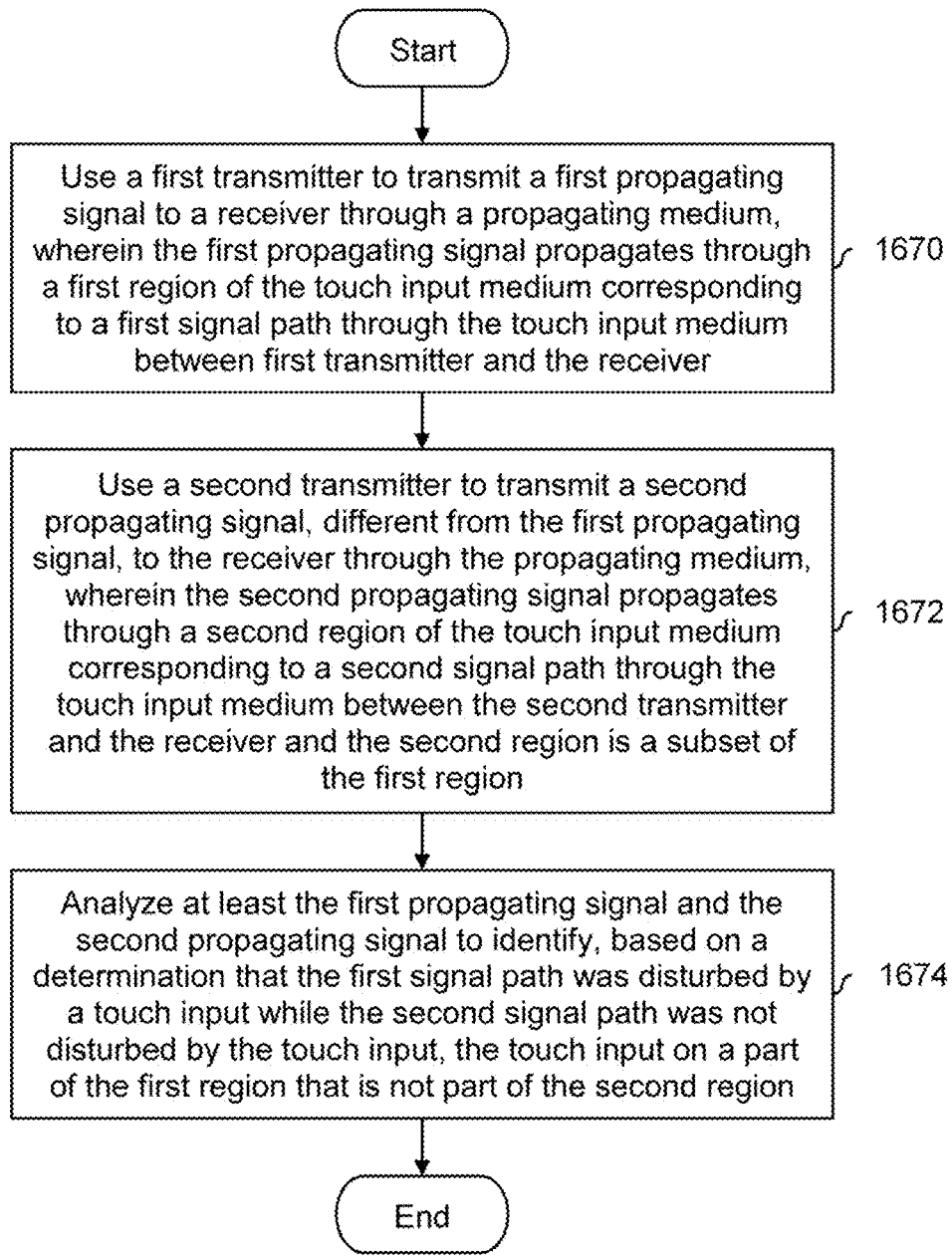
FIG. 16 is a flowchart illustrating an embodiment of a process to detect a touch input.

FIG. 16 is a flowchart illustrating an embodiment of a process to detect a touch input. The process of FIG. 16 may be performed by touch detector 1520 connected to an arrangement of transmitters and sensors shown in FIGS. 15B-15H. In one example of a system which performs the process of FIG. 16, the first transmitter, the second transmitter, and the receiver are embedded in the side of a phone. A touch and/or force sensor (e.g., implemented on some type of processor, such as an application-specific integrated circuit (ASIC), a field-programmable gate array (FPGA), or a general purpose processor) in the phone inputs a received signal which is output by the receiver and includes propagating signals from the transmitters. The touch and/or force sensor analyzes the received signal to identify touches and/or estimate a force value for any identified touches.

At 1670, a first transmitter is used to transmit a first propagating signal to a receiver through a propagating medium, wherein the first propagating signal propagates through a first region of the touch input medium corresponding to a first signal path through the touch input medium between the first transmitter and the receiver. As will be described in more detail below, in some embodiments, transmitters and receivers exchange acoustic or ultrasonic signals. In some embodiments, the propagating medium is substantially linear or one-dimensional, and the transmitters and receivers are arranged in a line within the 1D propagating medium (e.g., along the side of a phone).

At 1672, a second transmitter is used to transmit a second propagating signal, different from the first propagating signal, to the receiver through the propagating medium, wherein the second propagating signal propagates through a second region of the touch input medium corresponding to a second signal path through the touch input medium between the second transmitter and the receiver and the second region is a subset of the first region. For example, the second transmitter may sit between the first transmitter and the receiver in a line, such that the second region (e.g., through which the second propagating signal propagates) is a subset of the first region (e.g., through which the first propagating signal propagates).

At 1674, at least the first propagating signal and the second propagating signal are analyzed to identify, based on a determination that the first signal path was disturbed by a touch input while the second signal path was not disturbed by the touch input, the touch input on a part of the first region that is not part of the second region. As will be described in more detail below, if the first signal passes through the touch input while the second signal does not (e.g., where the touch or lack thereof is indicated by the amplitude of the signals), that is indicative of a touch in the part of the first region which is not part of the second region.

It is noted that the process of FIG. 16 not only identifies when a touch has occurred, but the location of that touch is also determined or otherwise identified. For example, since the positions of the various transmitters and receivers are known, the presence of a touch between two adjacent transmitters and/or receivers corresponds to knowing the position of that touch (e.g., where that touch occurs on the side of a smartphone or tablet). In some embodiments, the process of FIG. 16 identifies multiple touch inputs which occur simultaneously on the interactive surface (e.g., so that the locations of multiple touches is/are identified). This is desirable because applications which require multiple, simultaneous touch inputs can be supported.

In some embodiments, a force value is determined for each detected or identified touch. For example, if a sensor identifies two touches, the sensor may also estimate a force value for each identified touch (e.g., where the two force values are permitted to be different values).

The following figure shows an example of two transmitters and a receiver which are embedded in the side of a phone and which exchange the signals described and/or used above.

FIG. 17 is a diagram illustrating an embodiment of a receiver and two associated transmitters in the side of a phone. In this example, the exemplary phone (1702) has multiple interactive surfaces, including the front surface (1704) and the side surface (1706). For example, having the side of the phone be interactive or touch-sensitive may permit the user to use the side of the phone as a scroll bar or for volume control. Although not shown here, in some embodiments, the other side surface (e.g., opposite to surface 1706) is also an interactive surface.

In this example, the transmitters and receivers are configured to exchange an acoustic or ultrasonic signal. Such signals may be desirable because they work well in a variety of propagating mediums, including ones that have not worked well with previous touch and/or force sensing techniques. For example, the sides of some phones are made of metal, which does not work well with existing touch and/or force sensors which rely upon capacitors (e.g., because of the stiffness of the metal and/or the conductive properties of the metal). In contrast, acoustic or ultrasonic signals can propagate through metal relatively easily. In some embodiments, piezoelectric transducers are used for the transmitters and/or receivers. In some embodiments, piezoresistive transducers are used for the transmitters and/or receivers.

Diagram 1700 shows the system when the side of the phone is not being touched. The side of the phone (1706) includes from left to right: a first transmitter (1708), a second transmitter (1710), and a receiver (1712). (To preserve the readability of this diagram, other transmitters and receivers are not shown but naturally additional transmitters and/or receivers may be included.) In diagram 1700, the transmitted signals propagate through different paths along the side of the phone. The first signal (1714a) travels through a first region (e.g., shown as dotted region 1718) between the first transmitter and the receiver. The second signal (1716a) travels through a second region (e.g., shown as shaded region 1720). Region 1718 and region 1720 show some examples of a first region and a second region which are referred to in the process of FIG. 16.

Diagram 1750 shows the phone when a single touch (1752) is applied to the side of the phone. For readability, the first region (shown in diagram 1700 as dotted region 1718) and the second region (shown in diagram 1700 as shaded region 1720) are not shown in diagram 1750. In this example, the touch is located between the first transmitter (1708) and the second transmitter (1710). This is an example of the touch scenario referred to at step 1674 in FIG. 16.

Touch 1752 causes the first signal (1714b) to be absorbed to some degree. In this example, the absorption is observable in the amplitude of the signal where the amplitude of a signal where there is no touch is greater than if the signal passed through the touch. In one example of how step 1674 in FIG. 16 is performed, a touch input (e.g., corresponding to touch 1752) is identified between the first transmitter (1708) and the second transmitter (1710) if the amplitude of signal 1714b decreases compared to some (e.g., first) reference amplitude, but the amplitude of signal 1716b remains the same compared to some (e.g., second) reference. To summarize:

TABLE 1

Amplitude change(s) when going from the untouched state shown in diagram 1700 to the touched state shown in diagram 1750 in FIG. 17.

| First Signal from $T_1$ | Second Signal from $T_2$ | Conclusion |
| --- | --- | --- |
| Amplitude decreases compared to a previous/reference amplitude | Amplitude is the same compared to a previous/reference amplitude | A touch input between $T_1$ and second transmitter is present |

In some embodiments, the term amplitude refers to the absolute value of a peak (e.g., a minimum or maximum) associated with a signal. In some embodiments, the absolute value of the peak is determined after some pre-processing (e.g., to remove less desirable contributions to the received signal).

In some cases, the system may go from the state shown in diagram 1750 to the state shown in diagram 1700. In one special case, this may occur if the phone is powered on and the system performs an initialization process with touch 1752 applied (e.g., as shown in diagram 1750) and then the user subsequently removes his/her finger from the interactive surface. Independent of whether that transition occurs during an initialization process:

TABLE 2

Amplitude change(s) when going from the touched state shown in diagram 1750 to the untouched state shown in diagram 1700 in FIG. 17.

| First Signal from $T_1$ | Second Signal from $T_2$ | Conclusion |
|---|---|---|
| Amplitude increases compared to a previous/reference amplitude | Amplitude is the same compared to a previous/reference amplitude | A touch input between $T_1$ and second transmitter is no longer there |

As the above shows, when a touch sensor detects that the amplitude of the first signal increases and the amplitude of the second signal remains the same (e.g., compared to some reference amplitude(s)), in some embodiments the touch sensor indicates that a touch (e.g., which was present or identified before) is no longer present between the first and second transmitter.

The above table demonstrates a benefit to the sensor embodiments described herein. Some existing touch sensors in phones have problems when the phone is powered on with a user touching an interactive surface. When this occurs and the initialization process of the touch sensor runs, the sensor is initialized with settings or information associated with the phone being touched. This is undesirable because with that initialization, the capacitive touch sensors cannot detect when the phone is no longer being touched and/or complex processes must be performed in order to correct this. In contrast, because there is an observable change in the amplitude of the signal when a touch leaves, it is easier for the sensors described herein to detect when an interactive surface goes from a touched state to an untouched state by looking at the amplitude of the signal(s) (e.g., even if the system initializes in a touched state).

In this example, each transmitter transmits its signal in a manner that is orthogonal to the other transmitters. For example, the first transmitter may use a first pseudo-random binary sequence (PRBS) to transmit its signal and the second transmitter may use a second, different PRBS which creates orthogonality between the transmitters and/or transmitted signals. Such orthogonality permits a processor or sensor coupled to the receiver to filter for or otherwise isolate a desired signal from a desired transmitter.

In some embodiments, the different transmitters use time-shifted versions of the same PRBS. For example, at the receiver, the received signal (e.g., which is a combination of the different transmitted signals from the various transmitters) is correlated against the transmitted signal. Generally speaking, the received signal is correlated against the transmitted one. The signal to transmit is selected for its good auto-correlation properties, that is, auto-correlation must be strong at offset 0 and very low everywhere else. After correlation, the resulting signal has multiple sharp peaks where each peak corresponds to a different transmitter (e.g., because the different starting points or phases of the time-shifted pseudo-random bit sequences result in different offsets or locations of the peaks). For example, in this scenario where there are two transmitters, one peak in the correlated signal corresponds to the signal from the first transmitter and a second peak (e.g., at a different offset or location compared to the first peak) corresponds to the signal from the second transmitter. In some embodiments, using time-shifted versions of the same PRBS is desirable because auto-correlation of a PRBS has a very strong peak at offset 0 and is relatively small everywhere else. The correlation of two different PRBS sequences is not so small. Time shifting the same PRBS for each transmitter provides the lowest correlation between transmitters (at least for a portion of the whole sequence).

In some embodiments, the transmitters use orthogonal codes to create orthogonality between the transmitted signals (e.g., in addition to or as an alternative to creating orthogonality using a PRBS). In various embodiments, any appropriate technique to create orthogonality may be used.

In at least some cases, the system may not be able to detect if two touches occur between the first transmitter (1708) and the second transmitter (1710). For this reason, in some embodiments, transmitters and receivers are spaced relatively close together, for example, less than the width of an expected touch. In one example, the transmitters and receivers are spaced ~10 mm apart. If the transmitters and receivers are spaced relatively close to each other, then the likelihood of multiple touches occurring between adjacent transmitters and/or receivers is reduced, and/or if multiple touches did occur so close together but were not identified it would be acceptable (e.g., from a user experience point of view).

One benefit to the shared sensor embodiments described herein (e.g., where a given receiver listens for or to multiple transmitters) is that the number of receivers is reduced. For example, in a non-shared receiver layout there is a 1:1 ratio of transmitters and receivers and more receivers would be required (e.g., compared to a shared receiver embodiment) in order to achieve the same density of transmitters and/or receivers. Having more receivers is undesirable because of the routing requirements associated with each receiver. Suppose (for simplicity) there is a single chip which performs touch and/or force sensing. The output from each of the receivers needs to be routed to the sensor chip. Therefore, more receivers require more routing which consumes more space (e.g., on some printed circuit board or within the phone itself in general) and/or costs more money. For this reason, a shared receiver configuration (one example of which is shown here) is attractive.

The following figures describe the above tables more formally in flowcharts.

Figure 18:
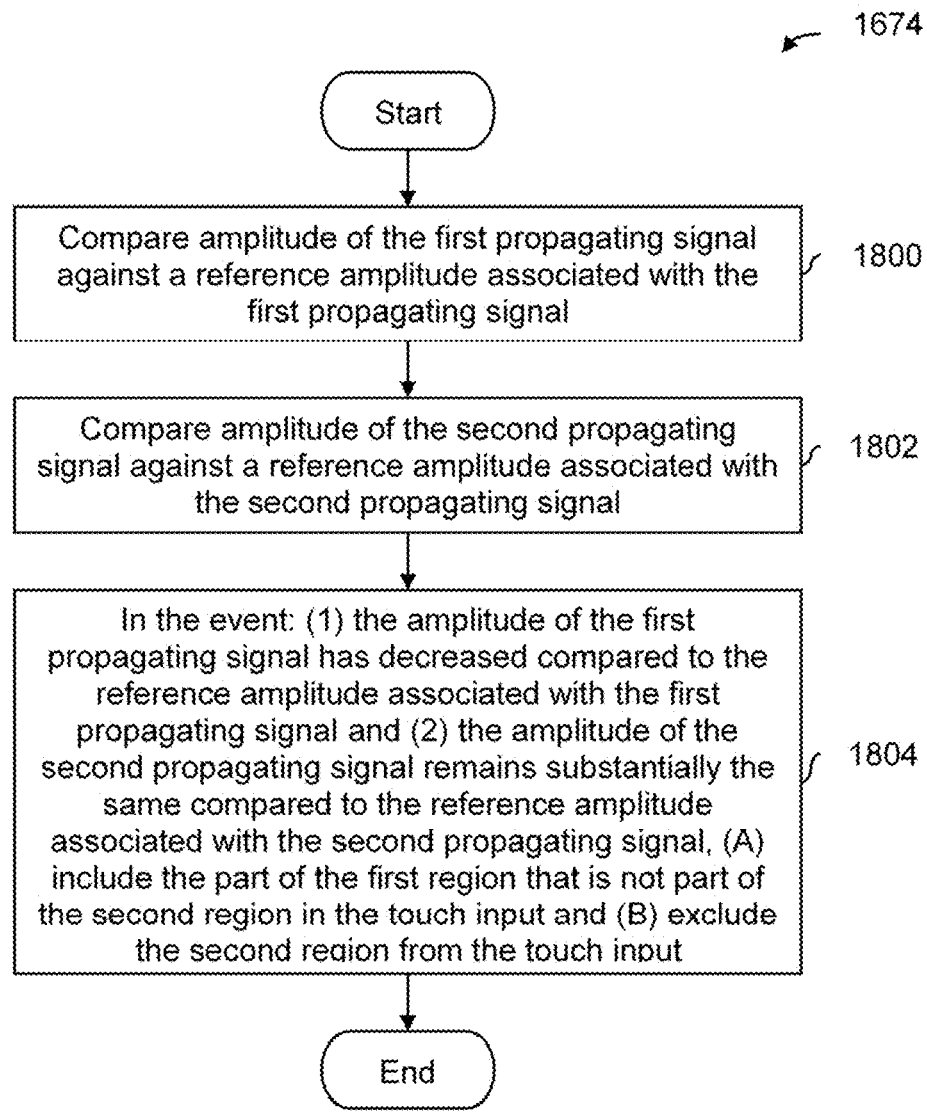
FIG. 18 is a flowchart illustrating an embodiment of a process to identify a touch input in a part of a first region that is not part of a second region using signal amplitudes.

FIG. 18 is a flowchart illustrating an embodiment of a process to identify a touch input in a part of a first region that is not part of a second region using signal amplitudes. FIG. 18 corresponds to Table 1 and a transition from diagram 1700 to diagram 1750 in FIG. 17. In some embodiments, the process is used at step 1674 in FIG. 16.

At 1800, the amplitude of the first propagating signal is compared against a reference amplitude associated with the first propagating signal. For example, in FIG. 17, the amplitude of signal 1714*a* (e.g., where there is no touch) is an example of a saved and/or reference amplitude of the first propagating signal and signal 1714*b* (e.g., where there is a touch) is an example of an (e.g., current) amplitude of the first propagating signal.

At 1802, the amplitude of the second propagating signal is compared against a reference amplitude associated with the second propagating signal. For example, in FIG. 17, the amplitude of signal 1716*a* is an example of a saved and/or reference amplitude of the second propagating signal and signal 1716*b* is an example of an (e.g., current) amplitude of the second propagating signal.

It is noted that the first signal and the second signal use different references at step 1800 and step 1802. In some embodiments, this is desirable because it permits different signal paths or parts of the side of a phone (as an example) to have different reference amplitudes. For example, the receivers may be implemented using piezo transducers which are very sensitive to temperature. If there is some localized "hot spot" along the side of the phone, then it would be desirable to have one reference amplitude for signals which pass through the hot spot and a different reference amplitude for signals which do not pass through the hot spot. In other words, using different reference amplitudes may permit the sensor to more accurately detect a touch and/or more accurately estimate a force value. In some embodiments, for each transmitter-receiver pair there is stored a reference signal (e.g., from which the reference amplitude is obtained) or just the reference amplitude itself (e.g., if no other information from the reference signal is desired).

At 1804, in the event: (1) the amplitude of the first propagating signal has decreased compared to the reference amplitude associated with the first propagating signal and (2) the amplitude of the second propagating signal remains substantially the same compared to the reference amplitude associated with the second propagating signal, (A) the part of the first region that is not part of the second region is included in the touch input and (B) the second region is excluded from the touch input. For example, in FIG. 17, touch 1752 causes the amplitude of the first signal (1714*a*/1714*b*) to decrease whereas the amplitude of the second signal (1716*a*/1716*b*) does not change. A touch is therefore identified in that part of the first region which is not part of the second region (e.g., between the first transmitter (1708) and second transmitter (1710)), but the identified touch does not include the second region (e.g., between the second transmitter (1710) and the receiver (1712)).

Figure 19:
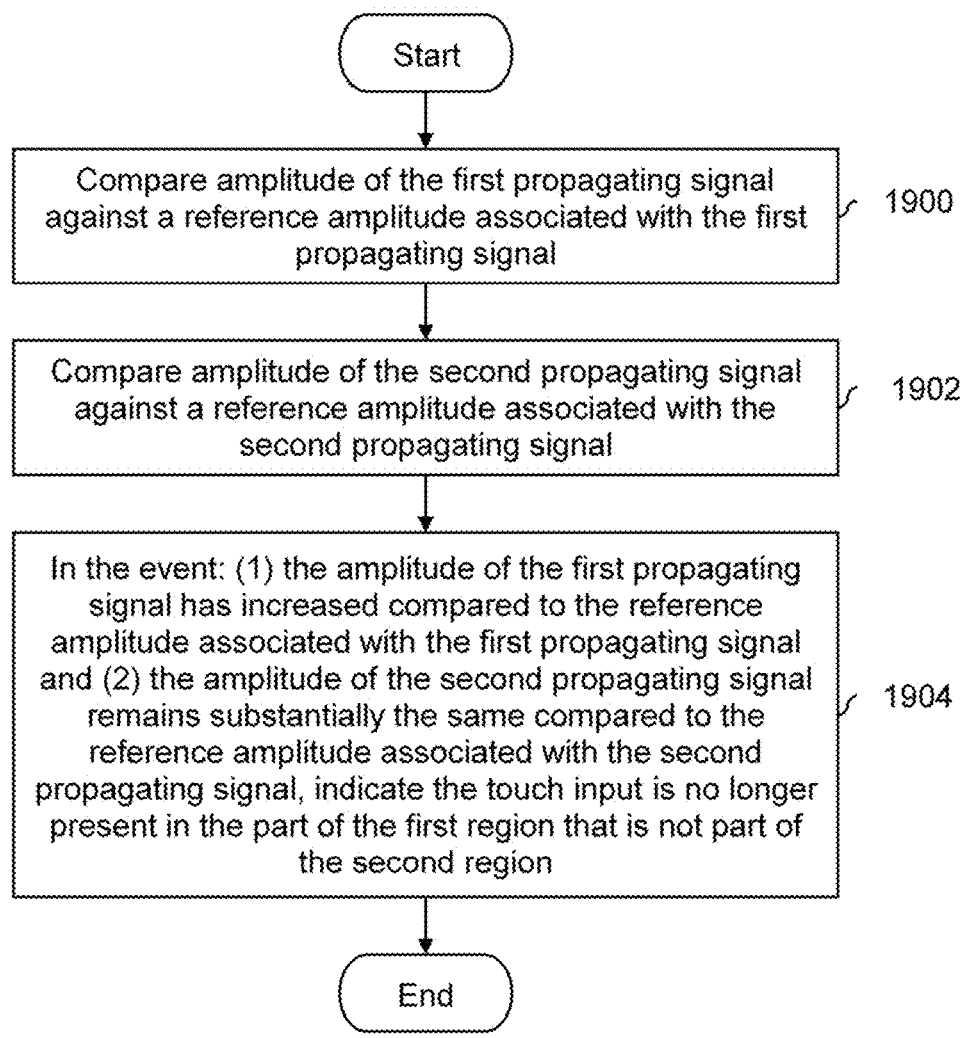
FIG. 19 is a flowchart illustrating an embodiment of a process to identify when a touch input leaves a part of a first region that is not part of a second region using signal amplitudes.

FIG. 19 is a flowchart illustrating an embodiment of a process to identify when a touch input leaves a part of a first region that is not part of a second region using signal amplitudes. FIG. 19 corresponds to Table 2 and a transition from diagram 1750 to diagram 1700 in FIG. 17. In some embodiments, the process of FIG. 19 is performed in combination with FIG. 16 and/or FIG. 18 (e.g., the process of FIG. 16 and/or FIG. 18 detects when there is a touch and the process of FIG. 19 detects when that touch goes away).

At 1900, the amplitude of the first propagating signal is compared against a reference amplitude associated with the first propagating signal. At 1902, the amplitude of the second propagating signal is compared against a reference amplitude associated with the second propagating signal.

For example, in FIG. 17, diagram 1700 shows an exemplary previous state of the system and diagram 1750 shows an exemplary current state of the system. The amplitudes associated with the signals in diagram 1700 are therefore examples of previous and/or reference amplitudes and the amplitudes associated with the signals in diagram 1750 are examples of (e.g., current) amplitudes.

At 1904, in the event: (1) the amplitude of the first propagating signal has increased compared to the reference amplitude associated with the first propagating signal and (2) the amplitude of the second propagating signal remains substantially the same compared to the reference amplitude associated with the second propagating signal, it is indicated the touch input is no longer present in the part of the first region that is not part of the second region. As described above, if the amplitude of the first signal goes up and the amplitude of the second signal remains the same, this is indicative of a touch leaving that part of the first region which does not include the second region (e.g., between the first transmitter (1708) and the second transmitter (1710) in FIG. 17).

The following figure describes using time-shifted versions of the same PRBS more formally in a flowchart.

Figure 20:
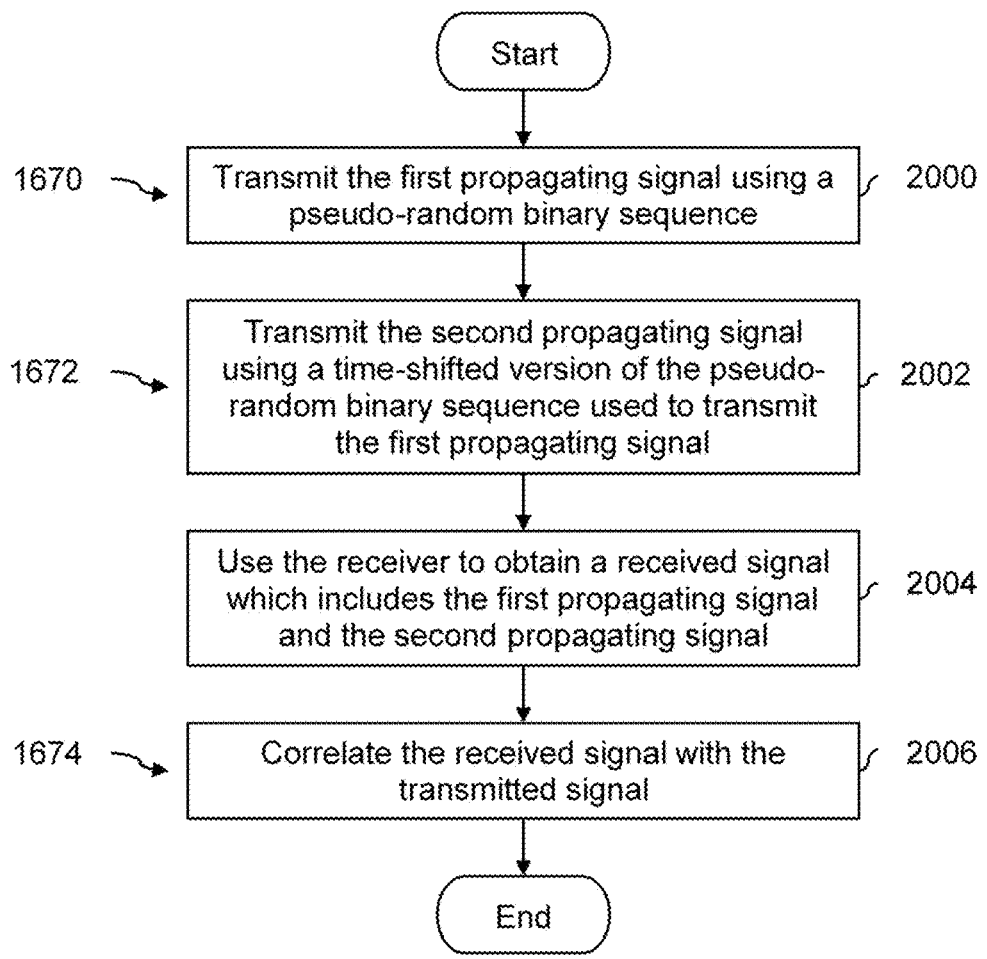
FIG. 20 is a flowchart illustrating an embodiment of a process to use time-shifted versions of the same PRBS when transmitting.

FIG. 20 is a flowchart illustrating an embodiment of a process to use time-shifted versions of the same PRBS when transmitting. At 2000, the first propagating signal is transmitted using a pseudo-random binary sequence. In some embodiments, step 1670 in FIG. 16 includes step 2000.

At 2002, the second propagating signal is transmitted using a time-shifted version of the pseudo-random binary sequence used to transmit the first propagating signal. In some embodiments, step 1672 in FIG. 16 includes step 2002.

At 2004, the receiver is used to obtain a received signal which includes the first propagating signal and the second propagating signal.

At 2006, the received signal is correlated with the transmitted signal. As described above, the time-shifting causes the first propagating signal and second propagating signal to be separated out in the output of the correlator (e.g., one peak in the correlation signal corresponds to the first propagating signal and another peak in the correlation signal corresponds to the second propagating signal). In some embodiments, step 1674 in FIG. 16 includes step 2006. In some embodiments, correlation is performed before the (e.g., current or new) amplitude of the signal is compared to some reference amplitude.

The following figure shows a more detailed example of how touch detection and force estimation are performed on the side of a phone with more signals contributing to processing.

Figure 21:
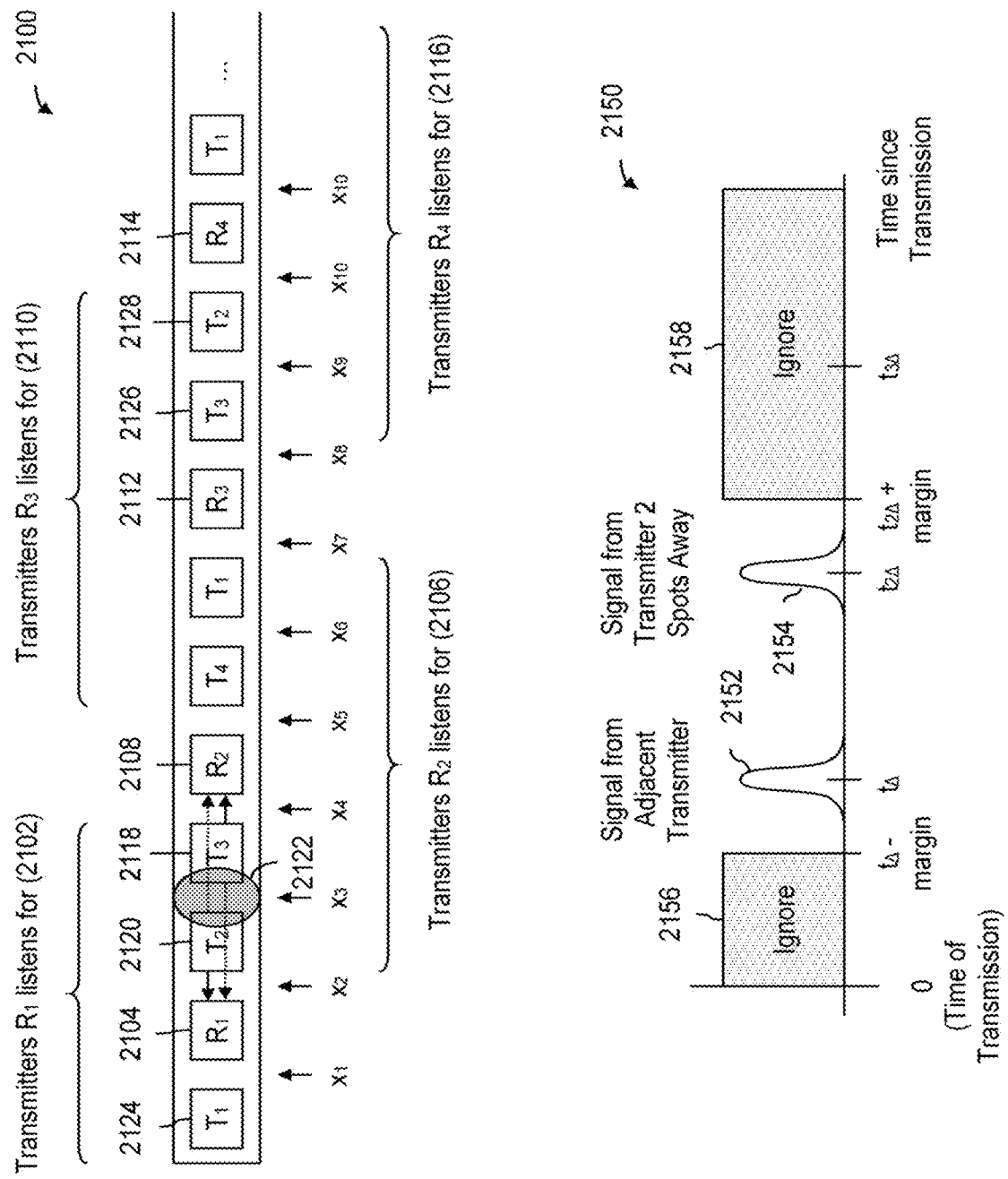
FIG. 21 is a diagram illustrating an embodiment of a side of a phone with multiple transmitters and multiple receivers.

FIG. 21 is a diagram illustrating an embodiment of a side of a phone with multiple transmitters and multiple receivers. Diagram 2100 shows the exemplary transmitters and receivers laid out along the side of a phone. In this example, each receiver is associated with and listens to some number of transmitters. Group 2102 shows the transmitters that the first receiver (2104) listens for, group 2106 shows the transmitters that the second receiver (2108) listens for, group 2110 shows the transmitters that the third receiver (2112) listens for, and group 2116 shows the transmitters that the fourth receiver (2114) listens for.

In this example, transmitters with the same index use the same time-shifted PRBS to transmit their signal. That is, all first transmitters use a PRBS with a first time shift, all second transmitters the same PRBS but with a second time shift, and so on. To ensure that only the appropriate signals from the appropriate transmitters are analyzed downstream, in some embodiments, filtering (e.g., based on propagation time) is performed so that signals from more distant transmitters (e.g., which are not part of a receiver's group) are ignored.

Diagram 2150 shows an example of the filtering performed. For clarity and ease of explanation, suppose that all of the transmitters transmit at time 0. The propagation medium and its properties are known ahead of time (e.g., it is known that the side of a phone will be made of metal) and so the propagation time of a signal from a given transmitter to a given receiver is known. As used herein, $t_A$ is the propagation time of a signal from a transmitter to an adjacent receiver (e.g., from $T_3$ (2118) to second receiver (2108)). Similarly, $t_{2A}$ is the propagation time of a signal from a transmitter to a receiver which is two places or spots away (e.g., from second transmitter (2120) to second receiver (2108)).

Again for clarity and ease of explanation, the transmission signals (2152 and 2154) in this example are represented as relatively short pulses; note that they occur or otherwise arrive at time $t_A$ and $t_{2A}$. Given the propagation times described above, the transmission (2152) from an adjacent transmitter (e.g., from $T_3$ (2118)) to second receiver (2108)) arrives at the receiver at time $t_A$. The transmission (2154) from a transmitter two spots away arrives at the receiver at time $t_{2A}$ (e.g., from second transmitter (2120) to second receiver (2108)).

As shown in diagram 2150, filtering (2156) is performed from time 0 to time ($t_A$−margin). Filtering (2158) is also performed from time ($t_{2A}$+margin) onwards. This causes any signal received before ($t_A$−margin) or after ($t_{2A}$+margin) to be ignored. As a result, only signals which are receive between $t_A$ (minus some margin) and $t_{2A}$ (plus some margin) are further analyzed and/or processed by downstream processing.

This filtering helps to prevent a transmission from a distant transmitter (e.g., which is not part of a receiver's group) from being analyzed. For example, this filtering may prevent third receiver (2112) from passing along (e.g., to a downstream process) the transmitted signal of second transmitter (2120), which is not in that receiver's group. It may also prevent a receiver from passing on (e.g., to a downstream process) a reflected signal which is reflected off the edge of the propagation medium. Generally speaking, filtering helps to prevent the introduction of noise which improves the quality of the sensing and/or simplifies the signal processing.

The following figure describes the filtering shown here more formally in a flowchart.

Figure 22:
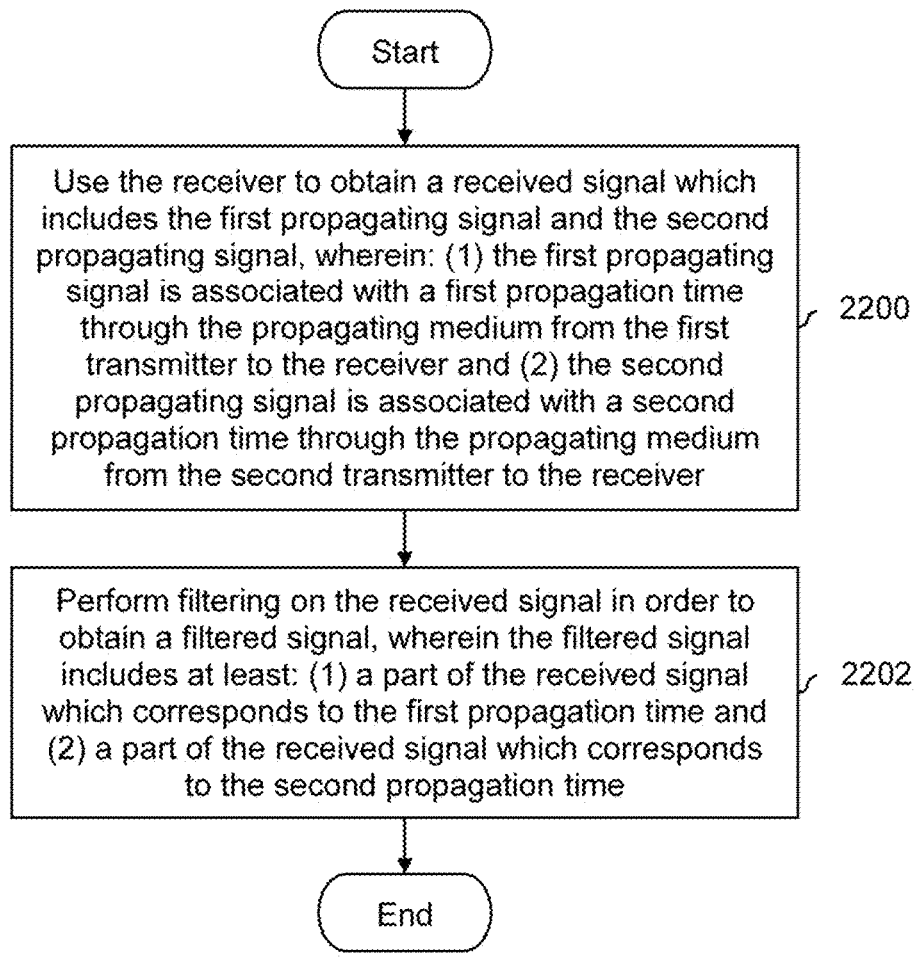
FIG. 22 is a flowchart illustrating an embodiment of a process to filter a received signal.

FIG. 22 is a flowchart illustrating an embodiment of a process to filter a received signal. In some embodiments, the process of FIG. 22 is performed in combination with the process of FIG. 16. For example, filtering may be performed first before the process of FIG. 16 and the filtered signal is subsequently analyzed (e.g., at step 1674 in FIG. 16).

At 2200, the receiver is used to obtain a received signal which includes the first propagating signal and the second propagating signal, wherein: (1) the first propagating signal is associated with a first propagation time through the propagating medium from the first transmitter to the receiver and (2) the second propagating signal is associated with a second propagation time through the propagating medium from the second transmitter to the receiver. For example, in FIG. 21, receiver 2108 receives a signal from the second transmitter (2120) which takes $t_{2A}$ units of time to propagate through the side of the phone and receives a signal from the third transmitter (2118) which takes $t_A$ units of time to propagate through the side of the phone. Note that the received signal (e.g., before filtering) includes reflections from the end of the propagation medium and/or transmissions from transmitters which are not part of that receiver's group.

At 2202, filtering is performed on the received signal in order to obtain a filtered signal, wherein the filtered signal includes at least: (1) a part of the received signal which corresponds to the first propagation time and (2) a part of the received signal which corresponds to the second propagation time. See, for example, FIG. 21 where parts of the received signal before ($t_A$−margin) and after ($t_{2A}$+margin) are filtered out but the desired transmission signals 2152 and 2154 are still included after filtering. Any appropriate type of filter may be used.

It is noted that the order of transmitter and receiver indices does not follow the same pattern throughout the sample shown. For example, on the left hand side, the order is $T_2$ (2120), $T_3$ (2118) whereas in the middle it's $T_3$ (2126) and then $T_2$ (2128). This is intentional so that (as an example) $R_3$ (2112) hears from both a $T_2$ on its left (2120) and a $T_2$ on its right (2128). To separate them in the correlated signal, the $T_2$ on the left is placed as far as possible from $R_3$. The same logic applies to $R_2$ (2108) and the $T_2$ on its left (2120) and the $T_2$ on its right (2128).

Returning to FIG. 21, the following describes an example in which a touch is detected and a force value is determined by determining a value or metric for each gap between adjacent transmitters and/or receivers. In this example, touch 2122 is detected and a force value is determined for touch 2122.

In diagram 2100, $x_1$ corresponds to the gap between the first transmitter (2124) and the first receiver (2104), $x_2$ corresponds to the gap between the first receiver (2104) and the second transmitter (2120), and so on. In this example, the value calculated for gap $x_1$ is:

$$x_1 = T_i R_1$$

where (generally speaking) $T_i R_j$ is a metric or value associated with a degree of change (if any) of an (e.g., current or new) amplitude compared to some reference amplitude. More specifically:

$$T_i R_j = 10 \log_{10} \frac{|\text{Amplitude}_{new}|}{|\text{Amplitude}_{reference}|}.$$

In some embodiments, each transmitter-receiver pair has its own amplitude reference value. For example, as described above, there may be some localized hot spot which causes the transmitters and/or receivers in one part of the transmission medium to behave differently than in another part of the transmission medium and this difference should be taken into account when calculating the amplitude metrics.

The following figure shows an example of how the values which are input into the $T_i R_j$ calculation shown above may be obtained.

Figure 23:
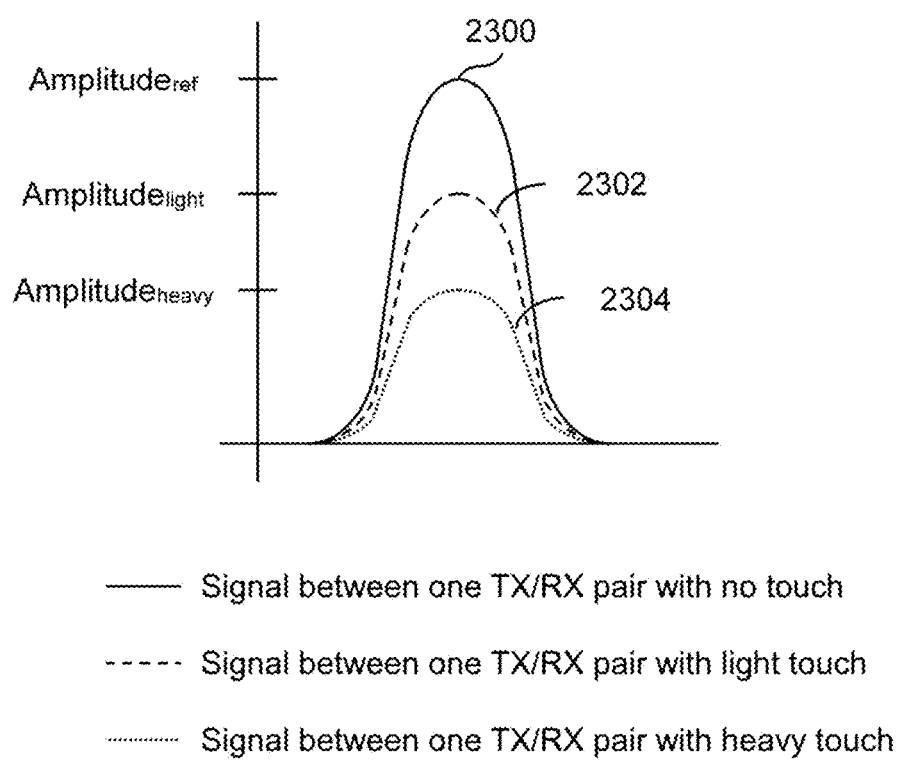
FIG. 23 is a diagram illustrating an embodiment of a signal after passing through different types of touches, if any.

FIG. 23 is a diagram illustrating an embodiment of a signal after passing through different types of touches, if any. In some embodiments, the signals shown are envelopes, where some underlying signal oscillates at a frequency much faster than the frequency with which the envelopes change (e.g., the peaks of the underlying signal define the envelope). In some embodiments, the signals shown are after correlation.

In the example shown, signal 2300 is an example of a signal where there is no touch and therefore the signal is not absorbed by the touch. Signal 2302, with a lower amplitude than signal 2300, corresponds to a signal where there is a light touch which absorbs the signal. Signal 2304, with a lower amplitude than signal 2302, corresponds to a signal where there is a heavier touch. That is, more force is applied with signal 2304 than with signal 2302.

As shown here, as more force is applied, the (peak) amplitude of a signal which passes through that touch decreases correspondingly. In the $T_i R_j$ equation above, the amplitude$_{reference}$ input is obtained from the peak (e.g., global maximum or global minimum) value of a reference and/or untouched signal, such as signal 2300. For simplicity, the signals shown here are in the positive domain, but a (e.g., global) minima which is in the negative domain would be used after taking the absolute value.

The amplitude$_{new}$ input to the T$_i$R$_j$ equation above is obtained similarly. For example, if signal 2302 were being processed, the value amplitude$_{light}$ would be used and if signal 2304 were being processed, the value amplitude$_{heavy}$ would be used. As described above, if the peak of the signal is negative, then taking the absolute value would make it positive.

Returning to FIG. 5, equations for some other gaps are:

$$x_2 = \frac{1}{2}(T_2R_1 + (T_3R_1 - (T_2R_2 - T_3R_2))) = \frac{1}{2}(T_2R_1 + T_3R_1 - T_2R_2 + T_3R_2)$$

$$x_3 = \frac{1}{2}((T_2R_2 - T_3R_2) + (T_3R_1 - T_2R_1))$$

$$x_4 =$$

$$\frac{1}{2}(T_3R_2 + (T_2R_2 - (T_3R_1 - T_2R_1))) = \frac{1}{2}(T_3R_2 + T_2R_2 - T_3R_1 + T_2R_1)$$

$$\vdots$$

where T$_i$R$_j$ is calculated as described above. These values (i.e., $x_1$, $x_2$, $x_3$, etc.) are sometimes referred to herein as amplitude metrics.

It is noted that the above equations are one example of a way to solve the problem of converting measurements {T$_i$R$_j$} to segment values {$x_k$}. In some embodiments, some other equations are used. For example, different weights can provide other unbiased solutions, perhaps with different statistical variances. For example:

$$x_2 = \tfrac{3}{4}T_2R_1 + \tfrac{1}{4}T_3R_1 - \tfrac{1}{4}T_2R_2 + \tfrac{1}{4}T_3R_2.$$

It may be useful to discuss the $x_3$ equation in more detail in order to obtain insight into how the $x_2$ and $x_4$ equations are obtained. The two signals which pass through the $x_3$ gap are the T$_2$R$_2$ signal and the T$_3$R$_1$ signal. Therefore, it makes sense to use those signals in calculating a metric or value for $x_3$. However, both of those signals are two-gap signals but only the $x_3$ gap is of interest. Therefore, some part of those signals should be discounted or otherwise removed. For the T$_2$R$_2$ signal, this can be done by subtracting out T$_3$R$_2$, since that signal is a one-gap signal and exactly matches the part of the T$_2$R$_2$ signal which is trying to be removed or discounted. This produces the (T$_2$R$_2$-T$_3$R$_2$) part of the $x_3$ equation above. Similarly, the T$_2$R$_1$ signal exactly matches the part of the T$_3$R$_1$ signal which is trying to be removed or discounted, and T$_2$R$_1$ can be subtracted from T$_3$R$_1$. This produces the (T$_3$R$_1$-T$_2$R$_1$) part of the $x_3$ equation above.

The $x_3$ equation above also has a scaling factor of ½. This is to normalize $x_3$ to match the $x_1$ which only has a contribution from a single transmitter receiver pair. To put it another way, without the scaling factor, the $x_1$ and $x_3$ calculations would have different dynamic ranges. Conceptually, two one-gap signals are being added together in the $x_3$ equation, where (T$_2$R$_2$-T$_3$R$_2$) comprises one of the one-gap signals and (T$_3$R$_1$-T$_2$R$_1$) comprises the other one-gap signal. In contrast, the x1 equation only has a contribution from one one-gap signal.

This logic may be used to construct the $x_2$ and $x_4$ equations above. For the $x_2$ gap, the two signals which pass through that gap are the T$_2$R$_1$ signal and the T$_3$R$_1$. The former signal is a one-gap signal and therefore may be used as-is. However, the T$_3$R$_1$ signal is a two-gap signal and part of it must be subtracted out. The T$_2$R$_2$ signal is close, but it is not perfect because it is itself a two-gap signal. However, if the T$_3$R$_2$ signal is subtracted from T$_2$R$_2$, then that difference (i.e., T$_2$R$_2$-T$_3$R$_2$) may be subtracted from T$_3$R$_1$. This produces the T$_3$R$_1$-(T$_2$R$_2$-T$_3$R$_2$) part of the $x_2$ equation. For the reasons described above, the $x_2$ equation includes a ½ scaling factor. The $x_4$ equation can be constructed in a similar manner.

With an amplitude metric calculated for each gap as described above (e.g., $x_1$, $x_2$, $x_3$, etc.), a discrete signal is constructed which is used to both identify touches and output a force value for each identified touch. The following figure illustrates an example of such a signal.

Figure 24:
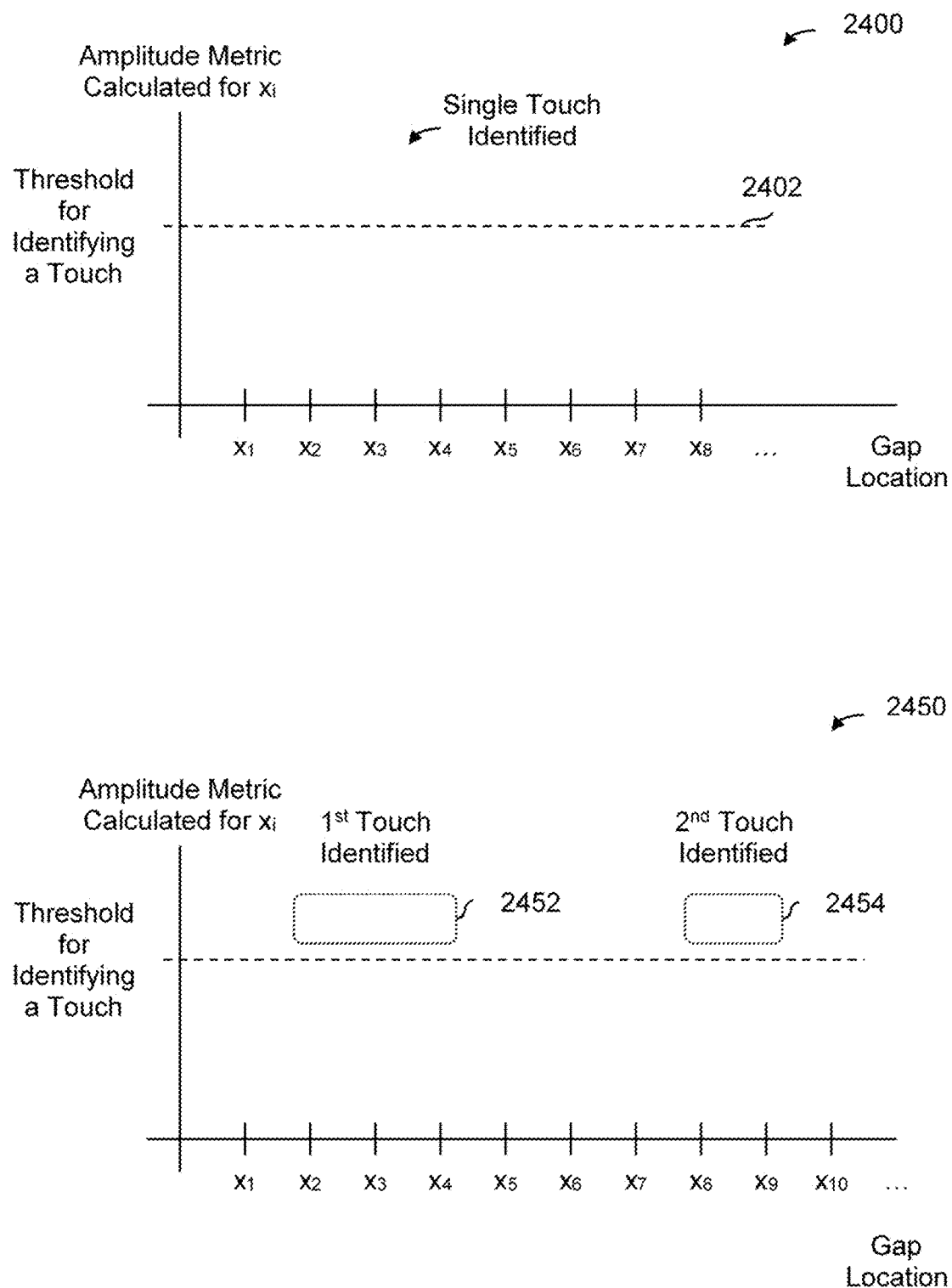
FIG. 24 is a diagram illustrating two embodiments of a discrete signal constructed using amplitude metrics.

FIG. 24 is a diagram illustrating two embodiments of a discrete signal constructed using amplitude metrics. In the example shown, diagram 2400 shows a discrete signal generated for the example of FIG. 21. The amplitude metric for each gap is plotted in this diagram, so that the x-axis corresponds to a particular gap location and the y-axis corresponds to the value or amplitude metric calculated for that particular gap, as described above.

A threshold (2402) is used to identify any touches. In this example, the only gap location which has an amplitude metric greater than threshold 2402 is the $x_3$ gap. As such, a single touch at the $x_3$ gap is identified. The force value which is output for this identified touch is the amplitude metric calculated for $x_3$. In some embodiments, if gaps are sufficiently small compared to the size of the touch objects (e.g., a finger), the location of the touch may be interpolated on a sub-gap scale by weighting the location of each gap by its amplitude metric.

Diagram 2450 shows another scenario where two touches are identified. As described above, the amplitude metrics for the gaps between transmitters and/or receivers are calculated and plotted. In this example, two touches are identified: a first touch (2452) at the $x_2$, $x_3$, and $x_4$ gaps and a second touch (2454) at the $x_8$ and $x_9$ gaps. In this example, the largest amplitude metric for each touch is output as the force value for that touch. This means outputting the value calculated for $x_3$ as the force value for the first touch and outputting the value for $x_9$ as the force value for the second touch. In some embodiments, the sum of the values above the threshold is output as the force of the touch.

The following figures describe these processes of generating amplitude metrics and comparing the amplitude metrics against a threshold more formally in flowcharts.

Figure 25:
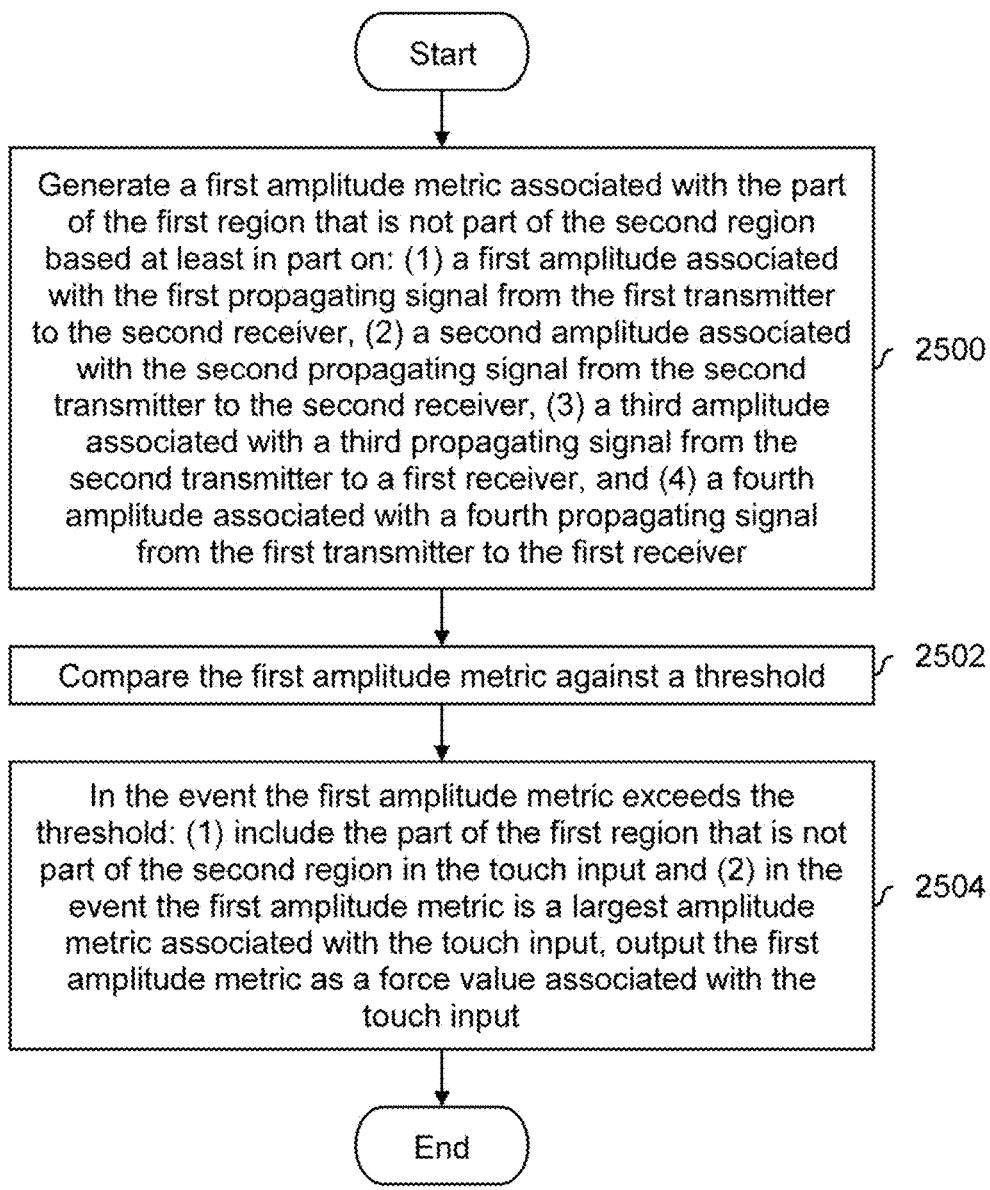
FIG. 25 is a flowchart illustrating an embodiment of a process to identify a touch input using a first amplitude metric associated with the part of the first region that is not part of the second region.

FIG. 25 is a flowchart illustrating an embodiment of a process to identify a touch input using a first amplitude metric associated with the part of the first region that is not part of the second region. In some embodiments, the process of FIG. 25 is used at step 1674 in FIG. 16. It is noted that the receiver referred to in FIG. 16 is referred to in this process as a second receiver.

At 2500, a first amplitude metric associated with the part of the first region that is not part of the second region is generated based at least in part on: (1) a first amplitude associated with the first propagating signal from the first transmitter to the second receiver, (2) a second amplitude associated with the second propagating signal from the second transmitter to the second receiver, (3) a third amplitude associated with a third propagating signal from the second transmitter to a first receiver, and (4) a fourth amplitude associated with a fourth propagating signal from the first transmitter to the first receiver. In one example of step 2500, $x_3 = \tfrac{1}{2}((T_2R_2-T_3R_2)+(T_3R_1-T_2R_1))$. It is noted that the indexes of the transmitters recited in this flowchart do not match the indexes of the transmitters in the $x_1$ equations above, nor the indexes of the transmitters in FIG. 21.

At 2502, the first amplitude metric is compared against a threshold. At 2504, in the event the first amplitude metric exceeds the threshold: (1) the part of the first region that is not part of the second region is included in the touch input and (2) in the event the first amplitude metric is a largest amplitude metric associated with the touch input, the first amplitude metric is output as a force value associated with the touch input. See, for example, diagram 2400 in FIG. 24. It is noted that an identified touch input may span or include more than one gap, and other gaps may be included in the identified touch input.

Figure 26:
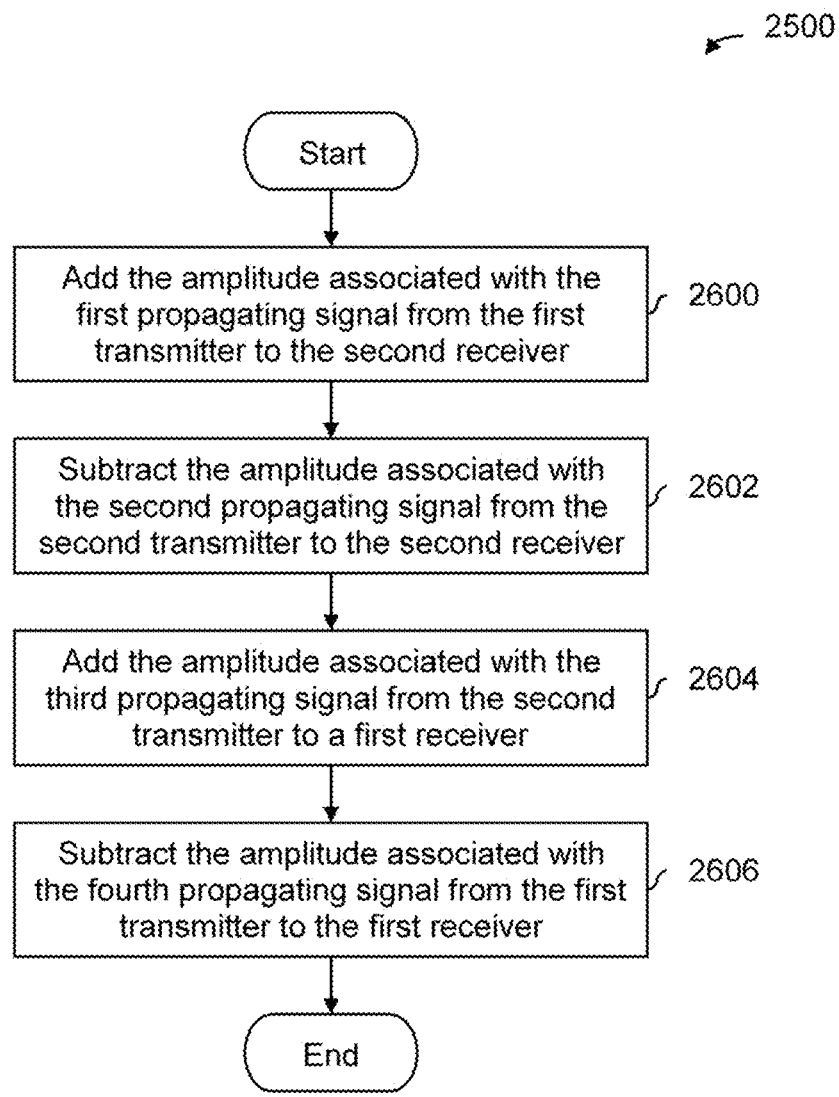
FIG. 26 is a flowchart illustrating an embodiment of a process to generate a first amplitude metric associated with a part of a first region that is not part of a second region.

FIG. 26 is a flowchart illustrating an embodiment of a process to generate a first amplitude metric associated with a part of a first region that is not part of a second region. In some embodiments, the process of FIG. 26 is used at step 2500 in FIG. 25.

At 2600, the amplitude associated with the first propagating signal from the first transmitter to the second receiver is added. See, for example, the first term from the $x_3$ equation above where $T_2R_2$ is added (the transmitter/receiver numbering in the $x_3$ equation does not necessarily match those recited by FIG. 26).

At 2602, the amplitude associated with the second propagating signal from the second transmitter to the second receiver is subtracted. See, for example, the second term from the $x_3$ equation above where $T_3R_2$ is subtracted (the transmitter/receiver numbering in the $x_3$ equation does not necessarily match those recited by FIG. 26).

At 2604, the amplitude associated with the third propagating signal from the second transmitter to a first receiver is added. See, for example, the third term from the $x_3$ equation above where $T_3R_1$ is added (the transmitter/receiver numbering in the $x_3$ equation does not necessarily match those recited by FIG. 26).

At 2606, the amplitude associated with the fourth propagating signal from the first transmitter to the first receiver is subtracted. See, for example, the fourth term from the $x_3$ equation above where $T_2R_1$ is subtracted (the transmitter/receiver numbering in the $x_3$ equation does not necessarily match those recited by FIG. 26).

In some embodiments, a scaling factor is applied to the inputs or terms added/subtracted above. In some other embodiments, the amplitude metric associated with a different gap location is adjusted (e.g., the amplitude metric associated with $x_1$ is multiplied by 2).

Figure 27:
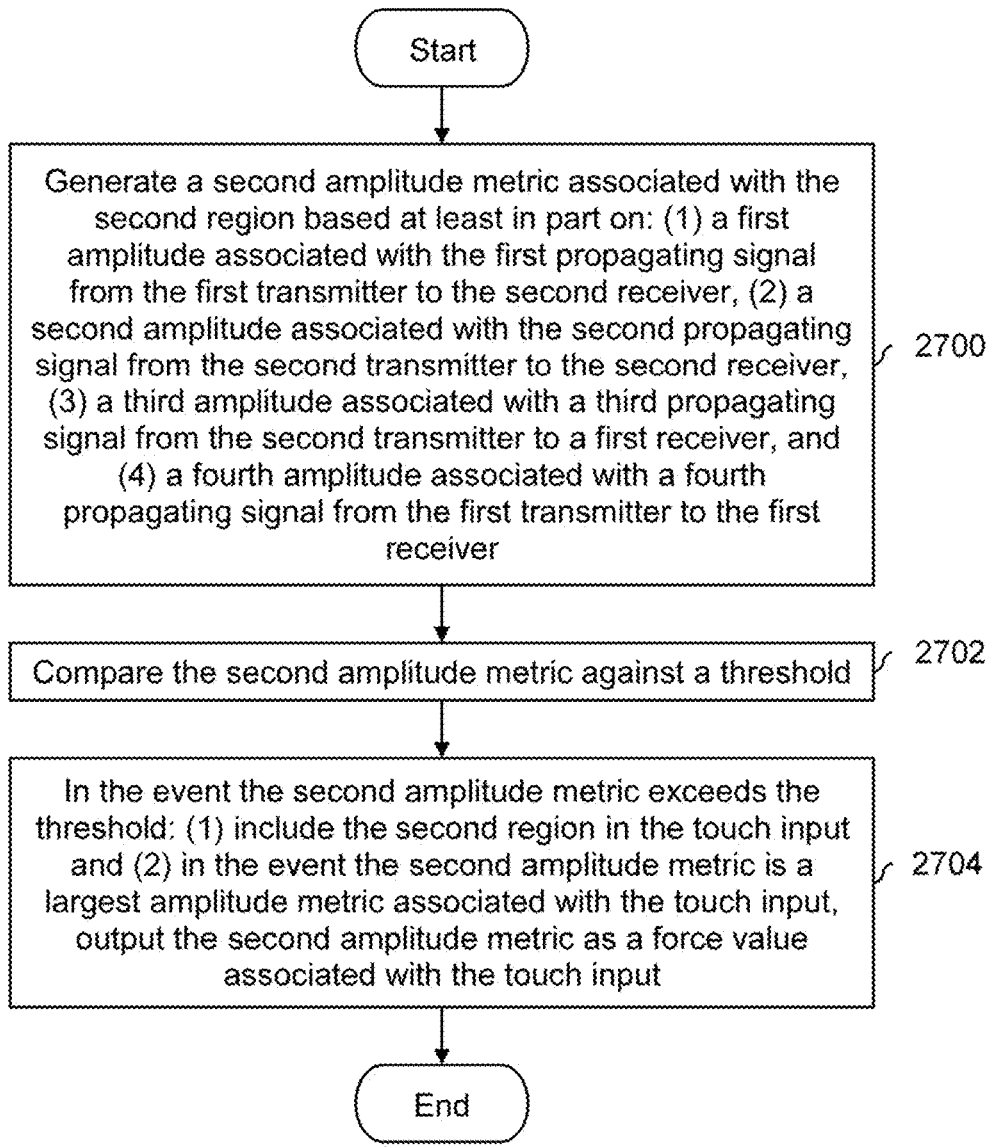
FIG. 27 is a flowchart illustrating an embodiment of a process to identify a touch input using a second amplitude metric associated with the second region.

FIG. 27 is a flowchart illustrating an embodiment of a process to identify a touch input using a second amplitude metric associated with the second region. In some embodiments, this process is performed in addition to the process of FIG. 16.

At 2700, a second amplitude metric associated with the second region is generated based at least in part on: (1) a first amplitude associated with the first propagating signal from the first transmitter to the second receiver, (2) a second amplitude associated with the second propagating signal from the second transmitter to the second receiver, (3) a third amplitude associated with a third propagating signal from the second transmitter to a first receiver, and (4) a fourth amplitude associated with a fourth propagating signal from the first transmitter to the first receiver. See, for example, the $x_4$ equation described above.

At 2702, the second amplitude metric is compared against a threshold. At 2704, in the event the second amplitude metric exceeds the threshold: (1) the second region is included in the touch input and (2) in the event the second amplitude metric is a largest amplitude metric associated with the touch input, the second amplitude metric is output as a force value associated with the touch input. See, for example, identified touch 2452 in FIG. 24. In that example, the amplitude metric calculated for $x_4$ is not the largest in identified touch 2452, so it would not be output as the force value for that identified touch.

Figure 28:
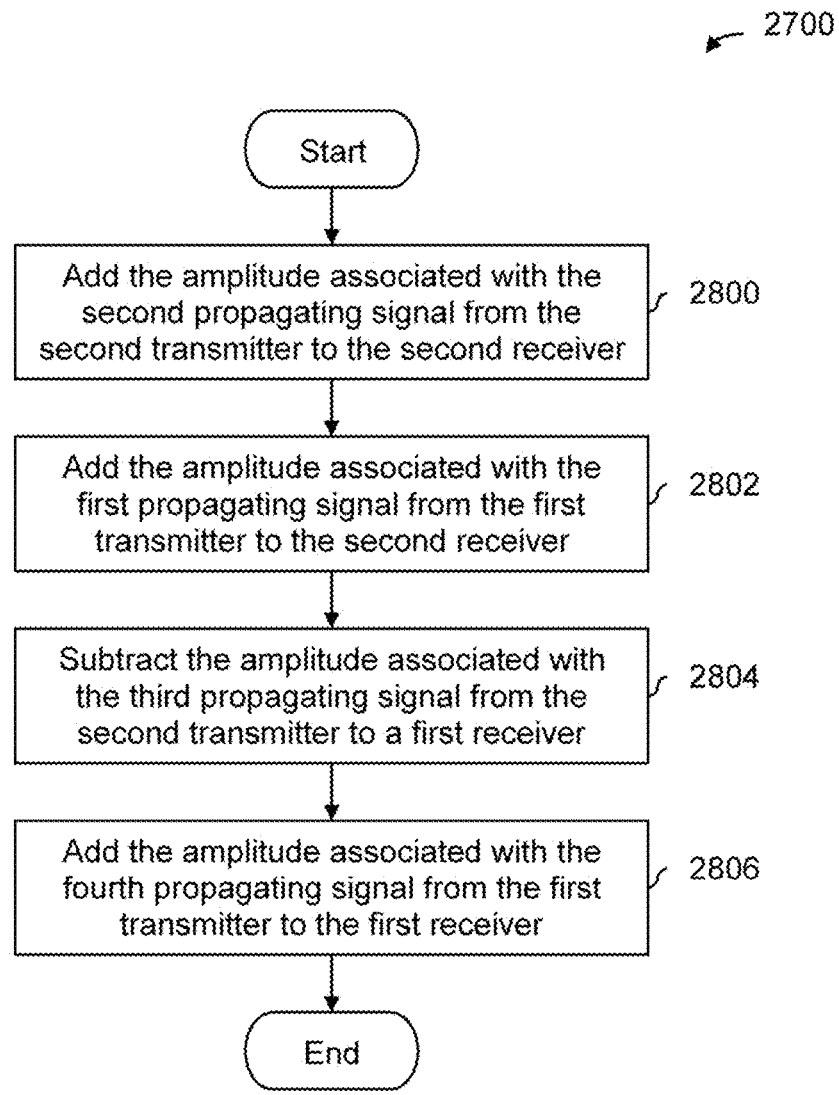
FIG. 28 is a flowchart illustrating an embodiment of a process to generate a second amplitude metric associated with a second region.

FIG. 28 is a flowchart illustrating an embodiment of a process to generate a second amplitude metric associated with a second region. In some embodiments, step 2700 in FIG. 27 includes the process of FIG. 28. As described above, a scaling factor may be applied to this amplitude metric or some other amplitude metric may be scaled (e.g., the amplitude metric for $x_1$).

At 2800, the amplitude associated with the second propagating signal from the second transmitter to the second receiver is added. See, for example, the first term in the $x_4$ equation above where $T_3R_2$ is added (the transmitter/receiver numbering in the $x_3$ equation do not necessarily match those recited by FIG. 28).

At 2802, the amplitude associated with the first propagating signal from the first transmitter to the second receiver is added. See, for example, the second term in the $x_4$ equation above where $T_2R_2$ is added (the transmitter/receiver numbering in the $x_3$ equation do not necessarily match those recited by FIG. 28).

At 2804, the amplitude associated with the third propagating signal from the second transmitter to a first receiver is subtracted. See, for example, the third term in the $x_4$ equation above where $T_3R_1$ is subtracted (the transmitter/receiver numbering in the $x_3$ equation do not necessarily match those recited by FIG. 28).

At 2806, the amplitude associated with the fourth propagating signal from the first transmitter to the first receiver is added. See, for example, the fourth term in the $x_4$ equation above where $T_2R_1$ is added (the transmitter/receiver numbering in the $x_3$ equation do not necessarily match those recited by FIG. 28).

Figure 29:
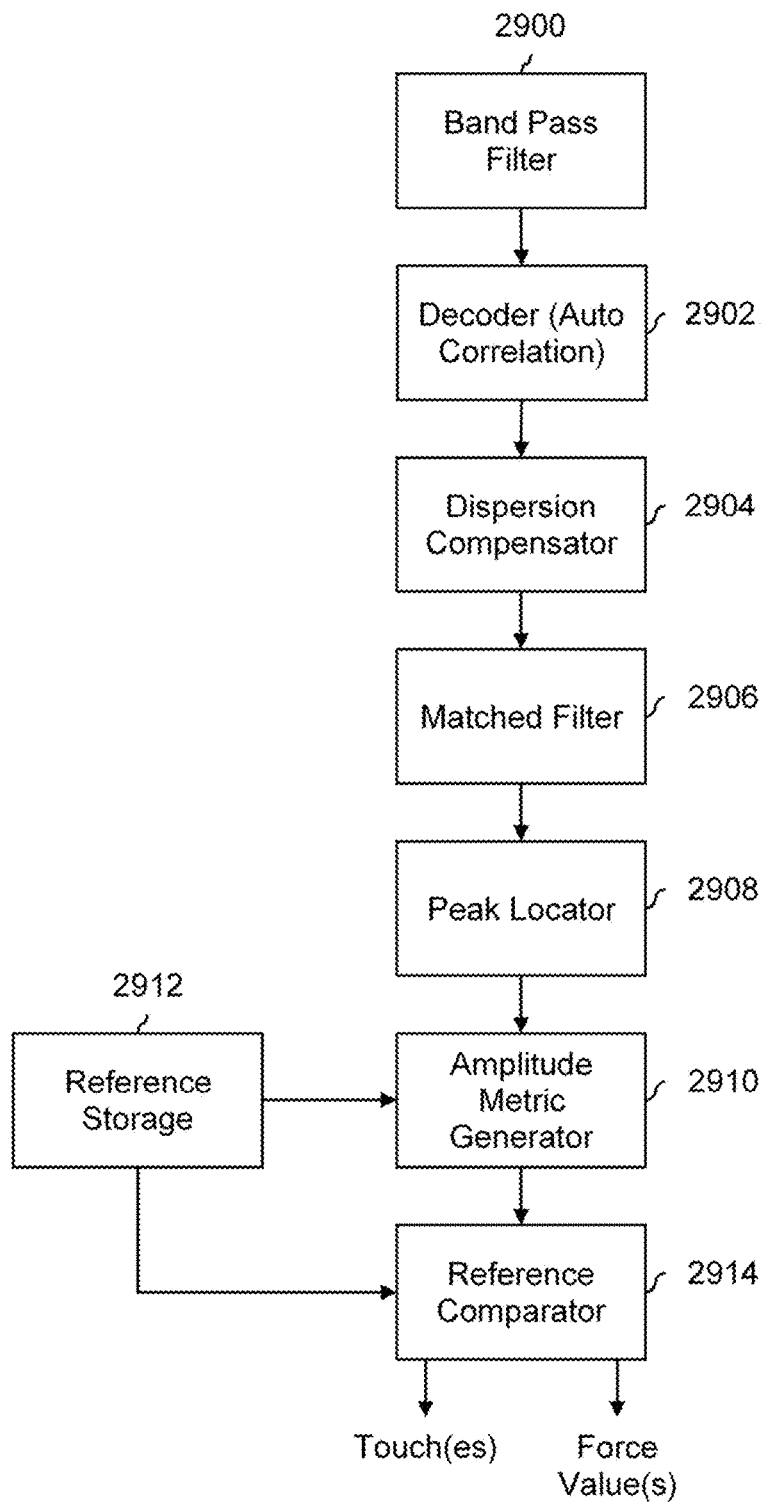
FIG. 29 is a block diagram illustrating an embodiment of a touch and force sensor.

FIG. 29 is a block diagram illustrating an embodiment of a touch and force sensor. For brevity and readability, some components, such as an analog-to-digital converter and transformers to change the signal from time-domain to frequency-domain (or vice versa), are not shown here. Among other things, these exemplary components show some of the pre-processing performed before the amplitude of a signal is used to detect a touch and/or estimate an amount of force. In some embodiments, the exemplary blocks shown are implemented on a touch and force sensor and/or on a processor (e.g., an FPGA, an ASIC, or a general purpose processor).

Band pass filter 2900 is used to filter out information outside of some band pass range. For example, the transmitter may transmit information in some pre-defined range of (e.g., carrier and/or code) frequencies. At the receiver, any signal outside of this range is filtered out in order to reduce the amount of noise or error.

Next, decoding (2902) is performed. As described above, time-shifted versions of the same PRBS are used by the different transmitter indexes (e.g., $T_1$, $T_2$, etc.) to create orthogonality between the different transmitters and/or transmitted signals. Decoding in this example includes performing a correction with the transmitted signal. In FIG. 21, if the signal received by the second receiver (2108) is decoded, performing a correlation will produce four distinct peaks: one corresponding to the second transmitter (2120), another corresponding to the third transmitter (2118), and so on.

With ultrasonic signals, different frequencies travel through the medium at different speeds. So, at the receiver, higher frequencies arrive before slower frequencies, which results in a "smeared" signal at the receiver. The dispersion compensator (2904) compensates for this so higher frequencies and lower frequencies which left the transmitter at the same time but arrived at different times are aligned again after compensation.

The peaks (e.g., after decoding and dispersion compensation) are expected to have a certain curved shape. Matched filter 2906 filters out parts of the peaks outside of this ideal curved shape, again to reduce noise or errors.

Peak locator 2908 finds the location of the peaks in the signal. For example, if there are four known peaks, then the locations or offsets of the peaks in the signals may be identified. The locations or offsets of the peaks are then passed to amplitude metric generator (2910), which takes the absolute value of the signal at those locations or offsets and then uses the absolute values to generate an amplitude metric for each gap (e.g., $x_1$, $x_2$, $x_3$, etc.) as described above. As described above, amplitude metric generator 2910 inputs the appropriate amplitude references from reference storage 2912 in order to generate the amplitude metrics. The amplitude references stored in reference storage 2912 may be updated as appropriate.

The amplitude metrics (e.g., $x_1$, $x_2$, $x_3$, etc.) are passed from amplitude metric generator 2910 to reference comparator 2914. Reference comparator compares the amplitude metrics against a threshold (see, e.g., FIG. 24) and identifies touches when/where the amplitude metric(s) exceed the threshold. The threshold used in the comparison is stored in reference storage 2912 and may be updated as appropriate. The identified touches and corresponding force values are output by reference comparator 2914.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a physical disturbance sensor that includes a plurality of piezoresistive elements configured in a resistive bridge configuration, wherein the piezoresistive elements are included in a same integrated circuit chip;
   a signal transmitter electrically connected to the physical disturbance sensor and configured to send an encoded signal to the piezoresistive elements of the resistive bridge configuration via one or more pins or pads of the integrated circuit chip; and
   a signal receiver electrically connected to the piezoresistive elements and configured to receive a signal from the physical disturbance sensor via one or more pins or pads of the integrated circuit chip, wherein
   the received signal from the physical disturbance sensor is correlated with the sent encoded signal in determining a measure of physical disturbance strain on the integrated circuit chip including the piezoresistive elements; wherein
   the same signal receiver is electrically connected via a same connection interface to a group of different resistive bridges, each resistive bridge of the group of different resistive bridges is connected to a different signal transmitter, and the signal receiver is configured to receive a combined signal that includes a plurality of differently encoded component signals each affected by a different corresponding one of the group of different resistive bridges.

2. The system of claim 1, wherein the encoded signal has a frequency above 50 kHz.

3. The system of claim 2, wherein the encoded signal has a frequency below 1 MHz.

4. The system of claim 1, wherein the encoded signal is generated by modulating a carrier signal using a digital signal.

5. The system of claim 1, wherein the encoded signal encodes a pseudorandom binary sequence.

6. The system of claim 1, wherein the same signal transmitter is electrically connected via a same connection interface to a different set of resistive bridges different from the group of different resistive bridges connected to the signal receiver.

7. The system of claim 6, wherein each resistive bridge of the set of resistive bridges connected to the same signal transmitter is connected to a different signal receiver.

8. The system of claim 1, wherein a second signal receiver is connected to a different set of resistive bridges and the signal transmitter is connected to only one resistive bridge in the different set of resistive bridges.

9. The system of claim 1, wherein the different signal transmitter of each of the plurality of sensors is configured to send a different encoded signal to its corresponding sensor of the plurality of sensors.

10. The system of claim 9, wherein the different encoded signals are associated with different signal phases but encode a same pseudorandom binary sequence.

11. A method for determining a measure of physical disturbance, comprising:
    sending an encoded signal to one or more pins or pads of an integrated circuit chip sensor including piezoresistive elements of a resistive bridge configuration;
    receiving via one or more pins or pads of the integrated circuit chip, a signal from the sensor; correlating the received signal with the sent encoded signal; and based at least in part on a result of the correlation,
    determining the measure of physical disturbance strain on the integrated circuit chip including the piezoresistive elements; wherein
    a same signal receiver is electrically connected via a same connection interface to a group of different resistive bridges, each resistive bridge of the group of different resistive bridges is connected to a different signal transmitter, and
    the signal receiver receives a combined signal that includes a plurality of differently encoded component signals each affected by a different corresponding one of the group of different resistive bridges.

12. The method of claim 11, wherein receiving the signal from the sensor includes filtering the signal.

13. The method of claim 12, wherein filtering the signal includes applying one or more of the following filters: a high pass filter, a low pass filter, or anti-alias filter.

14. The method of claim 11, wherein correlating the received signal with the sent encoded signal includes cross-correlating a version of the received signal with a version of the sent encoded signal.

15. The method of claim 11, wherein determining the measure of physical disturbance strain includes modifying the result of the correlation based on a calibration factor.

16. The method of claim 11, wherein determining the measure of physical disturbance strain includes determining a maximum amplitude value of the result of the correlation.

17. The method of claim 11, wherein the measure of physical disturbance strain includes a magnitude measure of one or more of the following: a strain, a force, a pressure, or a vibration.

18. The method of claim 11, wherein each of the plurality of differently encoded component signals is associated with a different pseudorandom binary sequence.

19. The method of claim 11, wherein the combined received signal is correlated with each of a plurality of different encoded signals corresponding to different ones of the plurality of different resistive bridges to determine a measure of physical disturbance strain detected by each of the plurality of different resistive bridges.

20. The method of claim 11, wherein the received signal from the sensor is utilized in detecting a location of a touch input in addition to being used to determine the measure of physical disturbance strain.

* * * * *

UNITED STATES PATENT AND TRADEMARK OFFICE
CERTIFICATE OF CORRECTION

PATENT NO. : 11,009,411 B2
APPLICATION NO. : 16/101241
DATED : May 18, 2021
INVENTOR(S) : Samuel W. Sheng et al.

It is certified that error appears in the above-identified patent and that said Letters Patent is hereby corrected as shown below:

On the Title Page

Item (73), assignee, city, insert --Cayman Islands--.

Signed and Sealed this
Twenty-first Day of December, 2021

Drew Hirshfeld
*Performing the Functions and Duties of the*
*Under Secretary of Commerce for Intellectual Property and*
*Director of the United States Patent and Trademark Office*